United States Patent
Lee

(10) Patent No.: US 9,147,471 B2
(45) Date of Patent: Sep. 29, 2015

(54) NONVOLATILE MEMORY DEVICE AND DRIVING METHOD THEREOF

(71) Applicant: Changhyun Lee, Suwon-si (KR)

(72) Inventor: Changhyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 285 days.

(21) Appl. No.: 13/654,973

(22) Filed: Oct. 18, 2012

(65) Prior Publication Data

US 2013/0114345 A1 May 9, 2013

(30) Foreign Application Priority Data

Nov. 8, 2011 (KR) .................. 10-2011-0115733

(51) Int. Cl.
*G11C 16/04* (2006.01)
*G11C 16/10* (2006.01)
*G11C 16/34* (2006.01)

(52) U.S. Cl.
CPC ............ *G11C 16/0483* (2013.01); *G11C 16/10* (2013.01); *G11C 16/3459* (2013.01)

(58) Field of Classification Search
USPC .............. 365/185.17, 185.02, 185.11, 185.24
See application file for complete search history.

(56) References Cited

U.S. PATENT DOCUMENTS

| | | | |
|---|---|---|---|
| 6,370,062 B2 | 4/2002 | Choi | |
| 6,487,117 B1 | 11/2002 | Choi et al. | |
| 7,092,308 B2 | 8/2006 | Choi et al. | |
| 7,509,588 B2 | 3/2009 | Van Os et al. | |
| 7,564,118 B2 | 7/2009 | Pogge et al. | |
| 7,791,947 B2 | 9/2010 | VanBuskirk et al. | |
| 8,053,812 B2 | 11/2011 | Shappir | |
| 8,084,805 B2 | 12/2011 | Shim et al. | |
| 8,730,738 B2 * | 5/2014 | Oh et al. .................. | 365/185.22 |
| 2005/0152202 A1 | 7/2005 | Choi et al. | |
| 2007/0157089 A1 | 7/2007 | Van Os et al. | |
| 2008/0230891 A1 | 9/2008 | Pogge et al. | |
| 2009/0027967 A1 | 1/2009 | Lee | |
| 2009/0180330 A1 | 7/2009 | VanBuskirk et al. | |
| 2009/0310415 A1 | 12/2009 | Jin et al. | |
| 2010/0002516 A1 * | 1/2010 | Sim et al. .................. | 365/185.17 |
| 2010/0010040 A1 | 1/2010 | Jones et al. | |
| 2010/0062715 A1 | 3/2010 | Kim et al. | |
| 2010/0072559 A1 | 3/2010 | Lee et al. | |
| 2010/0078701 A1 | 4/2010 | Shim et al. | |
| 2010/0082890 A1 | 4/2010 | Heo et al. | |
| 2010/0117141 A1 | 5/2010 | Shin et al. | |
| 2010/0128531 A1 | 5/2010 | Lee et al. | |
| 2010/0140685 A1 | 6/2010 | Kang et al. | |
| 2010/0213527 A1 | 8/2010 | Shim et al. | |

(Continued)

FOREIGN PATENT DOCUMENTS

| | | |
|---|---|---|
| JP | 2005310303 A | 11/2005 |
| JP | 2009272490 A | 11/2009 |

(Continued)

*Primary Examiner* — Vu Le
(74) *Attorney, Agent, or Firm* — Harness, Dickey & Pierce, P.L.C.

(57) ABSTRACT

According to example embodiments, a nonvolatile memory device includes a plurality of strings having a plurality of serially-connected selection transistors and a plurality of memory cells connected in series to one end of the serially-connected selection transistors. A control logic is configured to perform a program operation for setting a threshold voltage of at least one of the serially-connected selection transistors.

14 Claims, 41 Drawing Sheets

(56) References Cited

U.S. PATENT DOCUMENTS

| | | |
|---|---|---|
| 2010/0224929 A1 | 9/2010 | Jeong et al. |
| 2010/0306583 A1 | 12/2010 | Kim et al. |
| 2010/0309237 A1 | 12/2010 | Roh |
| 2010/0315325 A1 | 12/2010 | Hwang |
| 2010/0315875 A1 | 12/2010 | Kim et al. |
| 2010/0322000 A1 | 12/2010 | Shim et al. |
| 2011/0013458 A1 | 1/2011 | Seol |
| 2011/0018036 A1 | 1/2011 | Hwang et al. |
| 2012/0182805 A1* | 7/2012 | Liu .................. 365/185.17 |
| 2012/0230103 A1* | 9/2012 | Choe et al. ............. 365/185.2 |
| 2012/0281475 A1* | 11/2012 | Oh et al. .................. 365/185.17 |
| 2013/0161727 A1* | 6/2013 | Kim et al. ..................... 257/324 |
| 2014/0092685 A1* | 4/2014 | Yoon et al. ............... 365/185.17 |

FOREIGN PATENT DOCUMENTS

| | | |
|---|---|---|
| JP | 2010135348 A | 6/2010 |
| KR | 100316706 B1 | 12/2001 |
| KR | 100331563 B1 | 4/2002 |
| KR | 100599889 B1 | 7/2006 |
| KR | 20060120889 A | 11/2006 |

* cited by examiner

NONVOLATILE MEMORY DEVICE AND DRIVING METHOD THEREOF

CROSS-REFERENCE TO RELATED APPLICATIONS

A claim for priority under 35 U.S.C. §119 is made to Korean Patent Application No. 10-2011-0115733 filed Nov. 8, 2011, in the Korean Intellectual Property Office, the entire contents of which are hereby incorporated by reference.

BACKGROUND

Example embodiments of inventive concepts relate to a nonvolatile memory device and/or a driving method thereof.

A semiconductor memory device may be volatile (hereinafter, referred to as a volatile memory device) or nonvolatile (hereinafter, referred to as a nonvolatile memory device). A nonvolatile memory device retains contents stored therein even at power-off. Data stored in the nonvolatile memory device may be permanent or reprogrammed according to the fabrication technology used. Nonvolatile memory devices may be used for program and microcode storage in a wide variety of applications in the computer, avionics, telecommunications, and consumer electronics industries.

SUMMARY

According to example embodiments of inventive concepts, a nonvolatile memory device includes a plurality of strings having a plurality of serially-connected selection transistors and a plurality of memory cells connected in series to one end of the serially-connected selection transistors; and a control logic configured to perform a program operation for setting a threshold voltage of at least one of the serially-connected selection transistors.

In example embodiments, a selection transistor, connected to the one end, from among the serially-connected selection transistors may be programmed at the program operation. The plurality of serially-connected selection transistors may include a to-be-programmed selection transistor at the one end of the plurality of serially-connected selection transistors, and the control logic may be configured to program the to-be-programmed selection transistor during the program operation to convert the to-be-programmed selection transistor into a programmed selection transistor.

The control logic may be configured to verify the programmed selection transistor using a verification voltage corresponding to the threshold voltage after execution of the program operation. The verification voltage may correspond to the threshold voltage set by the control logic.

The control logic may be configured to verify the plurality of serially-connected selection transistors using a verification voltage corresponding to the threshold voltage after execution of the program operation.

The control logic may be configured to program one of the plurality of serially-connected selection transistor that is adjacent to a bit line at the program operation.

The serially-connected selection transistors may include a first string selection transistor connected to a bit line and programmed to have a first threshold voltage, and a second string selection transistor connected between the first string selection transistor and the one end of the plurality of serially-connected selection transistors. The second string selection transistor may be programmed to have a second threshold voltage.

In example embodiments, the first threshold voltage may be equal to the second threshold voltage.

In example embodiments, the first threshold voltage may be different from the second threshold voltage.

At least two strings of the plurality of strings are connected to one bit line.

At least one of the serially-connected selection transistors may include a depletion type transistor or an enhancement type transistor connected with the bit line to select one of the at least two strings connected with the bit line.

The depletion type transistor or the enhancement type transistor may be formed by an ion implantation manner.

The depletion type transistor or the enhancement type transistor may have the same structure as each memory cell and is programmed.

Each of the plurality of strings may include a substrate, wherein the plurality of selection transistors and the memory cells stacked in a direction perpendicular to a substrate.

The plurality of serially-connected selection transistors may include a first string selection transistor connected to a bit line and formed by an ion implantation manner; and a second string selection transistor connected to the first string selection transistor, having the same structure as each memory cell, and programmed.

In example embodiments, each of the at least two strings may include a first string having a first enhancement type selection transistor connected to the bit line and a first depletion type selection transistor connected to the first enhancement type selection transistor; and a second string having a second depletion type selection transistor connected to the bit line and a second enhancement type selection transistor connected to the second depletion type selection transistor. Each of the first and second enhancement type selection transistors and the first and second depletion type selection transistors may include at least two selection transistors having the same structure as each memory cell, at least one of the at least two selection transistors being programmed.

The control logic may be configured so when one of the memory cells is programmed, a first selection voltage provided to at least one unprogrammed selection transistor is different from a second selection voltage provided to a programmed selection transistor, the at least one unprogrammed selection transistor being adjacent to the programmed selection transistor.

The control logic may be configured to operate so when one of the memory cells is read, a first read pass voltage provided to at least one unprogrammed selection transistor is equal to a second read pass voltage provided to the remaining memory cells excepting the memory cell to be read, the at least one unprogrammed selection transistor being adjacent to the programmed selection transistor.

The control logic may be configured to operate so when one of the memory cells is read, a first read pass voltage provided to at least one unprogrammed selection transistor is lower than a second read pass voltage provided to the remaining memory cells excepting the memory cell to be read, the at least one unprogrammed selection transistor being adjacent to the programmed selection transistor.

The program operation may be performed at a test operation of the nonvolatile memory device.

The program operation may be performed when a program/erase cycle number reaches a reference value.

The nonvolatile memory device may further include a row decoder providing voltages to selection lines controlling the selection transistors and word lines controlling the memory cells; and an input/output circuit transferring data to be programmed to memory cells via bit lines connected with the plurality of strings and receiving data read from the memory cells.

Example embodiments of inventive concepts may also relate to a nonvolatile memory device which comprises a plurality of memory cells being connected in series; a first selection transistor connected to one end of the memory cells and programmed to have a first threshold voltage; a second selection transistor connected to the first selection transistor and programmed to have a second threshold voltage; and a third selection transistor connected to the second selection transistor and programmed to have a third threshold voltage.

The first threshold voltage may be lower than the second and third threshold voltages. The first threshold voltage may be higher than the second and third threshold voltages.

The first to third selection transistors may be verified using a first verification voltage having the first threshold voltage after the first selection transistor is programmed, the first to third selection transistors may be verified using a second verification voltage having the second threshold voltage after the second selection transistor is programmed, and the first to third selection transistors may be verified using a third verification voltage having the third threshold voltage after the third selection transistor is programmed.

According to example embodiments, after program operations of the first to third selection transistors are successively performed, whether a threshold voltage of one of the programmed selection transistors is equal to or higher than a first reference value may be judged. If a threshold voltage of one of the programmed selection transistors is equal to or higher than a first reference value, another of the remaining selection transistors may be programmed, whether a threshold voltage of the another programmed selection transistor is equal to or higher than a second reference value being judged.

The plurality of memory cells and the first to third selection transistors may constitute a pillar which is formed to penetrate word lines and selection lines formed in a direction perpendicular to a substrate to have a substrate shape.

According to example embodiments nonvolatile memory device including: a plurality of bit lines; a common source line; a plurality of strings between the common source line and the plurality of bit lines, a control logic connected to the plurality of strings. Each of the plurality of strings may include a plurality of selection transistors, the plurality of selection transistor including a ground selection transistor connected to the common source line and at least one string selection transistor connected to one of the plurality of bit lines, and a plurality of memory cells serially-connected between the ground selection transistor and the at least one string selection transistor. The control logic may be configured to perform a program operation for setting a threshold voltage of at least one of the plurality of selection transistors.

The at least one string selection transistor of the plurality of selection transistors in each of the plurality of strings may include: a first string selection transistor connected to one of the plurality of bit lines, and a second string selection transistor connected between the first string selection transistor and the plurality of memory cells. The control logic may be configured to set a threshold voltage of the first string selection transistor or the second string selection transistor of a selected string among the plurality of strings during the program voltage.

At least two strings of the plurality of string may be connected to a common bit line among the plurality of bit lines.

Two strings of the plurality of strings may be connected to the common bit line. The two strings may each include 1 to i string selection transistors that are serially-connected between the plurality of memory cells and the common bit line. Also, i may be an integer greater than or equal to 4. The $1^{st}$ string selection transistor in one of the two strings may be an enhancement type. The $2^{nd}$ to $i^{th}$ string selection transistors in the one of the two strings may be a depletion type. The $1^{st}$ string selection transistor in an other of the two strings may be the depletion type. The $2^{nd}$ to $i^{th}$ string selection transistors in the other of the two strings may be the enhancement type. The control logic may be configured to set a threshold voltage of one of the 2nd to $i^{th}$ string selection transistors in a selected one of the two strings during the program operation.

Two strings of the plurality of strings may be connected to the common bit line. The two strings may each include 1 to i string selection transistors that are serially-connected between the plurality of memory cells and the common bit line. Also, i may be an integer greater than or equal to 5. The $1^{st}$ to $j^{th}$ string selection transistor in one of the two strings may be an enhancement type, where j may be an integer between 1 and i. The $j^{th}$ to $i^{th}$ string selection transistors in the one of the two strings may be a depletion type. The $1^{st}$ to $j^{th}$ string selection transistors in an other of the two strings may be the depletion type. The $j^{th}$ to $i^{th}$ string selection transistors in the other of the two strings may be the enhancement type. The control logic may be configured to set a threshold voltage of one of the $1^{st}$ to $i^{th}$ string selection transistors in a selected one of the two strings during the program operation.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
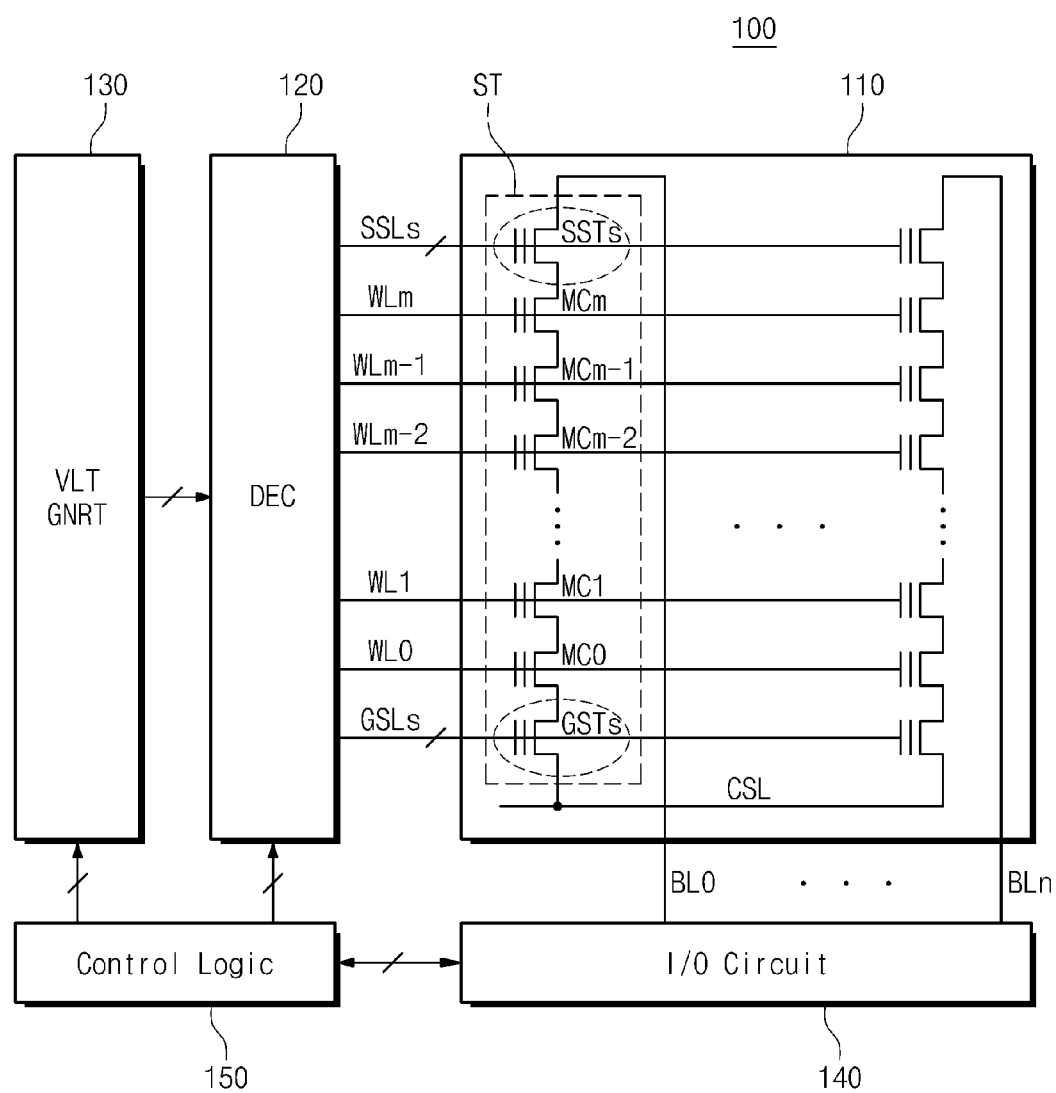
FIG. 1 is a block diagram schematically illustrating a nonvolatile memory device according to example embodiments of inventive concepts.

Example embodiments of inventive concepts will now be described more fully with reference to the accompanying drawings. Inventive concepts, however, may be embodied in various different forms, and should not be construed as being limited only to the embodiments set forth herein. Rather, these embodiments are provided as examples so that this disclosure will be thorough and complete, and will fully convey the scope of inventive concepts to those skilled in the art. Unless otherwise noted, like reference numerals denote like elements throughout the attached drawings and written description, and thus descriptions will not be repeated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on").

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

A nonvolatile memory device according to example embodiments of inventive concepts may be a NAND flash memory, a vertical NAND flash memory, a NOR flash memory, a Resistive Random Access Memory (RRAM), a Phase-change RAM (PRAM), a Magnetroresistive RAM (MRAM), a Ferroelectric RAM (FRAM), a Spin Transfer Torque RAM (STT-RAM), or the like. Further, a nonvolatile memory device according to example embodiments of inventive concepts can be implemented to have a three-dimensional array structure. Example embodiments of inventive concepts are applicable to a flash memory device, in which a charge storage layer is formed of a conductive floating gate, and a charge trap flash (CTF) memory in which a charge storage layer is formed of an insulation film.

Below, for ease of description, a nonvolatile memory device 100 may be assumed to be a NAND flash memory device.

FIG. 1 is a block diagram schematically illustrating a nonvolatile memory device according to example embodiments of inventive concepts. Referring to FIG. 1, a nonvolatile memory device 100 may include a memory cell array 110, a row decoder 120, a voltage generator 130, an input/output circuit 140, and a control logic 150.

The memory cell array 110 may include a plurality of memory blocks. For ease of illustration, one memory block may be illustrated in FIG. 1. A memory block may include strings ST connected to bit lines BL0 to BLn, respectively.

In each string, one or a plurality of ground selection transistors (e.g., GST), a plurality of memory cells MC0 to MCm, and one or a plurality of string selection transistors (e.g., SST) may be connected in series between a common source line CSL and a corresponding bit line (e.g., BL0).

The selection transistors may be configured to have the same structure as the memory cells. That is, the selection transistors may be configured to include charge storing layers like the memory cells.

The plurality of string selection transistors may be driven by voltages transferred via a plurality of string selection lines. At least one of the string selection transistors may be programmed for setting of a threshold voltage.

In example embodiments, at least one of the string selection transistors may be programmed and verified to have a desired (and/or alternatively predetermined) threshold voltage. Herein, the desired (and/or alternatively predetermined) threshold voltage may be about 0.7V. However, example embodiments of inventive concepts are not limited thereto. A program operation may be performed in an incremental step pulse programming (ISPP) manner.

The plurality of ground selection transistors may be driven by voltages transferred via a plurality of ground selection lines. At least one of the ground selection transistors may be programmed for setting of a threshold voltage.

In example embodiments, at least one of the ground selection transistors may be programmed and verified to have a desired (and/or alternatively predetermined) threshold voltage.

Programming of selection transistors is disclosed in KR Patent Publication No. 2006-0120889 and U.S. Patent Publication Nos. 2009/0027967, 2010/0072559, and 2010/0128531, the entire contents of which are hereby incorporated by references.

In each string ST, the memory cells MC0 to MCm may store at least one bit of data, respectively, and may be driven by voltages transferred via corresponding word lines WL0 to WLm.

The row decoder 120 may select one of memory blocks in response to an address, and may provide word line voltages (e.g., a program voltage, a pass voltage, an erase voltage, a verification voltage, a read voltage, a read pass voltage, etc.) with corresponding word lines.

The voltage generator 130 may generate word line voltages. Although not shown in FIG. 1, the voltage generator 130 may include a high voltage generator for generating a high voltage, a low voltage generator for generating a low voltage, and a negative voltage generator for generating a negative voltage.

At a program operation, the input/output circuit 130 may temporarily store data input from an external device to load it onto a selected page. At a read operation, the input/output circuit 130 may temporarily store data read from a selected page to output it to the external device. Although not shown in FIG. 1, the input/output circuit 130 may include page buffers corresponding to the bit lines BL0 to BLn, respectively. Each of the page buffers may include at least one latch which is configured to temporarily store data to be programmed at a memory cell connected to a corresponding bit line or data read from a memory cell connected to a corresponding bit line.

The control logic 150 may control an overall operation of the nonvolatile memory device 100. The control logic 150 may analyze control signals and command from the external device, and may control the row decoder 120, the voltage generator 130, and the input/output circuit 140 according to the analyzed result. That is, the control logic 150 may control the voltage generator 130 to generate voltages for driving (e.g., programming, reading, erasing, etc.), the row decoder 120 to transfer the generated voltages to the word lines WL0 to WLm, and the input/output circuit 140 to interface page data to be programmed or page data read.

In example embodiments, the control logic 140 may perform program and verification operations of the string and ground selection transistors in response to a selection transistor program command from the external device. Thus, the string and ground selection transistors may be programmed to have a desired (and/or alternatively predetermined) threshold voltage. Herein, the selection transistor program command may be input at a test level of the nonvolatile memory device 100.

In example embodiments, when reestablishment of threshold voltages of the string and ground selection transistors is desired (and/or required), the control logic 150 may perform program and verification operations of the string and ground selection transistors so as to be programmed to a desired (and/or alternatively predetermined) threshold voltage. Herein, the reestablishment of threshold voltages may be determined according to a program/erase (PE) cycle. For example, if a P/E cycle is over 100, threshold voltages of the string and ground selection transistors may be reestablished. The reestablishment of threshold voltages can be determined using references for judging wear-leveling of a memory block.

In a general nonvolatile memory device, threshold voltages of selection transistors may be adjusted by an ion implantation manner. In this case, since it is difficult to control a distribution of impurity finely via the ion implantation manner, program disturbance issues may arise.

In case of the nonvolatile memory device 100 according to example embodiments of inventive concepts, threshold voltages of the string and ground selection transistors may be adjusted by programming them. In this case, the program disturbance may be reduced.

Figure 2:
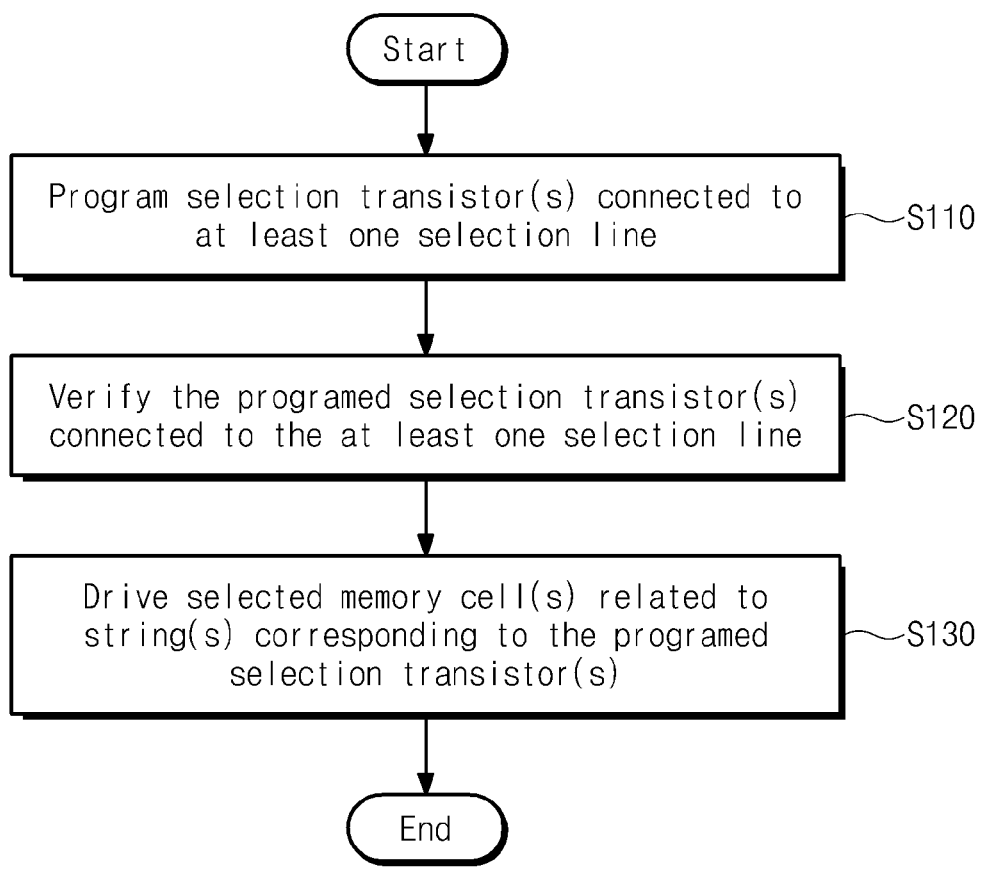
FIG. 2 is a driving method of a nonvolatile memory device according to example embodiments of inventive concepts.

FIG. 2 is a driving method of a nonvolatile memory device according to example embodiments of inventive concepts.

In operation S110, at least one selection transistor connected to at least one selection line (e.g., a string selection line) may be programmed.

In operation S120, whether the at least one selection transistor is programmed normally may be verified. Herein, a verification operation may use a threshold voltage to be set as a verification voltage.

In operation S130, a selected memory cell in a string corresponding to the programmed selection transistor may be driven. Herein, driving of the memory cell may be programming, reading, or erasing.

With the driving method of the nonvolatile memory device 100 according to example embodiments of inventive concepts, memory cells may be driven after a selection transistor (s) is programmed.

The selection transistor programming method of inventive concepts is applicable to a vertical NAND, a planar NAND, and a single bit line or shared bit line structure of the VNAND.

Below, various selection transistor programming methods according to example embodiments will be described.

Figure 3:
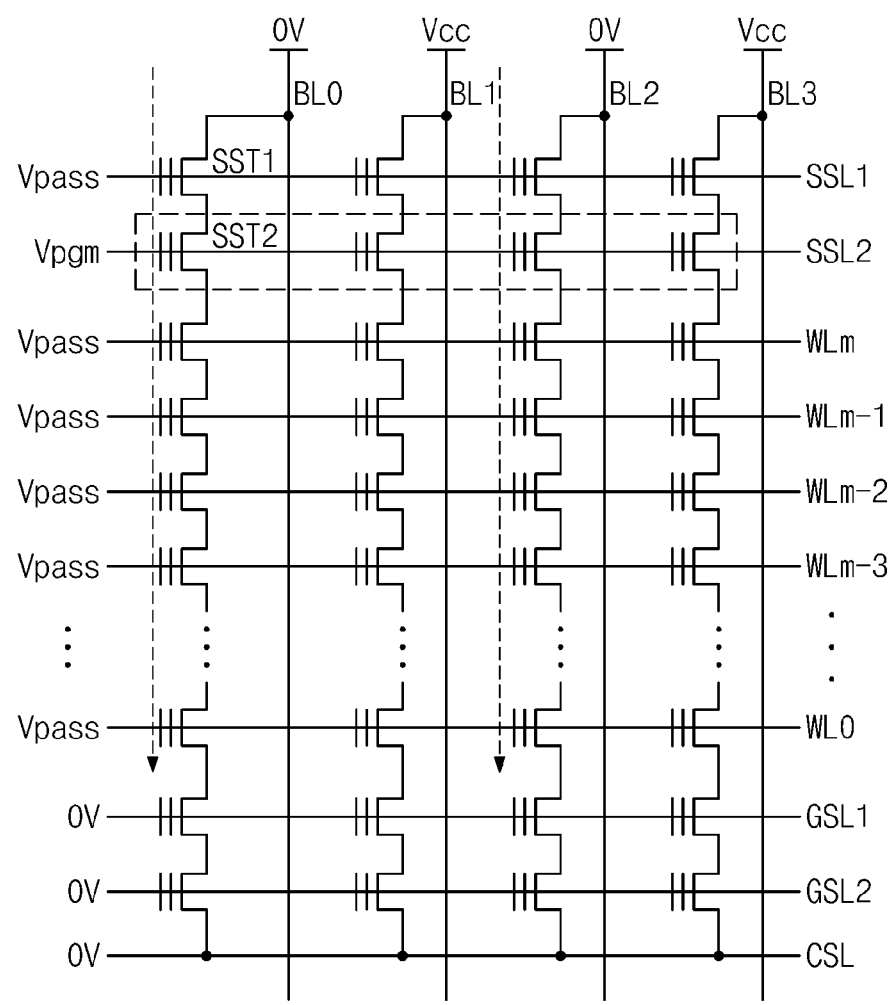
FIG. 3 is a diagram illustrating a selection transistor programming method according to example embodiments of inventive concepts.

FIG. 3 is a diagram illustrating a selection transistor programming method according to example embodiments of inventive concepts. Referring to FIG. 3, a first string selection transistor SST1 connected to a first string selection line SSL1 may maintain an initial erase state, and a second string selection transistor SST2 connected to a second string selection line SSL2 may be programmed such that its threshold voltage is adjusted.

A string selection transistor may be programmed under the following bias condition. It is assumed that string selection transistors corresponding to even-numbered bit lines BL0 and BL2 are to be programmed. A program voltage (e.g., 0V) may be provided to the even-numbered bit lines BL0 and BL2, and a program-inhibition voltage (e.g., a power supply voltage: Vcc) may be provided to odd-numbered bit lines BL1 and BL3. A pass voltage Vpass may be provided to a first string selection line SSL1 and word lines WL0 to WLm, a program voltage Vpgm may be provided to a second string selection line SSL2, and a voltage of 0V may be applied to ground selection lines GSL1 and GSL2 and a common source line CSL.

Although not shown in FIG. 3, a program bias condition of string selection transistors corresponding to the odd-numbered bit lines BL1 and BL3 may be equal to the above-described bias condition except that the program voltage is provided to the odd-numbered bit lines BL1 and BL3 and the program-inhibition voltage is provided to even-numbered bit lines BL0 and BL2.

While FIG. 3 illustrates an example where string selection transistors connected to the even-numbered bit lines BL0 and BL2 and string selection transistors connected to the odd-numbered bit lines BL1 and BL3 are programmed independently, example embodiments of inventive concepts are not limited thereto. For example, string selection transistors connected to fewer than two bit lines, or more than two bit lines (e.g., all bit lines) can be programmed at the same time.

A second string selection transistor SST2 between a first string selection transistor SST1 and a memory cell MCm may be programmed according to the selection transistor programming method of inventive concepts.

Figure 4:
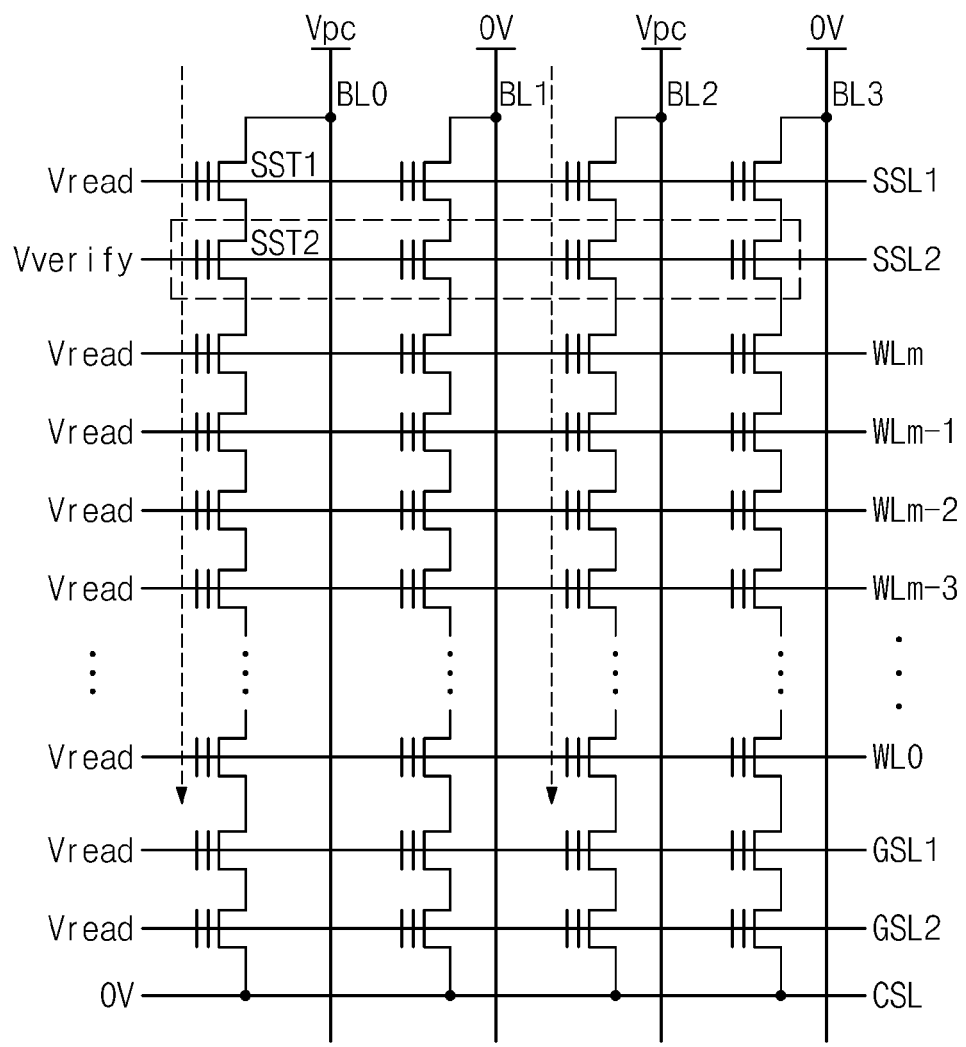
FIG. 4 is a diagram illustrating a verification operation for verifying a selection transistor programming operation in FIG. 3 according to example embodiments of inventive concepts.

FIG. 4 is a diagram illustrating a verification operation for verifying a selection transistor programming operation in FIG. 3 according to example embodiments of inventive concepts. Referring to FIG. 4, at a verification operation, a programmed string selection transistor SST may be verified using a verification voltage Vverify.

A string selection transistor may be verified under the following bias conditions. In FIG. 4, an example is illustrate where the string selection transistors corresponding to even-numbered bit lines BL0 and BL2 are verified. A pre-charge voltage Vpc may be provided to the even-numbered bit lines BL0 and BL2, and a voltage of 0V may be provided to odd-numbered bit lines BL1 and BL3. A read pass voltage Vread may be provided to a first string selection line SSL1, word lines WL0 to WLm, and ground selection lines GSL1 and GSL2, a verification voltage Vverify may be provided to a second string selection line SSL2, and a voltage of 0V may be provided to a common source line CSL.

In example embodiments, the verification voltage Vverify may be about 0.7V.

Although not shown in FIG. 4, a verification bias condition of string selection transistors corresponding to the odd-numbered bit lines BL1 and BL3 may be equal to the above-described bias condition except that the pre-charge voltage Vpc is provided to the odd-numbered bit lines BL1 and BL3 and the voltage of 0V is provided to even-numbered bit lines BL0 and BL2.

With the above description, only programmed selection transistors may be verified at a verification operation.

Figure 5:
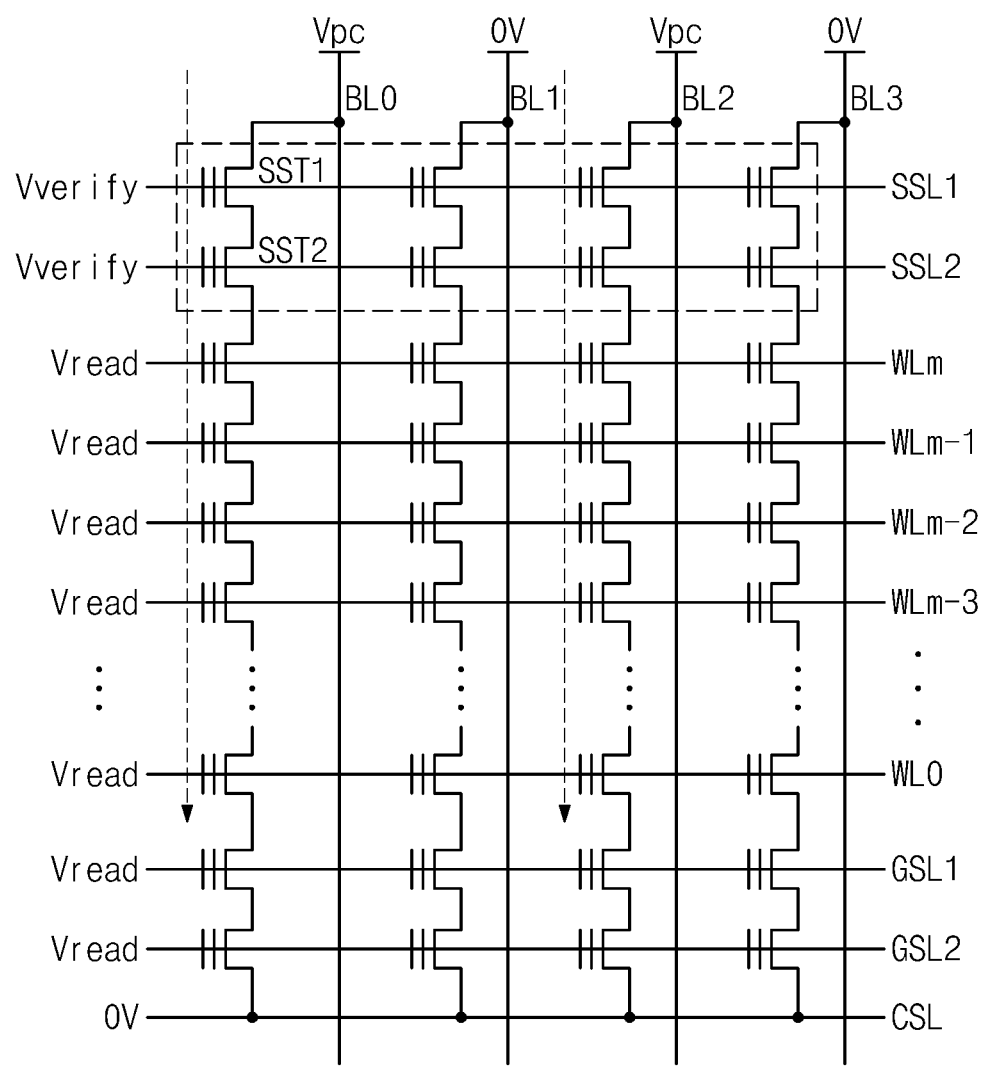
FIG. 5 is a diagram illustrating a verification operation for verifying a selection transistor programming operation in FIG. 3 according to example embodiments of inventive concepts.

FIG. 5 is a diagram illustrating a verification operation for verifying a selection transistor programming operation in FIG. 3 according to example embodiments of inventive concepts. Referring to FIG. 5, at a verification operation, an un-programmed string selection transistor SST1 and a programmed string selection transistor SST2 may be verified using a verification voltage Vverify.

String selection transistors may be verified under the following bias condition. In FIG. 5, there may be exemplarily illustrated an example that string selection transistors corresponding to even-numbered bit lines BL0 and BL2 are verified. A pre-charge voltage Vpc may be provided to the even-numbered bit lines BL0 and BL2, and a voltage of 0V may be provided to odd-numbered bit lines BL1 and BL3. A verification voltage Vverify may be provided to first and second string selection lines SSL1 and SSL2, a read pass voltage Vread may be provided to word lines WL0 to WLm and ground selection lines GSL1 and GSL2, and a voltage of 0V may be provided to a common source line CSL.

Although not shown in FIG. 5, a verification bias condition of string selection transistors corresponding to the odd-numbered bit lines BL1 and BL3 may be equal to the above-described bias condition except that the pre-charge voltage Vpc is provided to the odd-numbered bit lines BL1 and BL3 and the voltage of 0V is provided to even-numbered bit lines BL0 and BL2.

In FIG. 5, an un-programmed string selection transistor SST1 and a programmed string selection transistor SST2 may be verified using the same verification voltage Vverify. However, example embodiments of inventive concepts are not limited thereto. For example, an un-programmed string selection transistor SST1 and a programmed string selection transistor SST2 can be verified using different verification voltages.

With the above description, both an un-programmed string selection transistor SST1 and a programmed string selection transistor SST2 may be verified.

Figure 6:
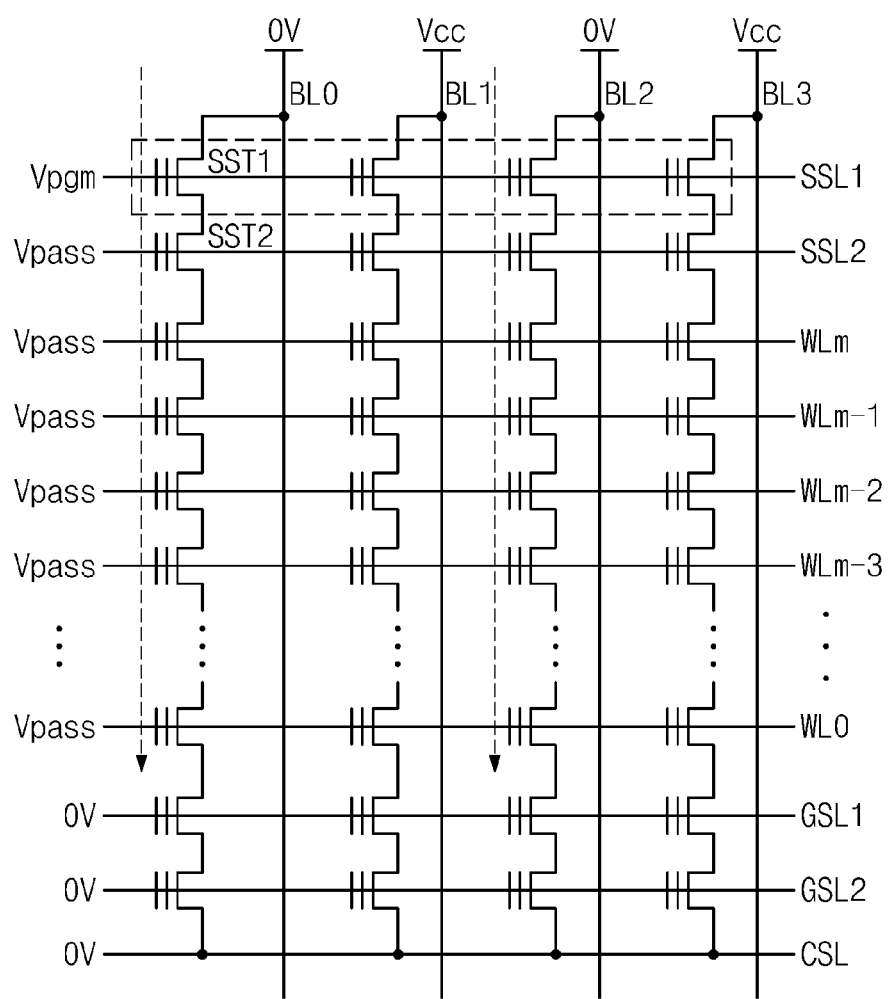
FIG. 6 is a diagram illustrating a selection transistor programming method according to example embodiments of inventive concepts.

FIG. 6 is a diagram illustrating a selection transistor programming method according to example embodiments of inventive concepts. Referring to FIG. 6, a first string selection transistor SST1 connected to a first string selection line SSL1 may be programmed such that its threshold voltage is adjusted, and a second string selection transistor SST2 connected to a second string selection line SSL2 may maintain an initial erase state.

A string selection transistor may be programmed under the following bias condition. It is assumed that string selection transistors corresponding to even-numbered bit lines BL0 and BL2 are to be programmed. A program voltage (e.g., 0V) may be provided to the even-numbered bit lines BL0 and BL2, and a program-inhibition voltage (e.g., a power supply voltage: Vcc) may be provided to odd-numbered bit lines BL1 and BL3. A pass voltage Vpass may be provided to a second string selection line SSL2 and word lines WL0 to WLm, a program voltage Vpgm may be provided to a first string selection line SSL1, and a voltage of 0V may be applied to ground selection lines GSL1 and GSL2 and a common source line CSL.

Although not shown in FIG. 6, a program bias condition of string selection transistors corresponding to the odd-numbered bit lines BL1 and BL3 may be equal to the above-described bias condition except that the program voltage is provided to the odd-numbered bit lines BL1 and BL3 and the program-inhibition voltage is provided to even-numbered bit lines BL0 and BL2.

While FIG. 6 illustrates an example where string selection transistors connected to the even-numbered bit lines BL0 and BL2 and string selection transistors connected to the odd-numbered bit lines BL1 and BL3 are programmed independently, example embodiments of inventive concepts are not limited thereto. For example, string selection transistors connected to fewer than two bit lines, or more than two bit line (e.g., all bit lines) may be programmed at the same time.

As described above, a first string selection transistor SST1 between a bit line and a second string selection transistor SST2 may be programmed.

Figure 7:
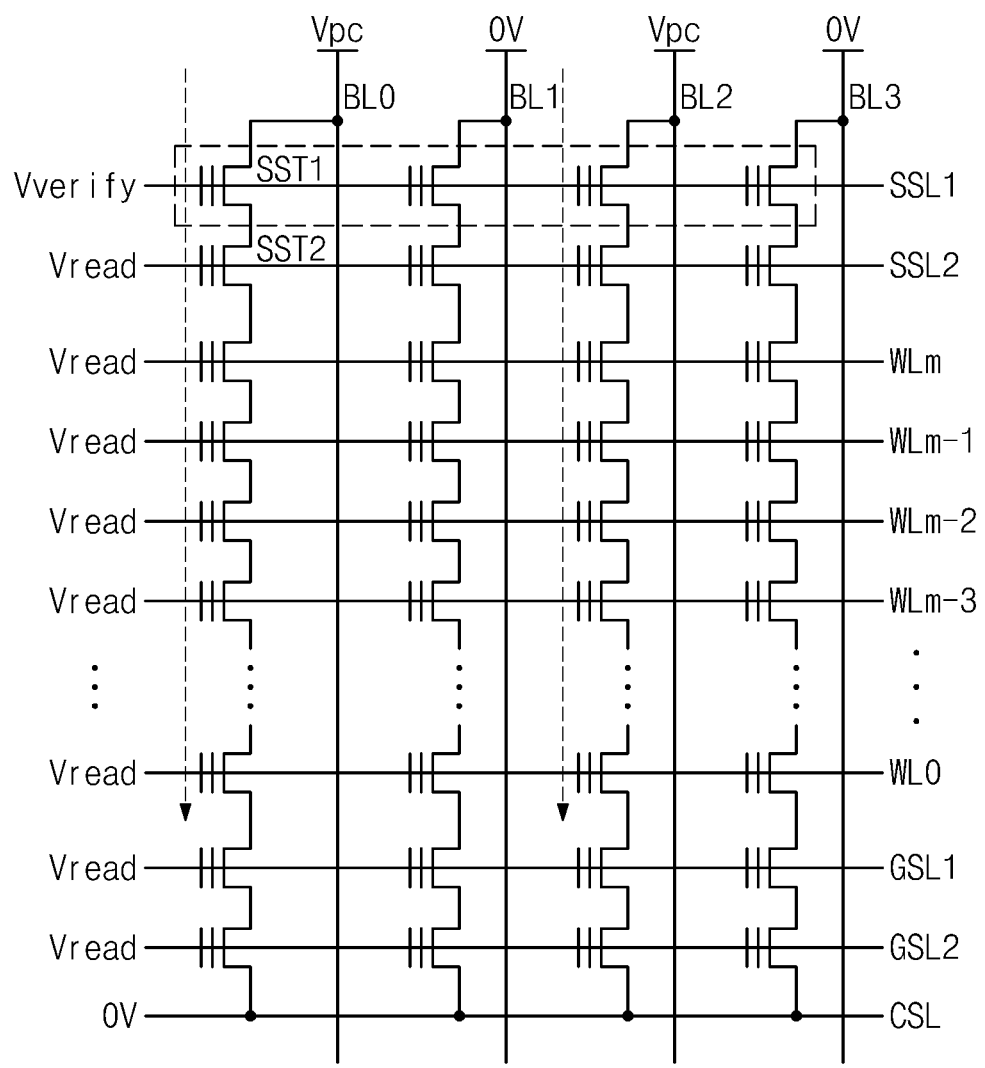
FIG. 7 is a diagram illustrating a verification operation for verifying a selection transistor programming operation in FIG. 6 according to example embodiments of inventive concepts.

FIG. 7 is a diagram illustrating a verification operation for verifying a selection transistor programming operation in FIG. 6 according to example embodiments of inventive concepts. Referring to FIG. 7, at a verification operation, a programmed string selection transistor may be verified using a verification voltage Vverify.

A string selection transistor may be verified under the following bias condition. In FIG. 7, an example is illustrated where string selection transistors corresponding to even-numbered bit lines BL0 and BL2 are verified. A pre-charge voltage Vpc may be provided to the even-numbered bit lines BL0 and BL2, and a voltage of 0V may be provided to odd-numbered bit lines BL1 and BL3. A read pass voltage Vread may be provided to a second string selection line SSL2, word lines WL0 to WLm, and ground selection lines GSL1 and GSL2, a verification voltage Vverify may be provided to a first string selection line SSL1, and a voltage of 0V may be provided to a common source line CSL.

Although not shown in FIG. 7, a verification bias condition of string selection transistors corresponding to the odd-numbered bit lines BL1 and BL3 may be equal to the above-described bias condition except that the pre-charge voltage Vpc is provided to the odd-numbered bit lines BL1 and BL3, and the voltage of 0V is provided to even-numbered bit lines BL0 and BL2.

With the above description, only programmed selection transistors may be verified at a verification operation.

Figure 8:
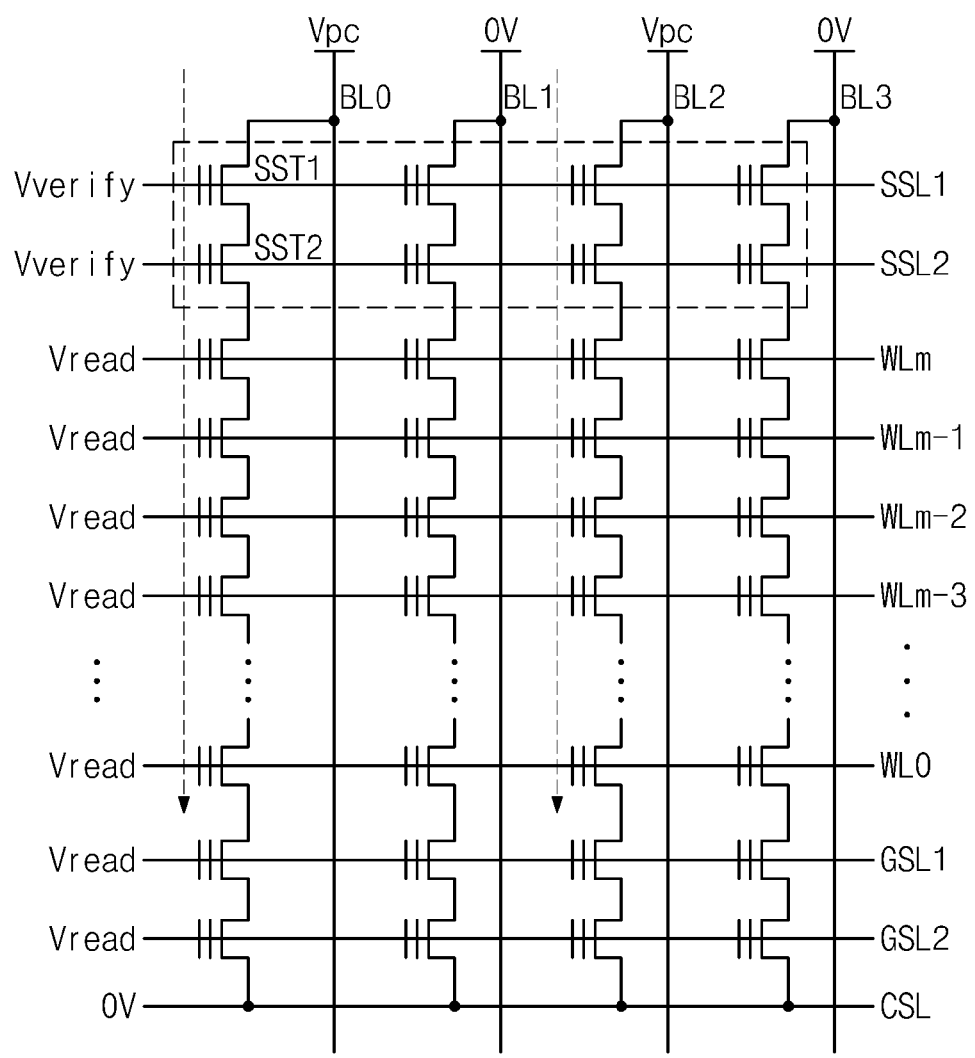
FIG. 8 is a diagram illustrating a verification operation for verifying a selection transistor programming operation in FIG. 7 according to example embodiments of inventive concepts.

FIG. 8 is a diagram illustrating a verification operation for verifying a selection transistor programming operation in FIG. 7 according to example embodiments of inventive concepts. Referring to FIG. 8, at a verification operation, a programmed string selection transistor SST1 and an un-programmed string selection transistor SST2 may be verified using a verification voltage Vverify.

String selection transistors may be verified under the following bias condition. In FIG. 8, there may be exemplarily illustrated an example that string selection transistors corresponding to even-numbered bit lines BL0 and BL2 are verified. A pre-charge voltage Vpc may be provided to the even-numbered bit lines BL0 and BL2, and a voltage of 0V may be provided to odd-numbered bit lines BL1 and BL3. A verification voltage Vverify may be provided to first and second string selection lines SSL1 and SSL2, a read pass voltage Vread may be provided to word lines WL0 to WLm and ground selection lines GSL1 and GSL2, and a voltage of 0V may be provided to a common source line CSL.

Although not shown in FIG. 8, a verification bias condition of string selection transistors corresponding to the odd-numbered bit lines BL1 and BL3 may be equal to the above-described bias condition except that the pre-charge voltage Vpc is provided to the odd-numbered bit lines BL1 and BL3 and the voltage of 0V is provided to even-numbered bit lines BL0 and BL2.

With the above description, both an un-programmed string selection transistor SST1 and a programmed string selection transistor SST2 may be verified.

Figure 9:
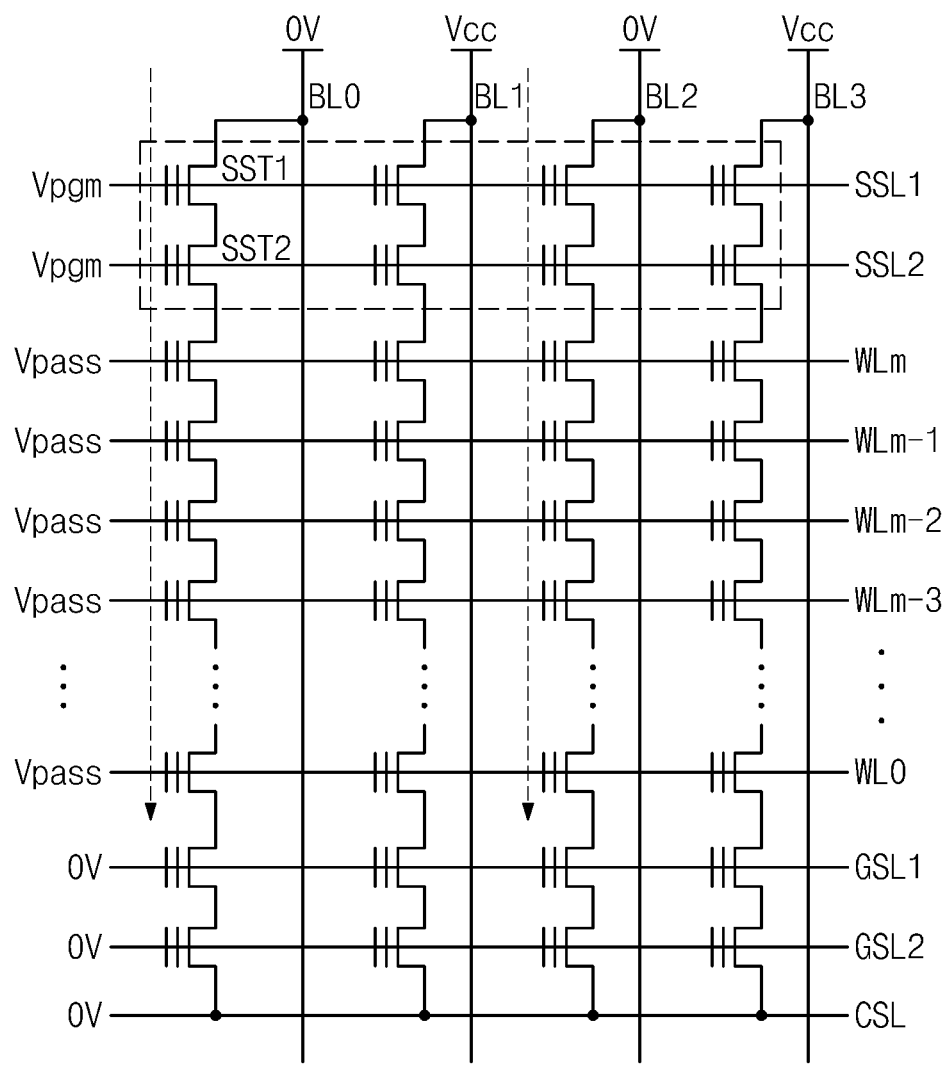
FIG. 9 is a diagram illustrating a selection transistor programming method according to example embodiments of inventive concepts.

FIG. 9 is a diagram illustrating a selection transistor programming method according to example embodiments of inventive concepts. Referring to FIG. 9, a first string selection transistor SST1 connected to a first string selection line SSL1 and a second string selection transistor SST2 connected to a second string selection line SSL2 may be programmed such that threshold voltages are adjusted.

A string selection transistor may be programmed under the following bias condition. It is assumed that string selection transistors corresponding to even-numbered bit lines BL0 and BL2 are to be programmed. A program voltage (e.g., 0V) may be provided to the even-numbered bit lines BL0 and BL2, and a program-inhibition voltage (e.g., a power supply voltage: Vcc) may be provided to odd-numbered bit lines BL1 and BL3. A pass voltage Vpass may be provided to word lines WL0 to WLm, a program voltage Vpgm may be provided to first and second string selection lines SSL1 and SSL2, and a voltage of 0V may be applied to ground selection lines GSL1 and GSL2 and a common source line CSL.

Although not shown in FIG. 9, a program bias condition of string selection transistors corresponding to the odd-numbered bit lines BL1 and BL3 may be equal to the above-described bias condition except that the program voltage is provided to the odd-numbered bit lines BL1 and BL3 and the program-inhibition voltage is provided to even-numbered bit lines BL0 and BL2.

In FIG. 9, an example is illustrated where string selection transistors connected to the even-numbered bit lines B0 and BL2 and string selection transistors connected to the odd-numbered bit lines BL1 and BL3 are programmed independently. However, example embodiments of inventive concepts are not limited thereto. For example, string selection transistors connected to fewer than two bit lines, or more than two bit lines (e.g., all bit lines) can be programmed at the same time.

String selection transistors (e.g., SST1 and SST2) connected to bit lines (e.g., BL0) may be programmed according to the selection transistor programming method of inventive concepts.

Figure 10:
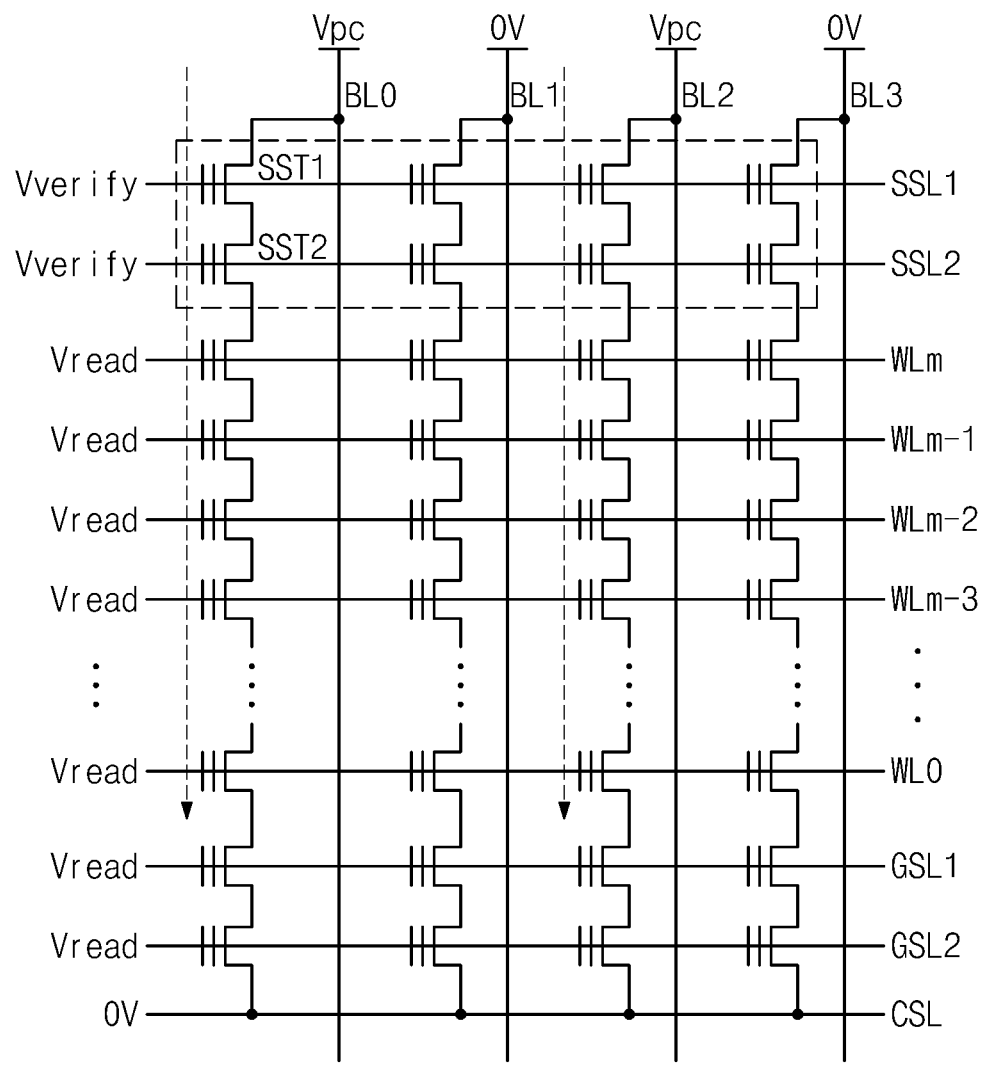
FIG. 10 is a diagram illustrating a verification operation for verifying a selection transistor programming operation in FIG. 9 according to example embodiments of inventive concepts.

FIG. 10 is a diagram illustrating a verification operation for verifying a selection transistor programming operation in FIG. 9 according to example embodiments of inventive concepts. Referring to FIG. 10, at a verification operation, programmed string selection transistors (e.g., SST1 and SST2) may be verified using a verification voltage Vverify.

A string selection transistor may be verified under the following bias condition. In FIG. 10, there may be exemplarily illustrated an example that string selection transistors corresponding to even-numbered bit lines BL0 and BL2 are verified. A pre-charge voltage Vpc may be provided to the even-numbered bit lines BL0 and BL2, and a voltage of 0V may be provided to odd-numbered bit lines BL1 and BL3. A read pass voltage Vread may be provided to word lines WL0 to WLm, and ground selection lines GSL1 and GSL2, a verification voltage Vverify may be provided to a first string selection line SSL1 and a second string selection line SSL2, and a voltage of 0V may be provided to a common source line CSL.

Although not shown in FIG. 10, a verification bias condition of string selection transistors corresponding to the odd-numbered bit lines BL1 and BL3 may be equal to the above-described bias condition except that the pre-charge voltage Vpc is provided to the odd-numbered bit lines BL1 and BL3, and the voltage of 0V is provided to even-numbered bit lines BL0 and BL2.

With the above description, programmed selection transistors may be verified at a verification operation.

Figure 11:
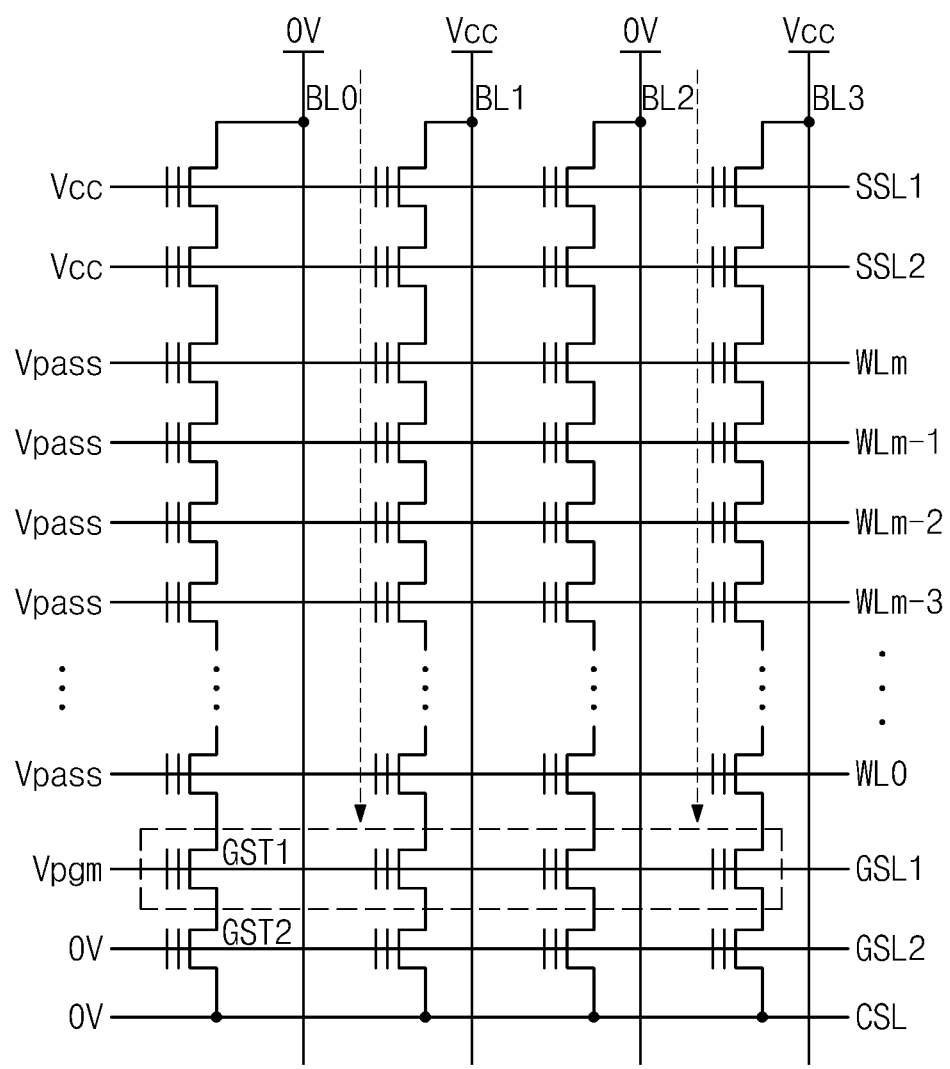
FIG. 11 is a diagram illustrating a selection transistor programming method according to example embodiments of inventive concepts.

FIG. 11 is a diagram illustrating a selection transistor programming method according to example embodiments of inventive concepts. Referring to FIG. 11, a first ground selection transistor GST1 connected to a first ground selection line GSL1 may be programmed such that its threshold voltage is adjusted, and a second ground selection transistor GST2 connected to a second ground selection line GSL2 may maintain an initial erase state.

A ground selection transistor may be programmed under the following bias condition. It is assumed that ground selection transistors corresponding to even-numbered bit lines BL0 and BL2 are to be programmed. A program voltage (e.g., 0V) may be provided to the even-numbered bit lines BL0 and BL2, and a program-inhibition voltage (e.g., a power supply voltage: Vcc) may be provided to odd-numbered bit lines BL1 and BL3. A power supply voltage Vcc may be provided to a first string selection line SSL1 and a second string selection line SSL2, a pass voltage Vpass may be provided to word lines WL0 to WLm, a program voltage Vpgm may be provided to a first ground selection line GSL1, and a voltage of 0V may be applied to a second ground selection line GSL2 and a common source line CSL.

In other example embodiments, at a ground selection transistor programming operation, the pass voltage Vpass can be provided to the first and second string selection lines SSL1 and SSL2.

Although not shown in FIG. 11, a program bias condition of ground selection transistors corresponding to the odd-numbered bit lines BL1 and BL3 may be equal to the above-described bias condition except that the program voltage is provided to the odd-numbered bit lines BL1 and BL3 and the program-inhibition voltage is provided to even-numbered bit lines BL0 and BL2.

In FIG. 11, there may be exemplarily illustrated an example that string selection transistors connected to the even-numbered bit lines BL0 and BL2 and string selection transistors connected to the odd-numbered bit lines BL1 and BL3 are programmed independently. However, example embodiments of inventive concepts are not limited thereto. For example, string selection transistors connected to fewer than two bit lines, or more than two bit lines (e.g., all bit lines) can be programmed at the same time.

A first ground selection transistor GST1 between a memory cell MC0 and a second string selection transistor GST2 may be programmed according to the ground selection transistor programming method of inventive concepts.

Figure 12:
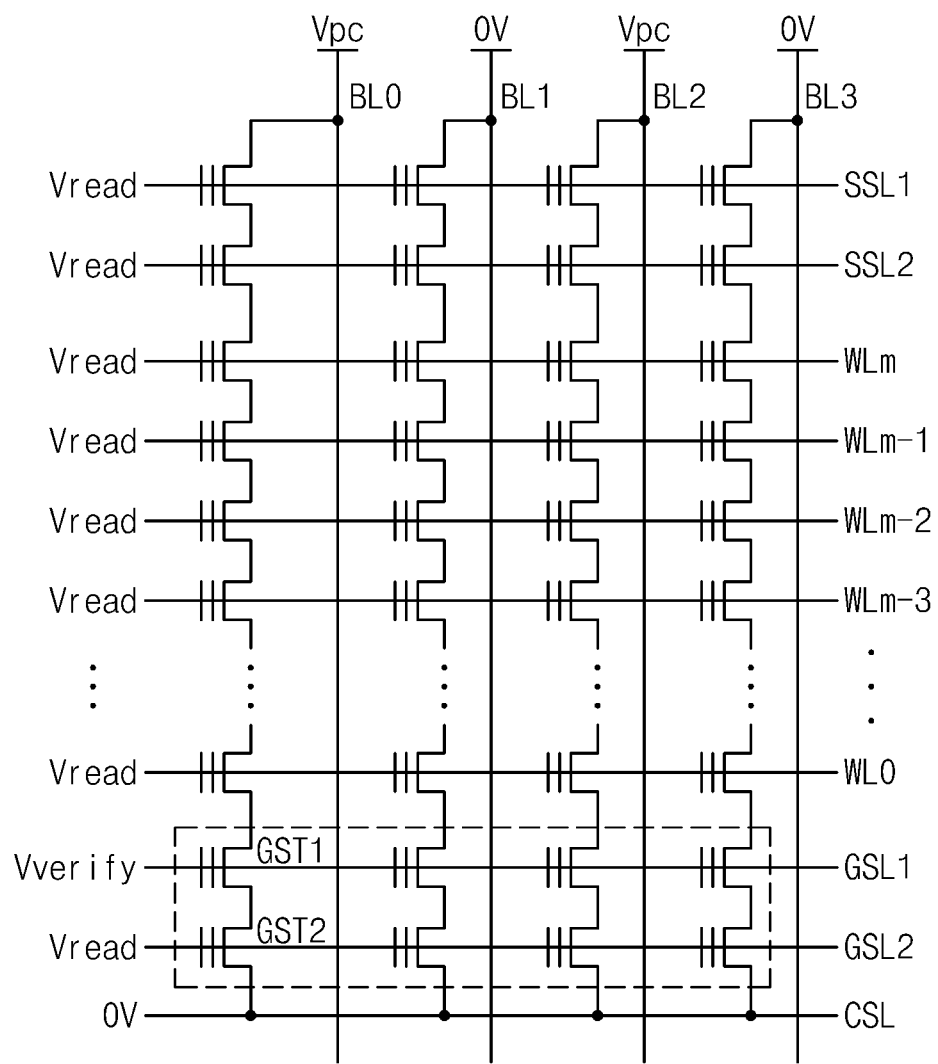
FIG. 12 is a diagram illustrating a verification operation for verifying a selection transistor programming operation in FIG. 3 according to example embodiments of inventive concepts.

FIG. 12 is a diagram illustrating a verification operation for verifying a selection transistor programming operation in FIG. 3 according to example embodiments of inventive concepts. Referring to FIG. 4, at a verification operation, a programmed string selection transistor SST may be verified using a verification voltage Vverify.

A ground selection transistor may be verified under the following bias condition. In FIG. 12, there may be exemplarily illustrated an example that string selection transistors corresponding to even-numbered bit lines BL0 and BL2 are verified. A pre-charge voltage Vpc may be provided to the even-numbered bit lines BL0 and BL2, and a voltage of 0V may be provided to odd-numbered bit lines BL1 and BL3. A read pass voltage Vread may be provided to a first string selection line SSL1, a second string selection line SSL2, a second ground selection line GSL2, and word lines WL0 to WLm, a verification voltage Vverify may be provided to a first ground selection line GSL1, and a voltage of 0V may be provided to a common source line CSL.

Although not shown in FIG. 12, a verification bias condition of string selection transistors corresponding to the odd-numbered bit lines BL1 and BL3 may be equal to the above-described bias condition except that the pre-charge voltage Vpc is provided to the odd-numbered bit lines BL1 and BL3, and the voltage of 0V is provided to even-numbered bit lines BL0 and BL2.

With the above description, only programmed ground transistors may be verified at a verification operation.

Figure 13:
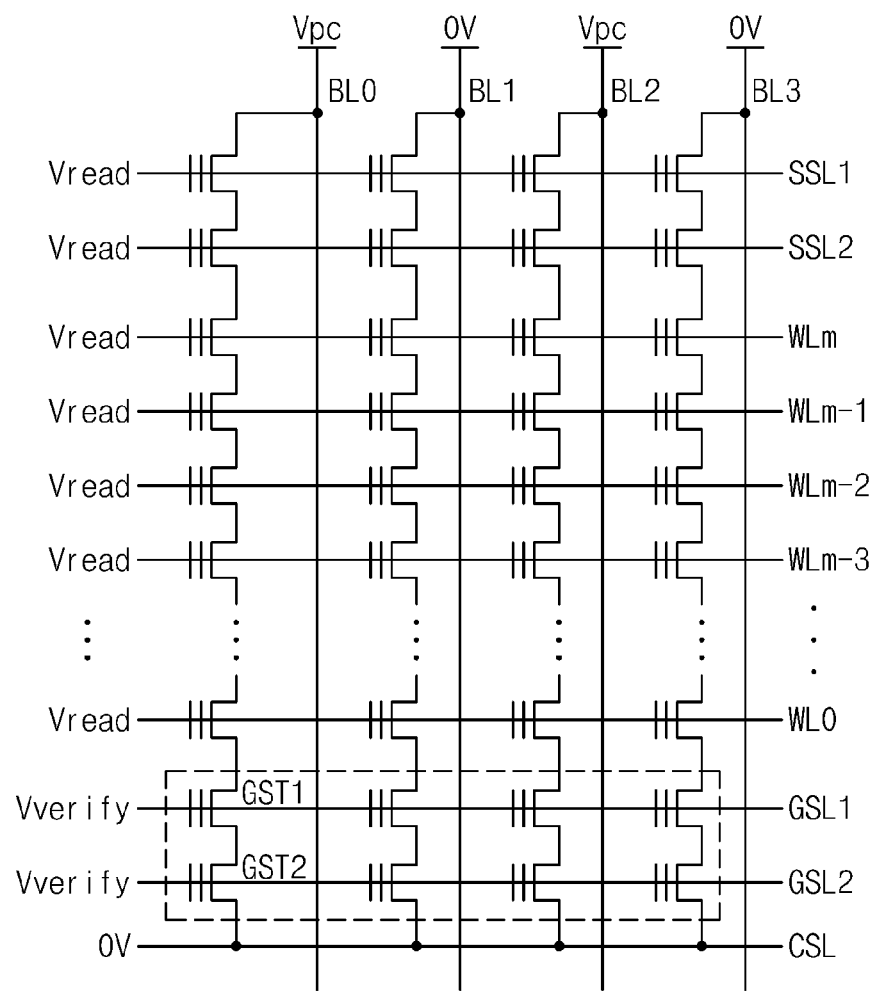
FIG. 13 is a diagram illustrating a verification operation for verifying a selection transistor programming operation in FIG. 11 according to example embodiments of inventive concepts.

FIG. 13 is a diagram illustrating a verification operation for verifying a selection transistor programming operation in FIG. 11 according to example embodiments of inventive concepts. Referring to FIG. 13, at a verification operation, a programmed ground selection transistor GST1 and an un-programmed ground selection transistor GST2 may be verified using a verification voltage Vverify.

Ground selection transistors may be verified under the following bias condition. In FIG. 13, there may be exemplarily illustrated an example that string selection transistors corresponding to even-numbered bit lines BL0 and BL2 are verified. A pre-charge voltage Vpc may be provided to the even-numbered bit lines BL0 and BL2, and a voltage of 0V may be provided to odd-numbered bit lines BL1 and BL3. A verification voltage Vverify may be provided to first and second ground selection lines GSL1 and GSL2, a read pass voltage Vread may be provided to word lines WL0 to WLm and string selection lines SSL1 and SSL2, and a voltage of 0V may be provided to a common source line CSL.

Although not shown in FIG. 13, a verification bias condition of ground selection transistors corresponding to the odd-numbered bit lines BL1 and BL3 may be equal to the above-described bias condition except that the pre-charge voltage Vpc is provided to the odd-numbered bit lines BL1 and BL3 and the voltage of 0V is provided to even-numbered bit lines BL0 and BL2.

In FIG. 13, a programmed ground selection transistor GST1 and an un-programmed ground selection transistor GST2 may be verified using the same verification voltage Vverify. However, example embodiments of inventive concepts are not limited thereto. For example, a programmed ground selection transistor GST1 and an un-programmed ground selection transistor GST2 can be verified using different verification voltages.

With the above description, both a programmed ground selection transistor GST1 and an un-programmed ground selection transistor GST2 may be verified.

A selection transistor programming method according to example embodiments of inventive concepts is applicable to a shared bit line structure that at least two strings are connected to one bit line.

Figure 14:
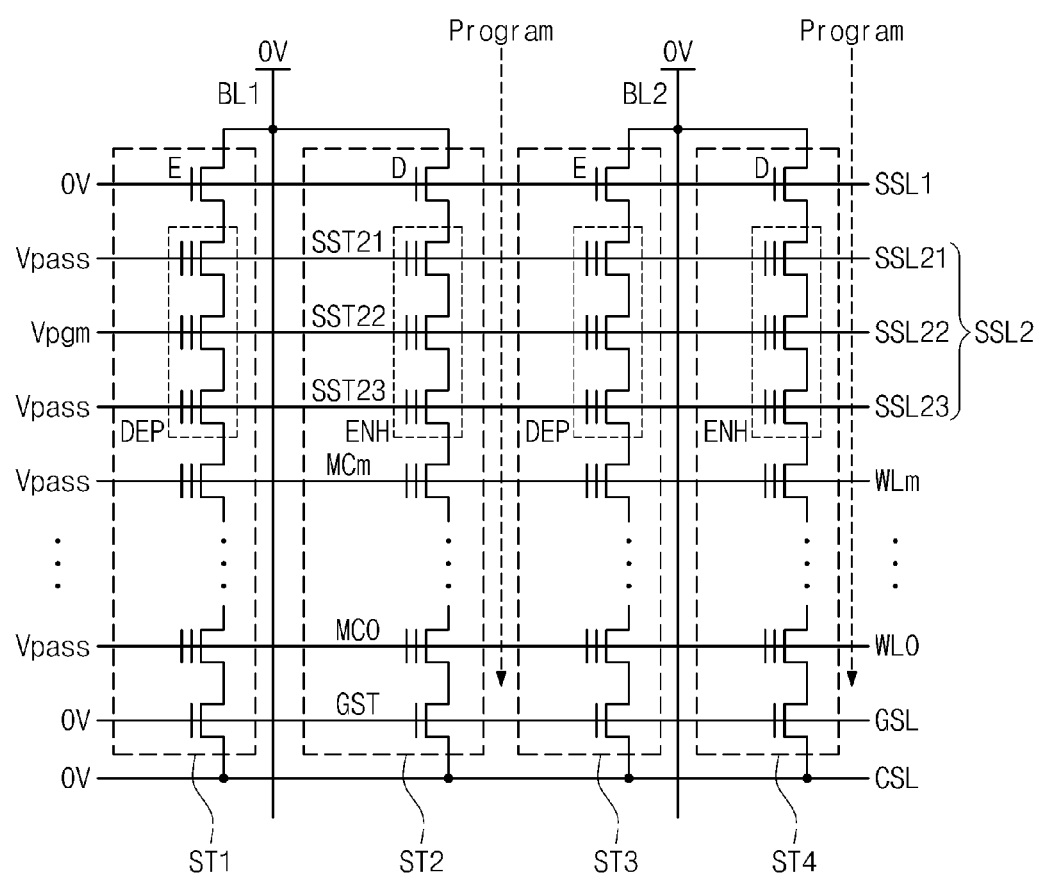
FIG. 14 is a diagram illustrating a selection transistor programming operation according to example embodiments of inventive concepts.

FIG. 14 is a diagram illustrating a selection transistor programming operation according to example embodiments of inventive concepts. First to fourth strings ST1 to ST4 may be illustrated in FIG. 14. The first string ST1 may have an enhancement type transistor E connected to a first bit line BL1 and a depletion type selection transistor DEP connected in series to the enhancement-type transistor E. The second string ST2 may have a depletion type transistor D connected to the first bit line BL1 and an enhancement type selection transistor ENH connected in series to the depletion type transistor D. The third string ST3 may have an enhancement type transistor E connected to a second bit line BL2 and a depletion type selection transistor DEP connected in series to the enhancement-type transistor E. The fourth string ST4 may have a depletion type transistor D connected to the second bit line BL2 and an enhancement type selection transistor ENH connected in series to the depletion type transistor D. In other words, an enhancement-type transistor E and a depletion type transistor D may be alternately connected to each of shared bit lines BL1 and BL2. Referring to FIG. 14, at least one string selection transistor SST22 constituting an enhancement type selection transistor ENH may be programmed for adjustment of a threshold voltage.

A string selection transistor may be programmed under the following bias condition. In FIG. 14, string selection transistors (e.g., SST22) connected in series to the depletion type transistor D, that is, corresponding to the second and fourth strings ST2 and ST4 are programmed. That is, one (e.g., SST22) of enhancement type selection transistors ENH may be programmed as follows.

A program voltage of 0V may be applied to the bit lines BL1 and BL2. As a voltage of 0V is applied to a first string selection line SSL1, the depletion type transistors D may be turned on and the enhancement type transistors E may be turned off. Thus, the second and fourth strings ST2 and ST4 may be selected, while the first and third strings ST1 and ST3 may be unselected.

A pass voltage Vpass may be applied to string selection lines SSL21 and SSL23 and word lines WL0 to WLm, a program voltage Vpgm may be applied to a string selection line SSL22, and a voltage of 0V may be applied to a ground selection line GSL and a common source line CSL. Programming of a string selection transistor (e.g., SST22) may be performed under the above-described bias condition.

In example embodiments, enhancement and depletion transistors E and D may be formed using an ion implantation manner. Alternatively, enhancement and depletion transistors E and D may be formed of at least one transistor identical to a memory cell.

In example embodiments, ground selection transistors (e.g., GST) may include an enhancement type transistor. Alternatively, ground selection transistors (e.g., GST) may be formed of at least one transistor identical to a memory cell. Herein, at least one transistor may be programmed for adjusting a threshold voltage.

In FIG. 14, each of the strings ST1 to ST4 may include one enhancement type transistor E or depletion type transistor D. However, example embodiments of inventive concepts are not limited thereto. For example, each of the strings ST1 to ST4 may include either at least two serially-connected enhancement type transistors or at least two serially-connected depletion type transistors.

In FIG. 14, an example is described where three string selection transistors SST21, SST22, and SST23 are connected in series to a second string selection line SSL2 and a string selection transistor (e.g., SST22) placed at the center is programmed. However, example embodiments of inventive concepts are not limited thereto. For example, at least one of string selection transistors in series to the second string selection line SSL2 can be programmed.

A selection transistor programming method according to example embodiments of inventive concepts may include selecting strings using a depletion type transistor and an enhancement type transistor E in a shared bit line structure and programming at least one selection transistor (e.g., SST22) corresponding to selected strings.

Figure 15:
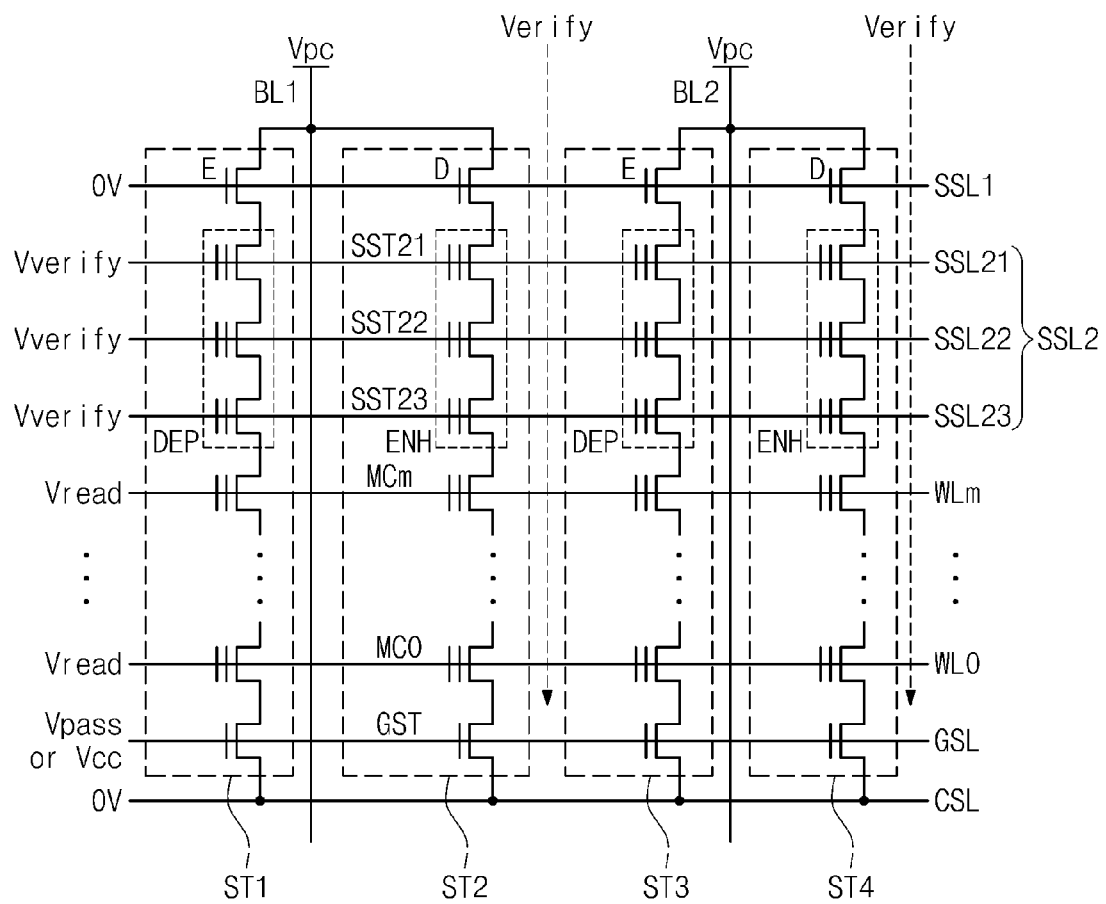
FIG. 15 is a diagram illustrating a verification operation for verifying a selection transistor programming operation in FIG. 14.

FIG. 15 is a diagram illustrating a verification operation for verifying a selection transistor programming operation in FIG. 14. Referring to FIG. 15, a programmed string selection transistor (e.g., SST22) connected to a second string selection line SSL2 may be verified using a verification voltage Vverify.

A bias condition for a verification operation of a string selection transistor may be as follows. In FIG. 15, there may be illustrated an example that programmed strings selection transistors (e.g., SST22) corresponding to second and fourth strings ST2 and ST4 are verified. A pre-charge voltage Vpc may be provided to bit lines BL1 and BL2. As a voltage of 0V is applied to a first string selection line SSL1, a depletion type transistor D may be turned on, and an enhancement type transistor E may be turned off. In this case, the pre-charge voltage Vpc may be provided to second and fourth strings ST2 and ST4 corresponding to the enhancement type transistor E.

A verification voltage Vverify may be provided to a second string selection line SSL2, a read pass voltage Vread may be provided to word lines WL0 to WLm, a power supply voltage Vcc may be provided to a ground selection line GSL, and a voltage of 0V may be applied to a common source line CSL. The string selection transistors (e.g., SST22) may be verified under the above-described bias condition.

Alternatively, according to example embodiments, a pass voltage Vpass can be provided to the ground selection line GSL at a verification operation of a string selection transistor.

With the verification operation of a string selection transistor, in a shared bit line structure, at least one programmed selection transistor SST22 may be verified using a verification voltage Vverify.

Figure 16:
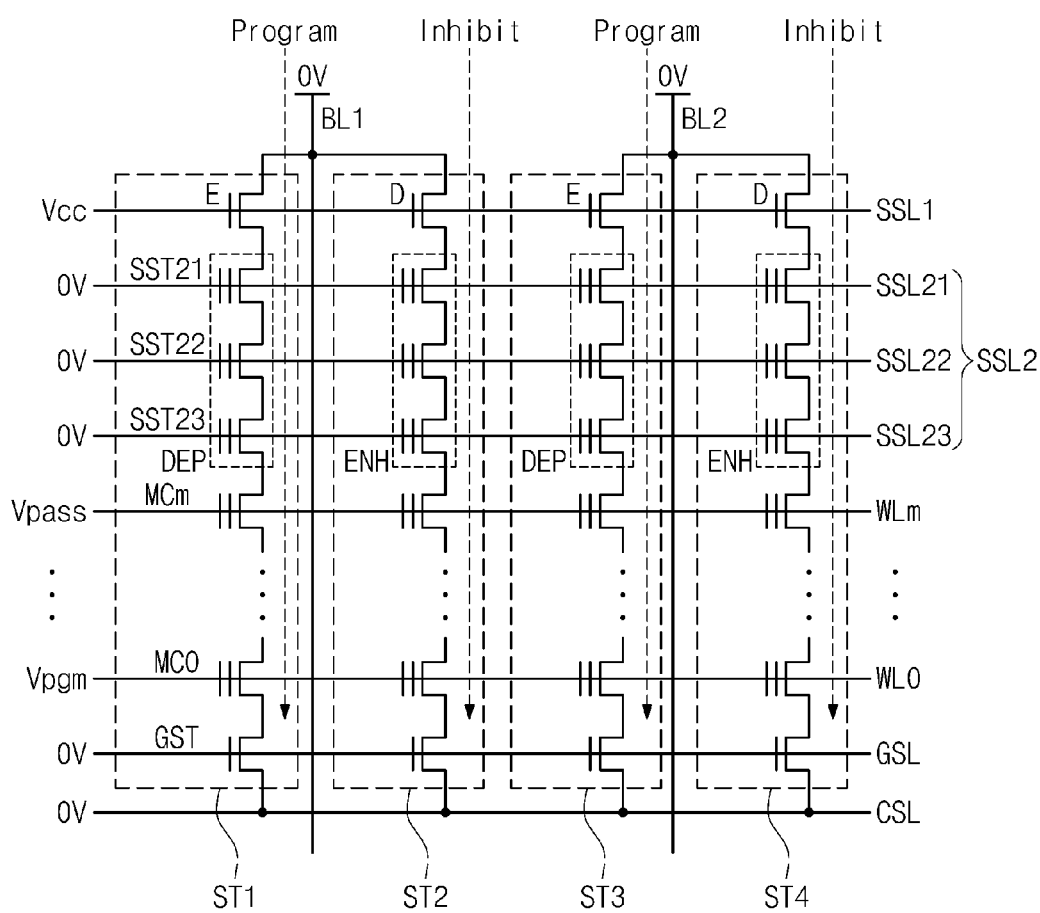
FIG. 16 is a diagram illustrating programming of a memory cell using a selection transistor programmed in FIG. 14.

FIG. 16 is a diagram illustrating programming of a memory cell using a selection transistor programmed in FIG. 14. Referring to FIG. 16, memory cells (e.g., MC0), connected to a first word line WL0, in first and third strings ST1 and ST3 may be programmed, and memory cells (e.g., MC0), connected to the first word line WL0, in second and fourth strings ST2 and ST4 may be program-inhibited.

A memory cell may be programmed under the following bias condition.

In FIG. 16, there may be illustrated an example that memory cells, connected to a first word line WL0, in first and third strings ST1 and ST3 are programmed. A program voltage of 0V may be provided to bit lines BL1 and BL2. When a power supply voltage is applied to a first string selection line SSL1, enhancement type transistors E may be turned on and depletion type transistors D may be turned off. Also, when a voltage of 0V is applied to second string selection lines SSL2 (SSL21 to SSL23), enhancement type transistors ENH may be turned off and depletion type selection transistors DEP may be turned on. In this case, first and third strings ST1 and ST3 may be selected, and second and fourth string ST2 and ST4 may be unselected.

A pass voltage Vpass may be provided to unselected word lines WL1 to WLm, a program voltage Vpgm may be applied to a selected word line WL0, and a voltage of 0V may be applied to a ground selection line GSL and a common source line CSL. Memory cells (e.g., MC0) may be programmed under the bias condition.

For a program-inhibition operation, channels of the second and fourth strings ST2 and ST4 may be boosted by providing a voltage of 0V to a programmed string selection transistor in the second and fourth strings ST2 and ST4. If a voltage of 0V is applied to depletion type selection transistors DEP in the first and third strings ST1 and ST3 for a simultaneous program operation, a bit line voltage may be transferred to channels of the second and fourth strings ST2 and ST4. The reason may be that threshold voltages of depletion type selection transistors DEP are smaller than 0V. As a result, memory cells corresponding to the second and fourth strings ST2 and ST4 can be programmed.

To reduce (and/or prevent) the program disturbance, a voltage of 0V may be applied to string selection lines SSL21 to SSL23 such that enhancement type selection transistors ENH connected to the second string selection line SSL2 (SSL21 to SSL23) block a leakage current. That is, a voltage of 0V may be provided to string selection transistors corresponding to unselected strings ST2 and ST4 to reduce the program disturbance.

Bias conditions of depletion type and enhancement type selection transistors DEP and ENH connected to the second string selection line SSL2 may be described to reduce the program disturbance. Although not shown, the program disturbance may be reduced by applying a similar bias condition to the case that transistors connected to the first string selection line SSL1 are depletion type and enhancement type selection transistors formed of a plurality of serially connected string selection transistors.

With the above description, strings may be selected using at least one programmed selection transistor SST22 in a shared bit line structure, and memory cells corresponding to selected strings may be programmed.

Figure 17:
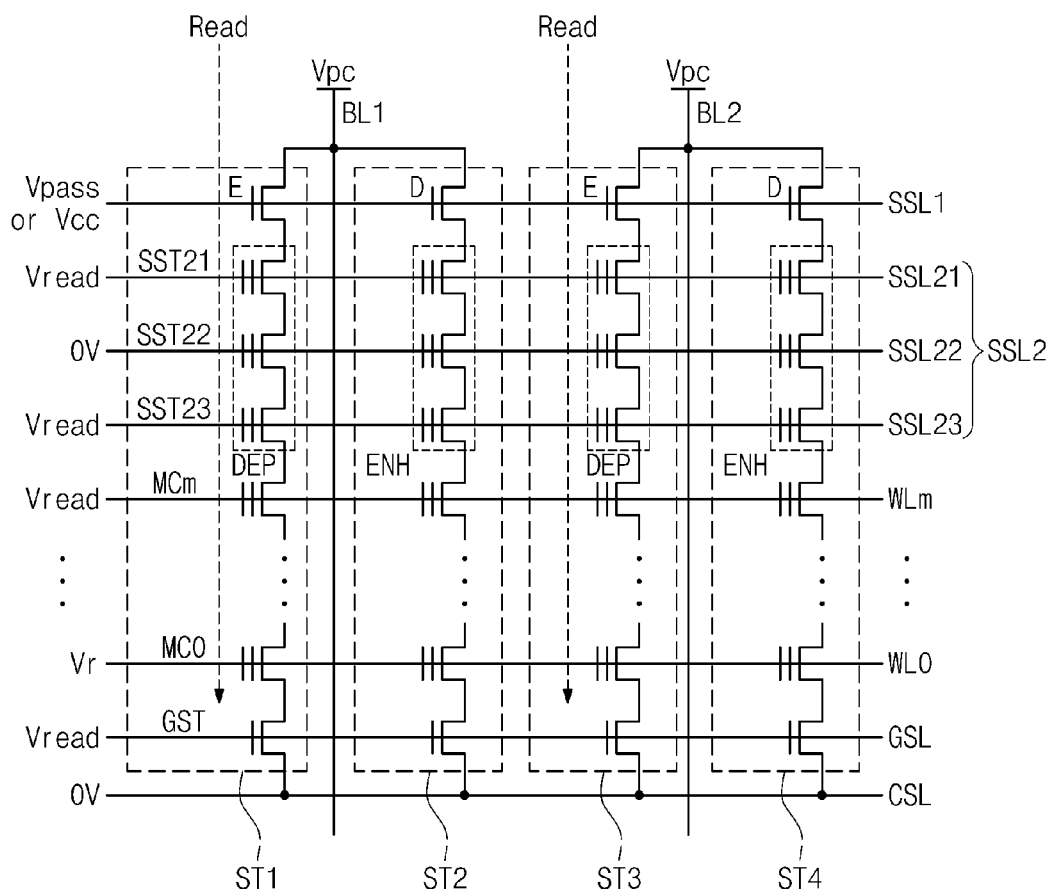
FIG. 17 is a diagram illustrating an operation of reading a memory cell using a selection transistor programmed in FIG. 14.

FIG. 17 is a diagram illustrating an operation of reading a memory cell using a selection transistor programmed in FIG. 14. Referring to FIG. 17, there may be read memory cells connected to a first word line WL0 among strings corresponding to enhancement type transistors E.

A memory cell may be read under the following bias condition.

A pre-charge voltage Vpc may be provided to bit lines BL1 and BL2. A power supply voltage (or, a pass voltage Vpass) may be applied to a first string selection line SSL1. At this time, enhancement type transistors E may be turned on and depletion type transistors D may be turned off. Also, a read pass voltage Vread may be applied to string selection lines SSL21 and SSL23 connected to unprogrammed string selection transistors and a voltage of 0V may be applied to a string selection line SSL22 connected to a programmed string selection transistor. At this time, depletion type selection transistors DEP may be turned on and enhancement type transistors ENH may be turned off. Thus, strings corresponding to memory cells (e.g., MC0) to be read may be selected.

A read pass voltage Vread may be applied to unselected word lines WL1 to WLm, a read voltage Vr may be applied to a selected word line WL0, a power supply voltage may be applied to a ground selection line GSL, and a voltage of 0V may be applied to a common source line CSL. Memory cells (e.g., MC0) may be read under the above-described bias condition.

As illustrated in FIG. 17, at a read operation, channel resistance of depletion type selection transistors DEP of selected strings may be reduced (and/or minimized) by providing a voltage of 0V to a string selection line SSL22 connected to a programmed string selection transistor SST22.

A bias condition for reading memory cells connected to a first word line WL0 among strings corresponding to depletion type transistors D may be identical to the above-described bias condition except that a voltage of 0V is applied to a first string selection line SSL1.

A read operation according to example embodiments of inventive concepts may include selecting strings using at least one programmed selection transistor SST23 and reading selected memory cells corresponding to the selected strings.

In FIG. 17, at a read operation, a read pass voltage applied to an unprogrammed string selection transistor may be equal to a read pass voltage provided to unselected memory cells. However, example embodiments of inventive concepts are not limited thereto. At a read operation, a read pass voltage applied to an unprogrammed string selection transistor may be different from a read pass voltage provided to unselected memory cells. For example, at a read operation, a read pass voltage applied to an unprogrammed string selection transistor may be lower than a read pass voltage provided to unselected memory cells.

Figure 18:
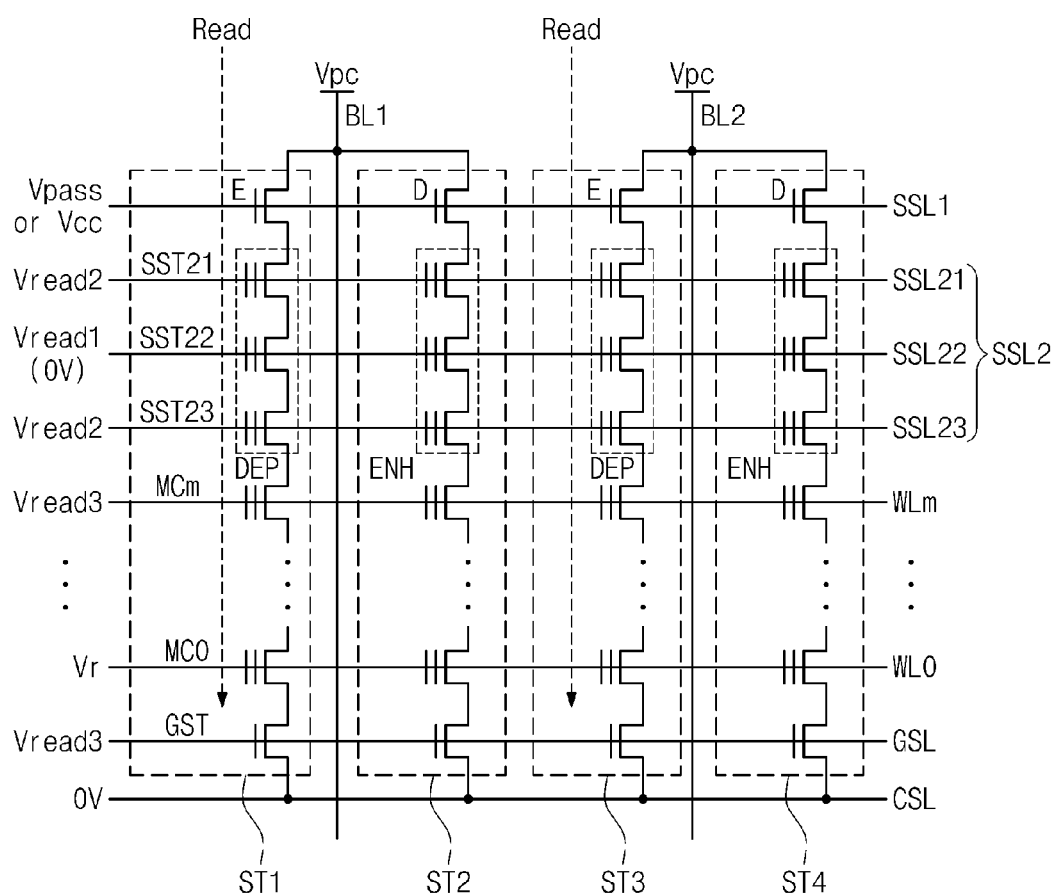
FIG. 18 is a diagram illustrating an operation of reading a memory cell using a selection transistor programmed in FIG. 14 according to example embodiments of inventive concepts.

FIG. 18 is a diagram illustrating an operation of reading a memory cell using a selection transistor programmed in FIG. 14 according to example embodiments of inventive concepts. Referring to FIG. 18, there may be read memory cells connected to a first word line WL0 among strings ST1 and ST3 corresponding to enhancement type transistors E.

A memory cell may be read under the following bias condition.

A pre-charge voltage Vpc may be provided to bit lines BL1 and BL2. A power supply voltage (or, a pass voltage Vpass) may be applied to a first string selection line SSL1.

At this time, enhancement type transistors E may be turned on and depletion type transistors D may be turned off. Also, a read pass voltage Vread may be applied to string selection lines SSL21 and SSL23 connected to unprogrammed string selection transistors and a first read pass voltage Vread1 (i.e., 0V) may be applied to a string selection line SSL22 connected to a programmed string selection transistor, and a second read pass voltage Vread2 may be provided to string selection lines SSL21 and SSL22 connected to unprogrammed string selection transistors. At this time, depletion type selection transistors DEP may be turned on and enhancement type transistors ENH may be turned off. Herein, the second read pass voltage Vread2 may be higher than the first read pass voltage Vread1. Thus, strings corresponding to memory cells (e.g., MC0) to be read may be selected.

A third read pass voltage Vread3 may be applied to unselected word lines WL1 to WLm, a read voltage Vr may be applied to a selected word line WL0, and a voltage of 0V may be applied to a ground selection line GSL and a common source line CSL. Herein, the third read pass voltage Vread3 may be higher than the second read pass voltage Vread2. Memory cells (e.g., MC0) may be read under the above-described bias condition.

At a read operation, blocking of a leakage current of a programmed string selection transistor corresponding to unselected strings may be accessorily improved blocked by providing the second read pass voltage Vread2, lower than the third read pass voltage Vread3, to at least one unprogrammed string selection transistor adjacent to the programmed string selection transistor.

Bias conditions for improving blocking of a leakage current may be described. Although not shown, blocking of a leakage current may be improved by applying a similar bias condition to the case that transistors connected to the first string selection line SSL1 are depletion type and enhancement type selection transistors formed of a plurality of serially connected string selection transistors.

In FIGS. 14 to 18, a programmed depletion type selection transistor DEP may be connected to an enhancement type transistor E formed by an ion implantation manner, and a programmed enhancement type selection transistor ENH may be connected to a depletion type transistor D formed by an ion implantation manner. However, example embodiments of inventive concepts are not limited thereto. Inventive concepts can be applied to the case that an enhancement type selection transistor is formed of an enhancement type transistor E formed by an ion implantation manner and a programmed selection transistor and the case that a depletion type selection transistor is formed of a depletion type transistor D formed by an ion implantation manner and a programmed selection transistor.

Figure 19:
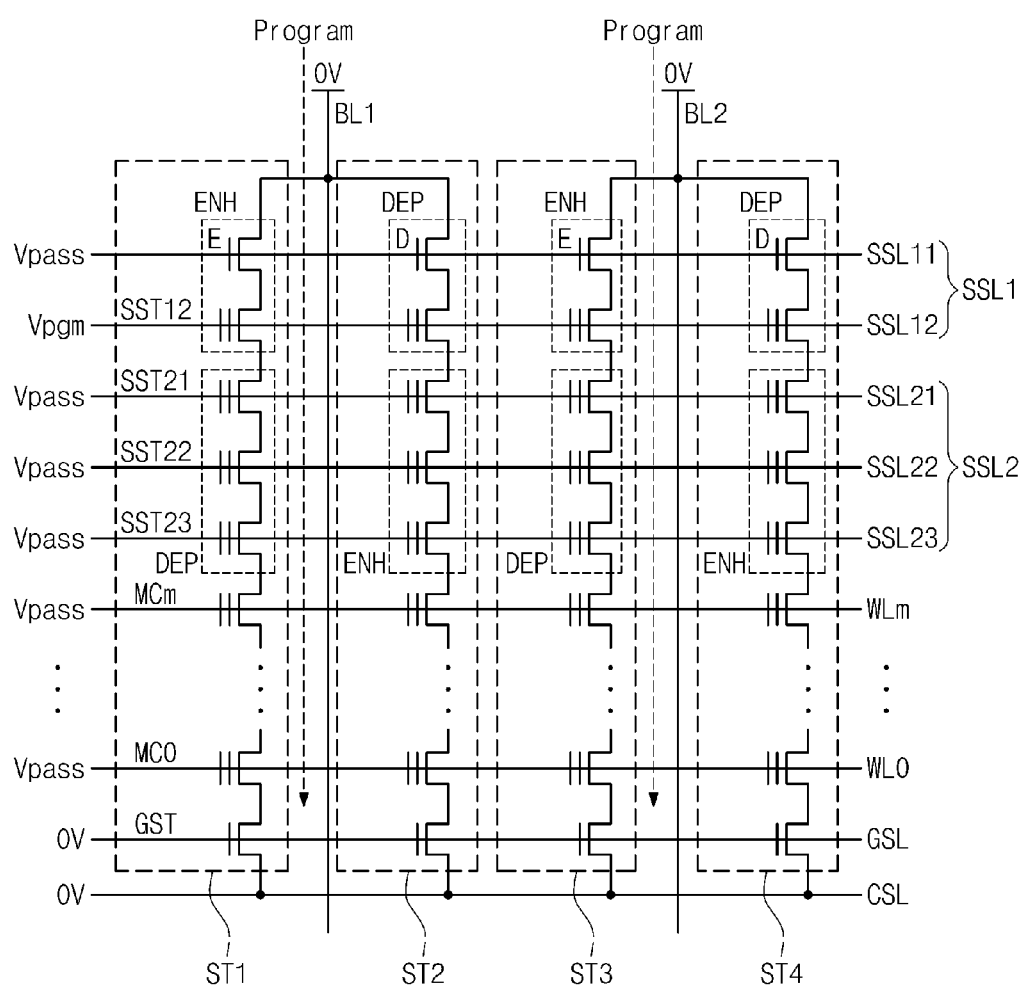
FIG. 19 is a diagram illustrating a selection transistor programming operation according to example embodiments of inventive concepts.

FIG. 19 is a diagram illustrating a selection transistor programming operation according to example embodiments of inventive concepts. Referring to FIG. 19, to implement enhancement type selection transistors ENH connected to bit lines BL1 and BL2, string selection transistor (e.g., SST12) connected to enhancement type transistors E may be programmed for adjustment of a threshold voltage.

A string selection transistor may be programmed under the following bias condition.

A program voltage of 0V may be applied to the bit lines BL1 and BL2. As a pass voltage Vpass (or a power supply voltage) is applied to a string selection line SSL1, depletion type transistors D may be turned off and enhancement type transistors E may be turned on. Thus, channels of strings including the enhancement type transistors E may be connected with the bit lines BL1 and BL2.

A pass voltage Vpass may be applied to a second string selection line SSL2 (SSL21 to SSL23) and word lines WL0 to WLm, a program voltage Vpgm may be applied to a string selection line SSL12 connected to string selection transistor (e.g., SST12) to be programmed, and a voltage of 0V may be applied to a ground selection line GSL and a common source line CSL. Programming of a string selection transistor (e.g., SST12) may be performed under the above-described bias condition.

In example embodiments, enhancement and depletion transistors E and D may be formed using an ion implantation manner.

In FIG. 19, there may be illustrated a string selection transistor SST12 programmed to form enhancement type selection transistors ENH having an enhancement type transistor E. However, example embodiments of inventive concepts are not limited thereto. For example, according to example embodiments of inventive concepts, at least two string selection transistors may be provided to form enhancement type selection transistors ENH having an enhancement type transistor E, where at least one of the at least two string selection transistors is programmed.

In example embodiments, ground selection transistors (e.g., GST) may include an enhancement type transistor. Alternatively, ground selection transistors (e.g., GST) may be formed of at least one transistor identical to a memory cell.

With the above-described program operation, at least one string selection transistor (e.g., SST12) connected in series to transistors D and E formed by an ion implantation manner may be programmed to form selection transistors ENH and DEP connected to bit lines.

Figure 20:
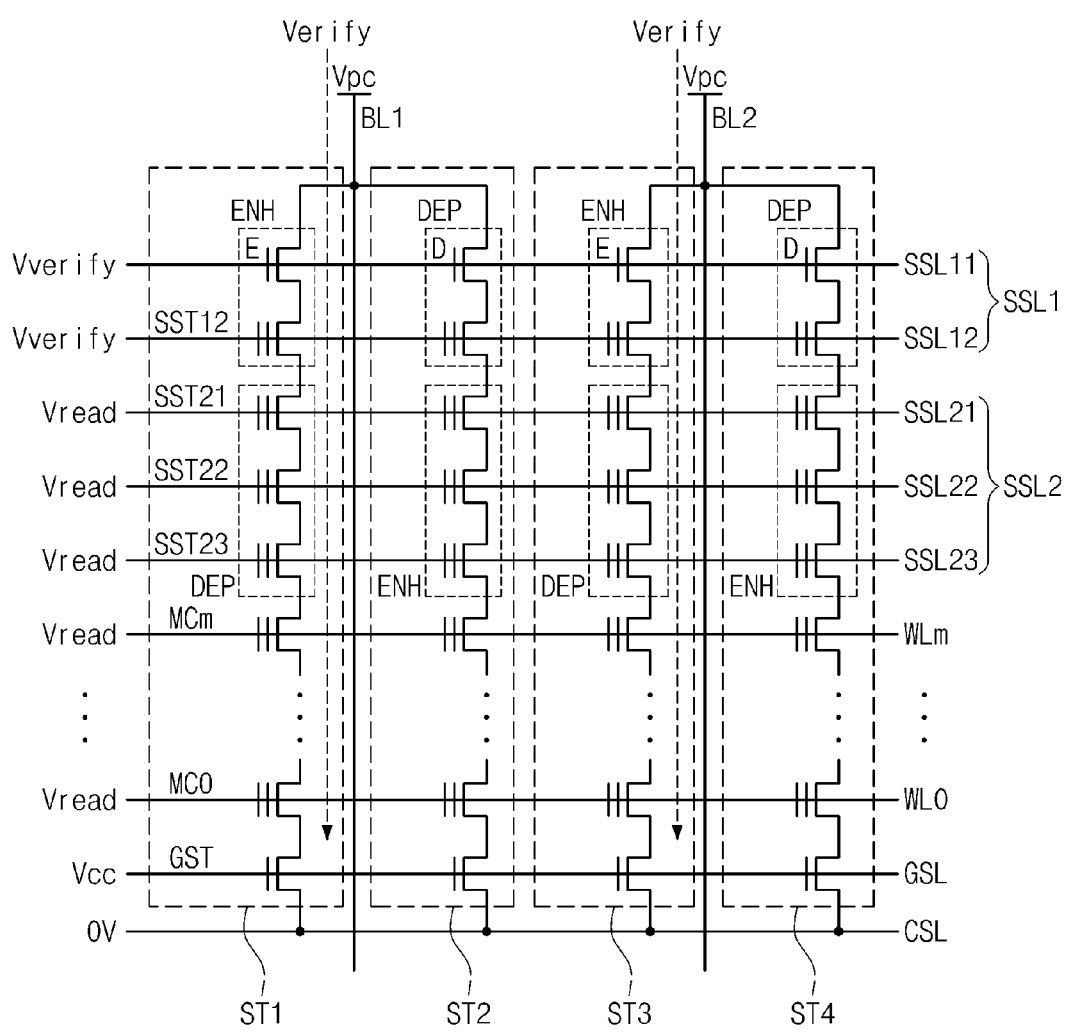
FIG. 20 is a diagram illustrating a verification operation for verifying a selection transistor programming operation in FIG. 19.

FIG. 20 is a diagram illustrating a verification operation for verifying a selection transistor programming operation in FIG. 19. Referring to FIG. 19, a programmed string selection transistor (e.g., SST22) connected to a first string selection line SSL1 may be verified using a verification voltage Vverify.

A bias condition for a verification operation of a string selection transistor may be as follows. In FIG. 20, there may be illustrated an example that strings selection transistors corresponding to enhancement type selection transistors ENH connected to bit lines BL1 and BL2 are verified. A pre-charge voltage Vpc may be provided to the bit lines BL1 and BL2. As a verification voltage Vverify (or, a power supply voltage) is applied to a first string selection line SSL11, a depletion type transistor D may be turned off, and an enhancement type transistor E may be turned on. In this case, the pre-charge voltage Vpc may be provided to a string including the enhancement type transistor E.

A verification voltage Vverify may be provided to a string selection line SSL12 connected with programmed string selection transistors (e.g., SST12), a read pass voltage Vread may be provided to word lines WL0 to WLm and a second string selection line SSL2, a power supply voltage may be provided to a ground selection line GSL, and a voltage of 0V may be applied to a common source line CSL. The string selection transistors (e.g., SST12) may be verified under the above-described bias condition.

With the verification operation of a string selection transistor, at least one programmed selection transistor for selecting a string in a shared bit line structure may be verified using a verification voltage Vverify.

Figure 21:
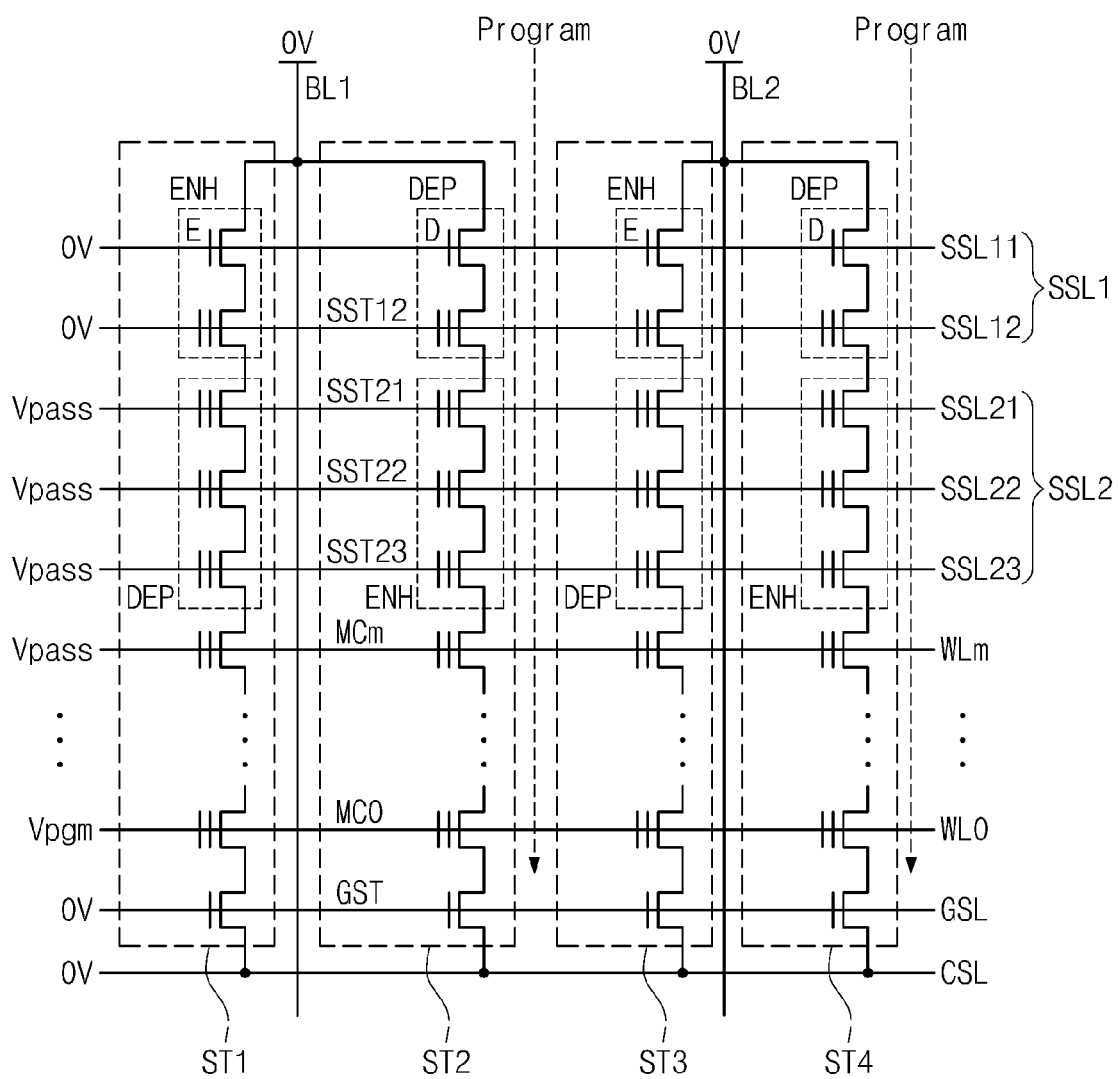
FIG. 21 is a diagram illustrating programming of a memory cell using a selection transistor programmed in FIG. 19.

FIG. 21 is a diagram illustrating programming of a memory cell using a selection transistor programmed in FIG. 19. Referring to FIG. 21, memory cells (e.g., MC0), connected to a first word line WL0, among strings corresponding to depletion type selection transistors DEP connected to bit lines BL1 and BL2 may be programmed.

A memory cell may be programmed under the following bias condition.

As a program voltage of 0V may be provided to the bit lines BL1 and BL2 and a voltage of 0V may be applied to a first string selection line SSL1, enhancement type selection transistors ENH may be turned off and depletion type selection transistors DEP may be turned on. Also, when a pass voltage is applied to a second string selection line SSL2, enhancement type selection transistors ENH connected to the second string selection line SSL2 may be turned on and depletion type selection transistors DEP connected to the second string selection line SSL2 may be turned off. In this case, strings corresponding to memory cells (e.g., MC0) to be programmed may be selected.

A pass voltage Vpass may be provided to unselected word lines WL1 to WLm, a program voltage Vpgm may be applied to a selected word line WL0, and a voltage of 0V may be applied to a ground selection line GSL and a common source line CSL. Memory cells (e.g., MC0) in selected strings may be programmed under the bias condition.

A program bias condition of memory cells connected to a first word line WL0 among strings corresponding to the enhancement type selection transistors ENH may be equal to the above-described bias condition except that a power supply voltage is applied to a first string selection line SSL1 and a voltage of 0V is applied to a second string selection line SSL2.

A memory cell programming operation according to example embodiments of inventive concepts may set a bias condition of at least one programmed selection transistor SST12 for selecting a string in a shared bit line structure.

Figure 22:
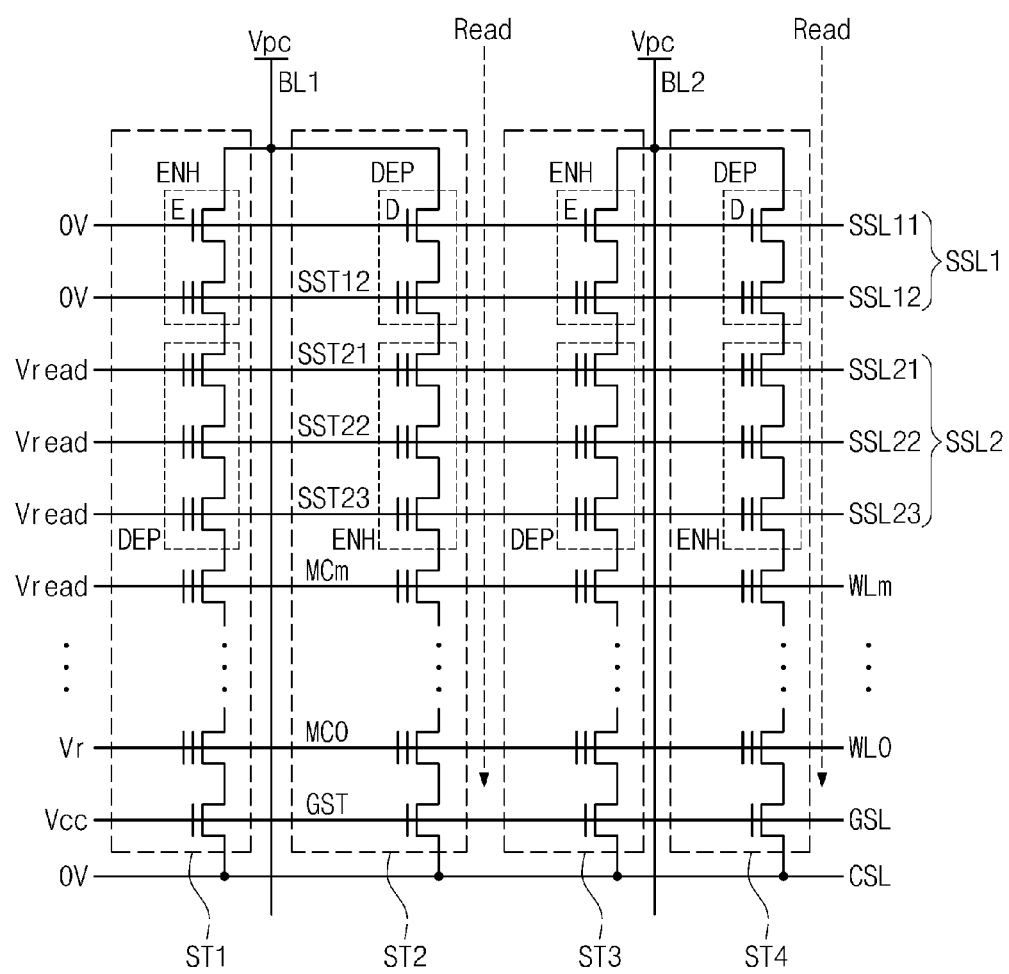
FIG. 22 is a diagram illustrating an operation of reading a memory cell using a selection transistor programmed in FIG. 19.

FIG. 22 is a diagram illustrating an operation of reading a memory cell using a selection transistor programmed in FIG. 19. Referring to FIG. 22, there may be read memory cells connected to a first word line WL0 among strings corresponding to depletion type selection transistors DEP connected with bit lines BL1 and BL2.

A memory cell may be read under the following bias condition.

In FIG. 22, there may be illustrated an example that there are read memory cells connected to the first word line WL0 among strings corresponding to depletion type selection transistors DEP. A pre-charge voltage Vpc may be provided to the bit lines BL1 and BL2. A voltage of 0V may be applied to a first string selection line SSL1 (SSL11 and SSL12). At this time, enhancement type selection transistors ENH may be turned off and depletion type selection transistors DEP may be turned on. Also, a read pass voltage Vread may be applied to a second string selection line SSL2 (SSL21 to SSL23), depletion type selection transistors DEP connected to the second string selection line SSL2 may be turned off and enhancement type transistors ENH connected to the second string selection line SSL2 may be turned on. Thus, strings corresponding to memory cells (e.g., MC0) to be read may be selected.

A read pass voltage Vread may be applied to unselected word lines WL1 to WLm, a read voltage Vr may be applied to a selected word line WL0, a power supply voltage may be provided to a ground selection line GSL, and a voltage of 0V may be applied to a common source line CSL. Memory cells (e.g., MC0) corresponding to selected strings may be read under the above-described bias condition.

Although not shown in FIG. 22, at a read operation, a read pass voltage provided to string selection lines SSL21 and SSL23 connected with unprogrammed string selection transistors may be lower than a read pass voltage applied to word lines connected with unselected memory cells.

A read bias condition of memory cells connected to the first word line WL0 among strings corresponding to enhancement type selection transistors ENH may be equal to the above-described bias condition except that a read pass voltage Vread (or, a power supply voltage) is applied to the first string selection line SSL1, a voltage of 0V is applied to a string selection line SSL22, and a read pass voltage is provided to the remaining string selection lines SSL21 and SSL23.

With the above description, a memory cell may be read using at least one programmed selection transistor SST12 for selecting a string in a shared bit line structure.

In FIGS. 19 to 22, transistors ENH or DEP for string selection in a shared bit line structure may include one transistor E or D formed by an ion implantation manner. However, example embodiments of inventive concepts are not limited thereto. Example embodiments of inventive concepts may be applied the case that transistors for string selection in a shared bit line structure include serially connected string selection transistors formed by an ion implantation manner.

Figure 23:
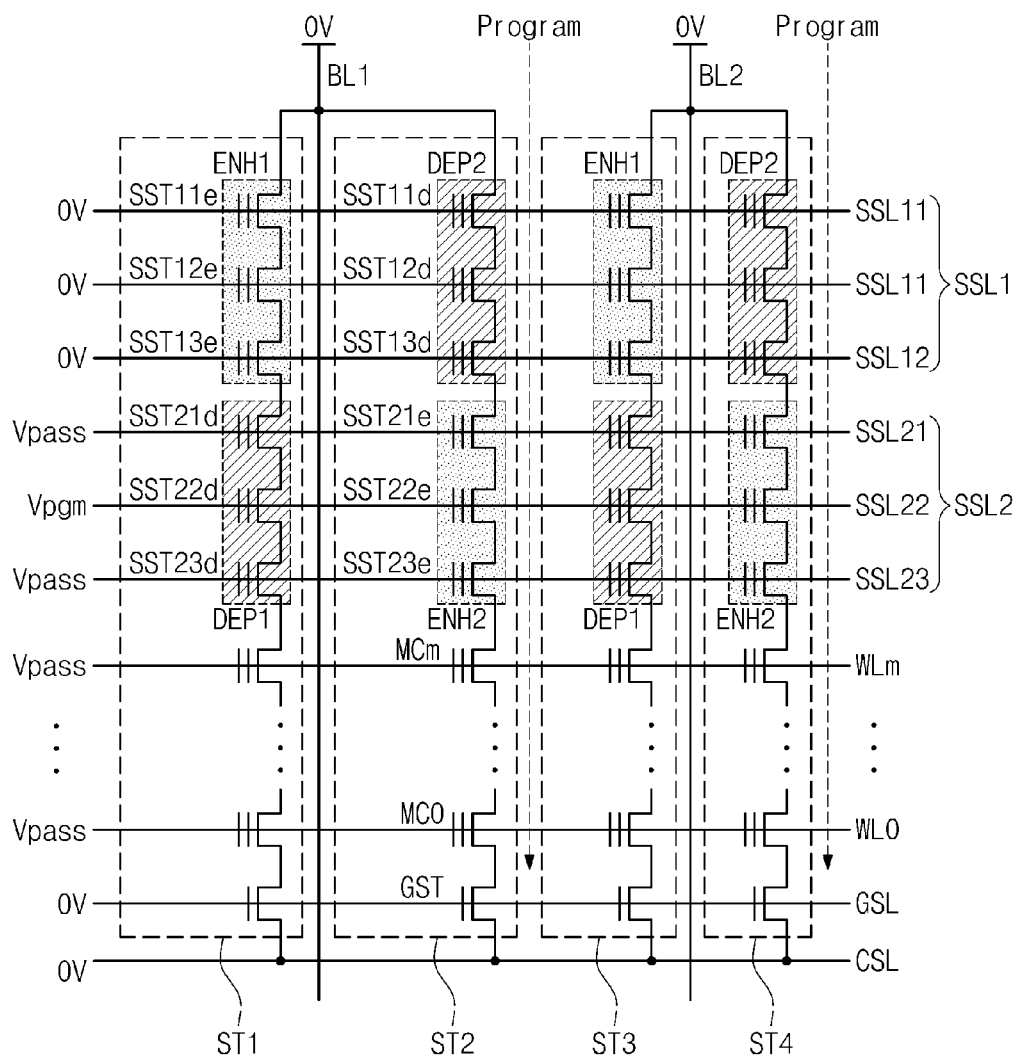
FIG. 23 is a diagram illustrating a selection transistor programming operation according to example embodiments of inventive concepts.

FIG. 23 is a diagram illustrating a selection transistor programming operation according to example embodiments of inventive concepts. Referring to FIG. 23, a first enhancement type selection transistor ENH1 and a second enhancement type selection transistor ENH2 may be connected in series, and a first depletion type selection transistor DEP1 and a second depletion type selection transistor DEP2 may be connected in series. Herein, the first enhancement type selection transistor ENH1 and the second enhancement type selection transistor ENH2 may include serially connected string selection transistors formed by an ion implantation manner, and the second enhancement type selection transistor ENH2 and the first depletion type selection transistor DEP1 may include at least one string selection transistor programmed for establishment of a threshold voltage.

As illustrated in FIG. 23, at a first string ST1, the first enhancement type selection transistor ENH1 may be formed of three serially-connected string selection transistors SST11e, SST12e, and SST13e, the first depletion type selection transistor DEP1 may be formed of three serially-connected string selection transistors SST21d, SST22d, and SST23d, the second depletion type selection transistor DEP2 may be formed of three serially-connected string selection transistors SST11d, SST12d, and SST13d, and the second enhancement type selection transistor ENH2 may be formed of three serially-connected string selection transistors SST21e, SST22e, and SST23e. Herein, the first enhancement type selection transistor ENH1 and the second depletion type selection transistor DEP2 may be formed by an ion implantation manner, and the second enhancement type selection transistor ENH2 and the first depletion type selection transistor DEP1 may be formed by programming string selection transistors (e.g., SST22e) connected with a string selection line SSL22 for setting of a threshold voltage.

A string selection transistor (e.g., SST22e) may be programmed under the following bias condition.

A program voltage of 0V may be applied to the bit lines BL1 and BL2. As a voltage of 0V is applied to a first string selection line SSL1, the first enhancement type selection transistor ENH1 may be turned off and the second depletion type selection transistor DEP2 may be turned on. Thus, strings ST2 and ST4 corresponding to string selection transistors SST22e to be programmed may be selected.

A pass voltage Vpass may be applied to string selection lines SSL21 and SSL23 and word lines WL0 to WLm, a program voltage Vpgm may be applied to a string selection line SSL22, and a voltage of 0V may be applied to a ground selection line GSL and a common source line CSL. Programming of string selection transistors (e.g., SST22e) corresponding to the selected strings ST2 and ST4 may be performed under the above-described bias condition.

In FIG. 23, each of the enhancement type selection transistors ENH1 and ENH2 and the depletion type selection transistors DEP1 and DEP2 may be formed of three serially-connected string selection transistors. However, example embodiments of inventive concepts are not limited thereto. For example, each of the enhancement type selection transistors ENH1 and ENH2 and the depletion type selection transistors DEP1 and DEP2 may include at least two serially-connected string selection transistors, and at least one string selection transistor may be programmed to form an enhancement type selection transistor.

With the above description, at least one selection transistor may be programmed to implement an enhancement type selection transistor ENH2 connected with a depletion type selection transistor DEP2 formed by an ion implantation manner in a shared bit line structure.

Figure 24:
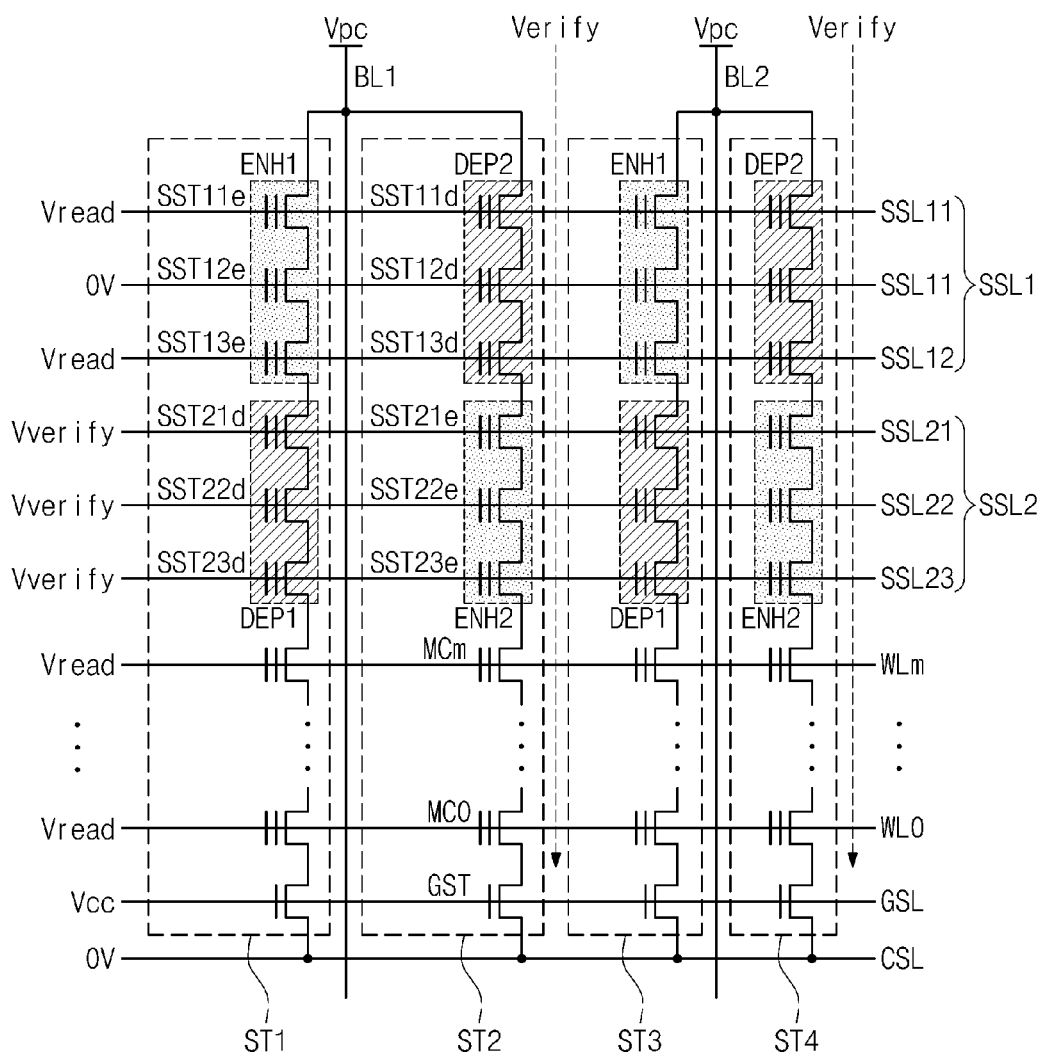
FIG. 24 is a diagram illustrating a verification operation for verifying a selection transistor programming operation in FIG. 23.

FIG. 24 is a diagram illustrating a verification operation for verifying a selection transistor programming operation in FIG. 23. Referring to FIG. 24, a programmed string selection transistor (e.g., SST22e) connected to a string selection line SSL22 may be verified using a verification voltage Vverify.

A bias condition for a verification operation of a string selection transistor may be as follows.

A pre-charge voltage Vpc may be provided to bit lines BL1 and BL2. As a first read pass voltage Vread1 is applied to string selection lines SSL11 and SSL13 and a voltage of 0V is applied to a string selection line SSL12, a first enhancement type selection transistor ENH1 may be turned off, and a second depletion type selection transistor DEP2 may be turned on.

A verification voltage Vverify may be provided to a second string selection line SSL2 (SSL21 to SSL23), a second read pass voltage Vread2 may be provided to word lines WL0 to WLm, a power supply voltage may be provided to a ground selection line GSL, and a voltage of 0V may be applied to a common source line CSL. String selection transistors (e.g., SST22e) corresponding to selected strings ST2 and ST4 may be verified under the above-described bias condition.

In example embodiments, the first read pass voltage Vread1 may be equal to the second read pass voltage Vread2.

Alternatively, the first read pass voltage Vread1 may be lower than the second read pass voltage Vread2. This may be to reduce a current leaked from unselected strings at a verification read operation.

With the above description, at least one programmed selection transistor SST22e forming an enhancement type selection transistors ENH2 in a shared bit line structure may be verified using a verification voltage Vverify.

Figure 25:
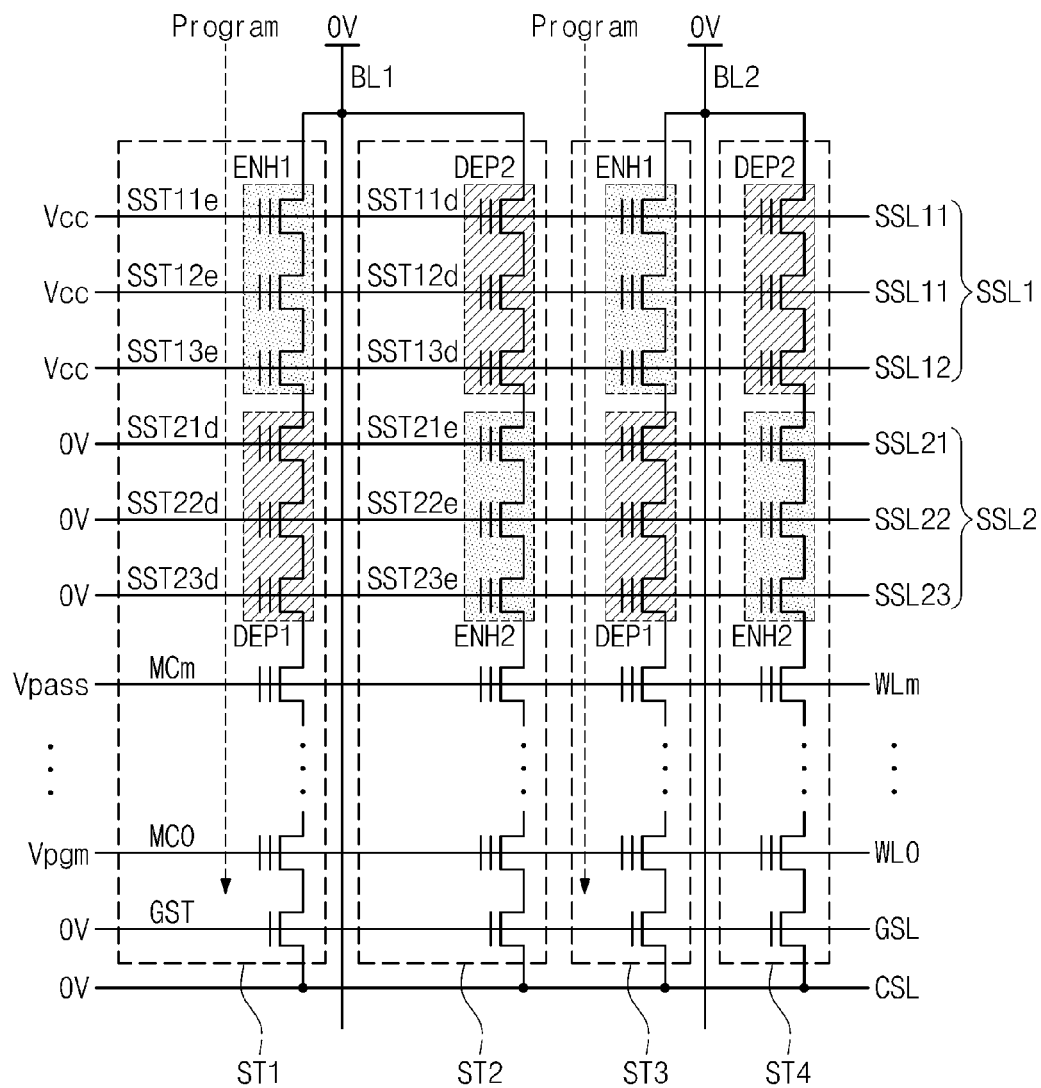
FIG. 25 is a diagram illustrating programming of a memory cell using a selection transistor programmed in FIG. 23.

FIG. 25 is a diagram illustrating programming of a memory cell using a selection transistor programmed in FIG. 23. Referring to FIG. 25, memory cells (e.g., MC0), connected to a first word line WL0, among strings corresponding to an enhancement type selection transistor ENH1 may be programmed.

A memory cell may be programmed under the following bias condition.

In FIG. 25, there may be illustrated an example that memory cells (e.g., MC0), connected to a first word line WL0, among strings corresponding to an enhancement type selection transistor ENH1 are programmed. A program voltage of 0V may be provided to bit lines BL1 and BL2.

When a power supply voltage is applied to a first string selection line SSL1 (SSL11 to SSL13), first enhancement type selection transistors (e.g., ENH1) may be turned on and second depletion type selection transistors (e.g., DEP2) may be turned off. Also, when a voltage of 0V is applied to a second string selection line SSL2 (SSL21 to SSL23), the second enhancement type selection transistors ENH2 may be turned off and the first depletion type selection transistors DEP1 may be turned on. In this case, first and third strings ST1 and ST3 corresponding to memory cells (e.g., MC0) to be programmed may be selected, while second and fourth string ST2 and ST4 may be unselected. Herein, at a program operation, a voltage of 0V may be provided to string selection lines SSL21, SSL22, and SSL23. The reason may be that the program disturbance is reduced (and/or prevented) through improvement of a leakage current characteristic of unselected strings ST2 and ST4.

A pass voltage Vpass may be provided to unselected word lines WL1 to WLm, a program voltage Vpgm may be applied to a selected word line WL0, and a voltage of 0V may be applied to a ground selection line GSL and a common source line CSL. Memory cells (e.g., MC0) corresponding to the selected strings ST1 and ST3 may be programmed under the bias condition.

With the above description, strings may be selected using at least one programmed selection transistor SST22e, and memory cells corresponding to selected strings may be programmed.

Figure 26:
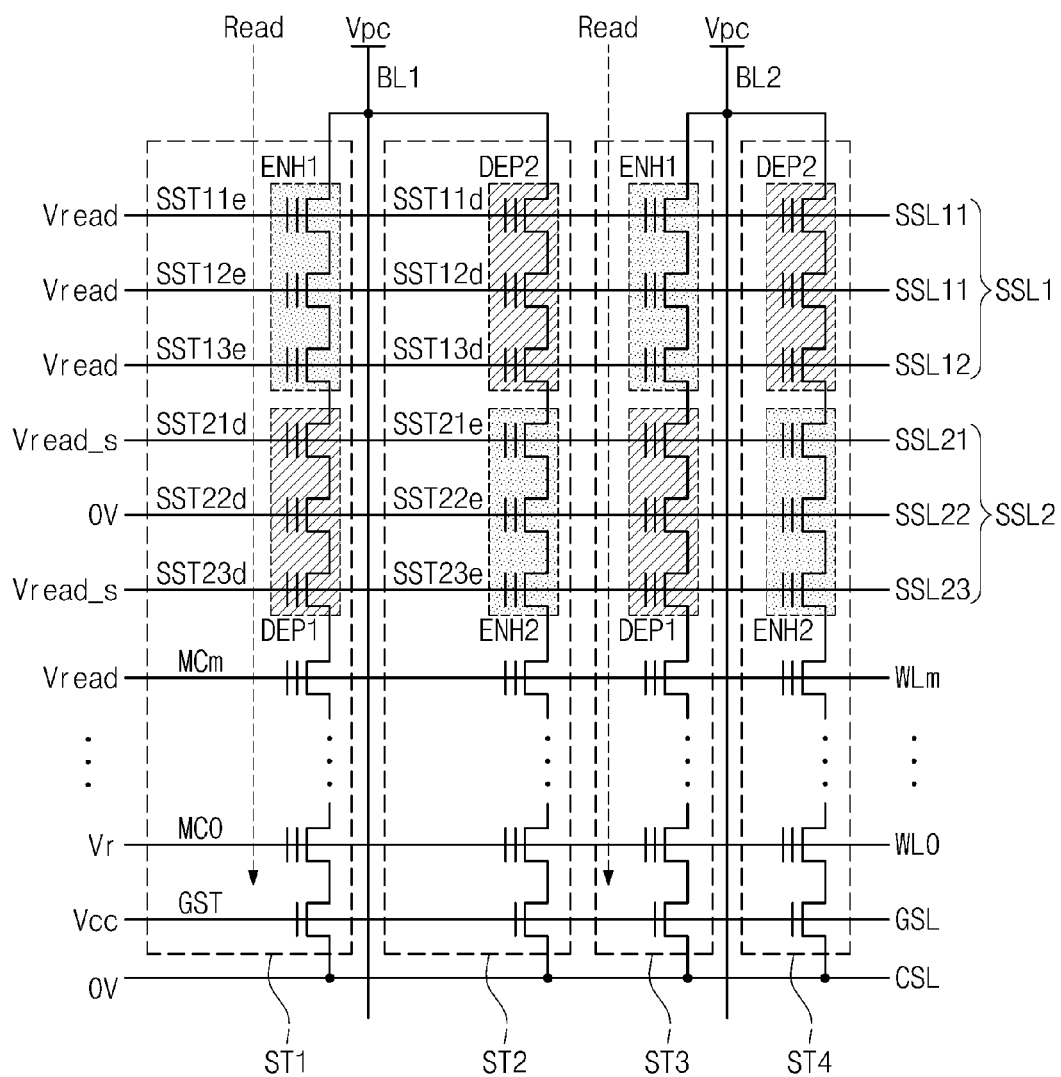
FIG. 26 is a diagram illustrating an operation of reading a memory cell using a selection transistor programmed in FIG. 23.

FIG. 26 is a diagram illustrating an operation of reading a memory cell using a selection transistor programmed in FIG. 23. Referring to FIG. 26, there may be read memory cells connected to a first word line WL0 among strings corresponding to enhancement type transistors ENH1.

A memory cell may be read under the following bias condition.

In FIG. 26, there may be illustrated an example that memory cells connected to a first word line WL0 among strings corresponding to enhancement type transistors ENH1 are read. A pre-charge voltage Vpc may be provided to bit lines BL1 and BL2. As a read pass voltage Vread is applied to a first string selection line SSL1 (SSL11 to SSL13), first enhancement type selection transistors ENH1 may be turned on and second depletion type selection transistors DEP2 may be turned off.

Also, a voltage of 0V may be applied to a string selection line SSL22 of a second string selection line SSL2 (SSL21 to SSL23) and a read pass voltage Vread_s may be applied to the remaining string selection lines SSL12 and SSL23. At this time, a first depletion type selection transistor DEP1 may be turned on. Thus, strings ST1 and ST3 corresponding to memory cells (e.g., MC0) to be read may be selected, and the remaining strings ST2 and ST4 may be unselected.

A read pass voltage Vread may be applied to unselected word lines WL1 to WLm, a read voltage Vr may be applied to a selected word line WL0, a voltage of 0V may be applied to a common source line CSL, and a power supply voltage may be applied to a ground selection line GSL. Memory cells (e.g., MC0) corresponding to the selected strings ST1 and ST2 may be read under the above-described bias condition.

At a read operation a read pass voltage Vread_s applied to unprogrammed selection transistors may be equal to a read pass voltage Vread provided to memory cells. Herein, the unprogrammed selection transistors may be transistors adjacent to a programmed selection transistor.

Alternatively, according to example embodiments, a read pass voltage Vread_s applied to unprogrammed selection transistors may be lower than a read pass voltage Vread provided to memory cells.

With the above description, strings may be selected using at least one programmed string selection transistor SST22e, and memory cells corresponding to selected strings may be read.

In FIGS. 3 to 26, one of at least two serially-connected selection transistors may be programmed. However, example embodiments of inventive concepts are not limited thereto. For example, at least two serially-connected selection transistors may be programmed to have different threshold voltages.

Figure 27:
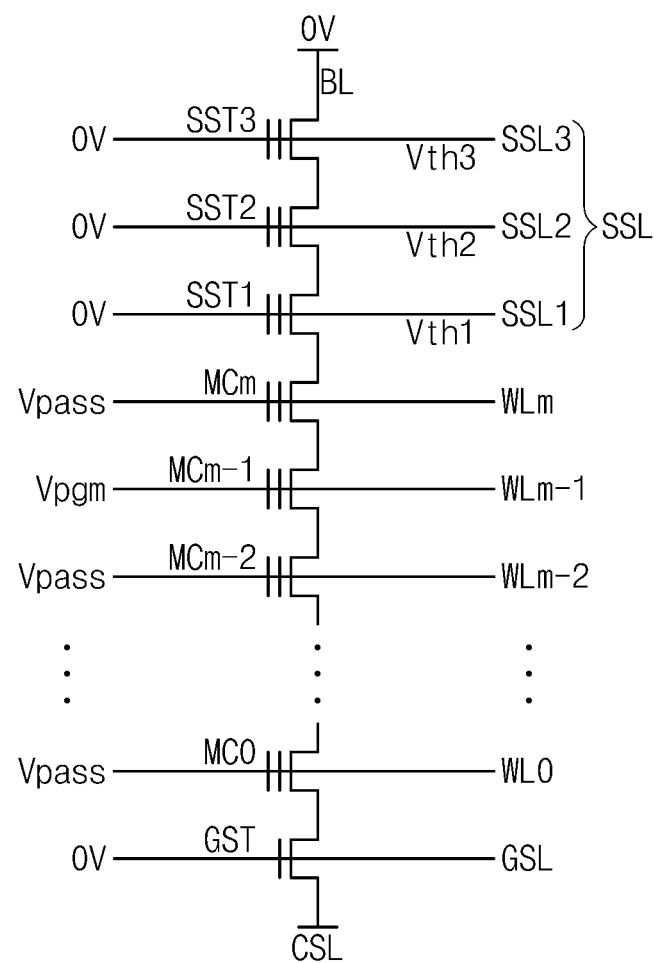
FIG. 27 is a diagram illustrating a selection transistor programming operation according to example embodiments of inventive concepts.

FIG. 27 is a diagram illustrating a selection transistor programming operation according to example embodiments of inventive concepts. Referring to FIG. 27, three serially-connected string transistors SST1, SST2, and SST3 for string selection each having the same structure as a memory cell may be programmed to have different threshold voltages Vth1, Vth2, and Vth3.

In example embodiments, the threshold voltages Vth1, Vth2, and Vth3 may be equal to or lower than a power supply voltage Vcc.

In example embodiments, a threshold voltage Vth1 of a string selection transistor SST1 closest to a memory cell MCm may be largest, and a threshold voltage Vth3 of a string selection transistor SST3 farthest from the memory cell MCm may be smallest. That is, the first threshold voltage Vth1 may be larger than the second threshold voltage Vth2, and the second threshold voltage Vth2 may be larger than the third threshold voltage Vth3. At this time, at a program operation, the threshold voltage Vth1 of the string selection transistor SST1 closest to a channel may become relatively highest upon channel boosting for program inhibition. For this reason, a leakage current may be reduced (and/or effectively prevented).

However, example embodiments of inventive concepts are not limited thereto. For example, according example embodiments, a threshold voltage Vth1 of a string selection transistor SST1 closest to a memory cell MCm may be smallest, and a threshold voltage Vth3 of a string selection transistor SST3 farthest from the memory cell MCm may be largest.

Below, for ease of description, a program bias condition of a memory cell MCm-1 connected with a word line WLm-1 will be described. A program voltage (e.g., 0V) may be provided to a bit line BL. A channel may be formed by proving a voltage of 0V to a string selection line SSL (SSL1 to SSL3). A program voltage Vpgm may be applied to a word line WLm-1 connected with a memory cell MCm-1 to be programmed, a pass voltage Vpass may be provided to the remaining word lines WL0 to WLm-2 and WLm, and a voltage of 0V may be applied to a ground selection line GSL and a common source line CSL.

In FIG. 27, there may be illustrated three serially-connected string selection transistors SST1, SST2, and SST3 having different threshold voltages Vth1, Vth2, and Vth3. However, example embodiments of inventive concepts are not limited thereto. According to example embodiments of inventive concepts, at least two serially-connected string selection transistors may have different threshold voltages.

In example embodiments, a ground selection transistor GST may include an enhancement type selection transistor.

Alternatively, according to example embodiments, a ground selection transistor GST may be formed of at least one transistor identical to a memory cell. Herein, at least one transistor may be programmed.

Alternatively, according to example embodiments, a ground selection transistor GST may include at least two serially-connected ground selection transistors programmed to have different threshold voltages.

With the above description, at least two serially-connected ground selection transistors may be programmed to have different threshold voltages.

Figure 28:
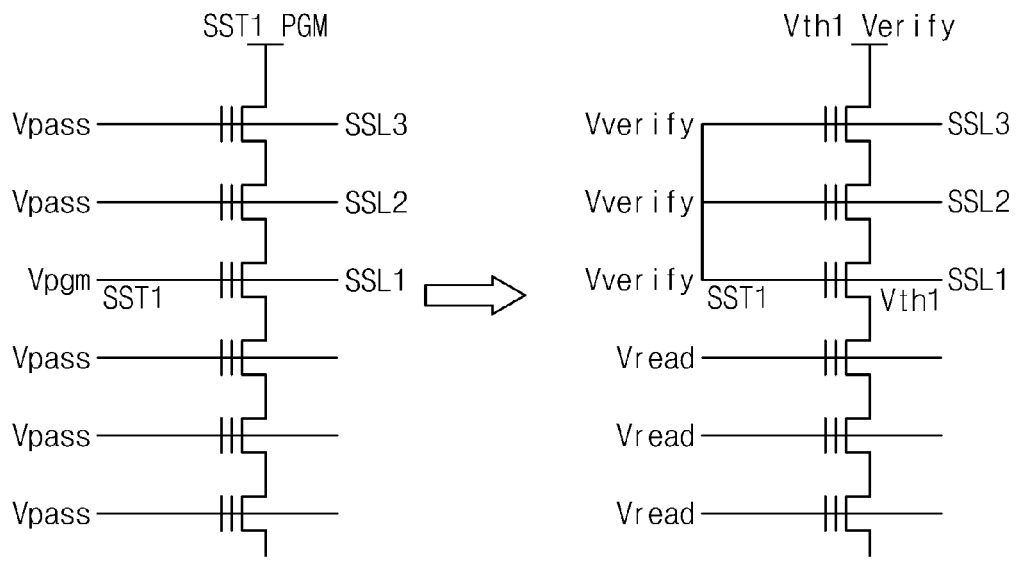
FIG. 28 is a diagram illustrating a program operation and a verification operation executed to set a first threshold voltage Vth1 in FIG. 27.

FIG. 28 is a diagram illustrating a program operation and a verification operation executed to set a first threshold voltage Vth1 in FIG. 27. Referring to FIG. 28, at a program operation, a first string selection transistor SST1 may be programmed by providing a program voltage Vpgm to a first string selection line SSL1. At a verification operation, the first string selection transistor SST1 may be verified by providing a verification voltage Vverify to string selection lines SSL1, SSL2, and SSL3. Herein, the verification voltage Vverify may be a first threshold voltage Vth1. That is, at a verification operation, if a threshold voltage of the first string selection transistor SST1 is larger than the first threshold voltage Vth1, a verification operation of the first string selection transistor SST1 may be verify-passed.

Figure 29:
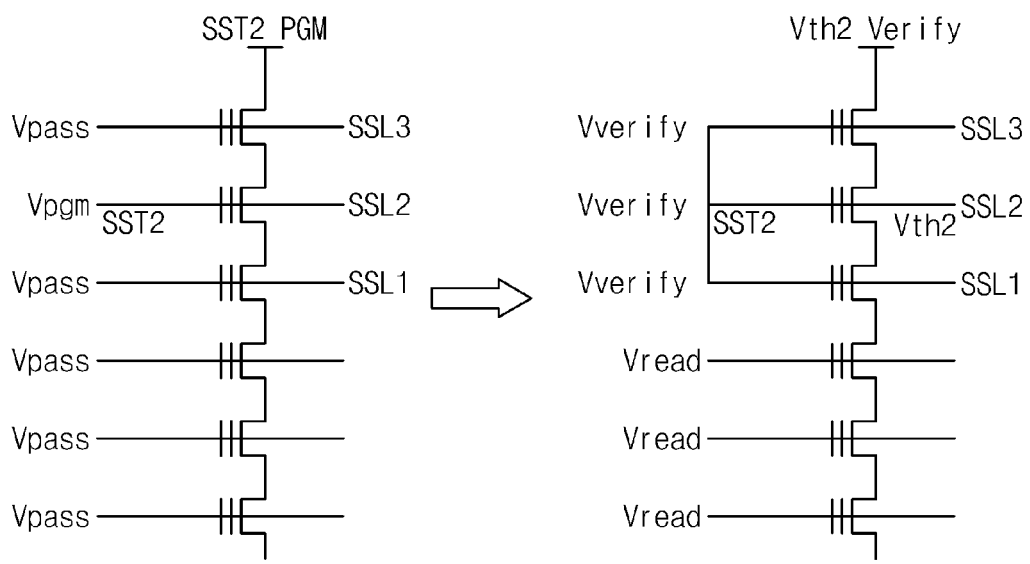
FIG. 29 is a diagram illustrating a program operation and a verification operation executed to set a second threshold voltage Vth2 in FIG. 27.

FIG. 29 is a diagram illustrating a program operation and a verification operation executed to set a second threshold voltage Vth2 in FIG. 27. Referring to FIG. 29, at a program operation, a second string selection transistor SST2 may be programmed by providing a program voltage Vpgm to a second string selection line SSL2. At a verification operation, the second string selection transistor SST2 may be verified by providing a verification voltage Vverify to string selection lines SSL1, SSL2, and SSL3. Herein, the verification voltage Vverify may be a second threshold voltage Vth2. That is, at a verification operation, if a threshold voltage of the second string selection transistor SST2 is larger than the second threshold voltage Vth2, a verification operation of the second string selection transistor SST2 may be verify-passed.

Figure 30:
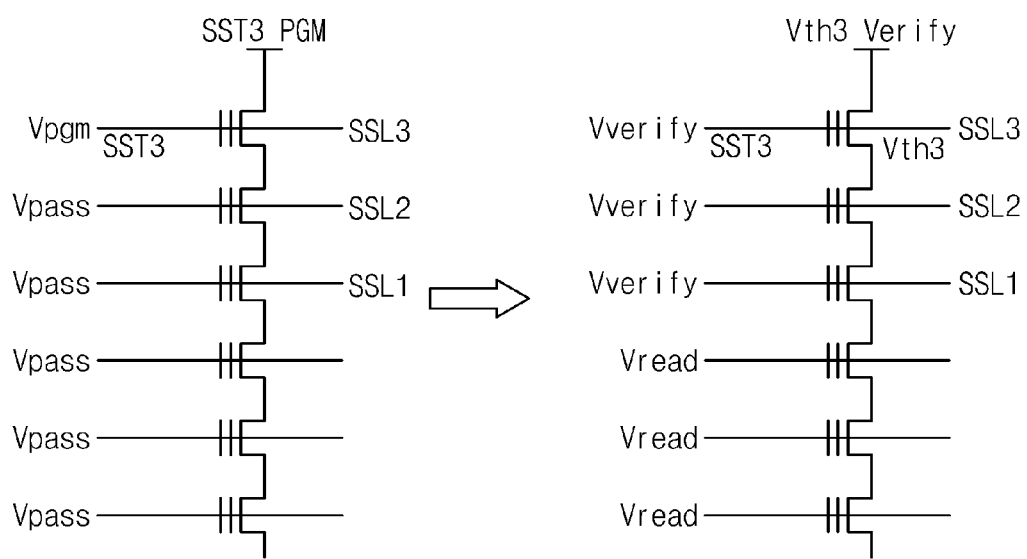
FIG. 30 is a diagram illustrating a program operation and a verification operation executed to set a third threshold voltage Vth3 in FIG. 27.

FIG. 30 is a diagram illustrating a program operation and a verification operation executed to set a third threshold voltage Vth3 in FIG. 27. Referring to FIG. 30, at a program operation, a third string selection transistor SST3 may be programmed by providing a program voltage Vpgm to a third string selection line SSL3. At a verification operation, the third string selection transistor SST3 may be verified by providing a verification voltage Vverify to string selection lines SSL1, SSL2, and SSL3. Herein, the verification voltage Vverify may be a third threshold voltage Vth3. That is, at a verification operation, if a threshold voltage of the third string selection transistor SST3 is larger than the third threshold voltage Vth3, a verification operation of the third string selection transistor SST3 may be verify-passed.

Figure 31:
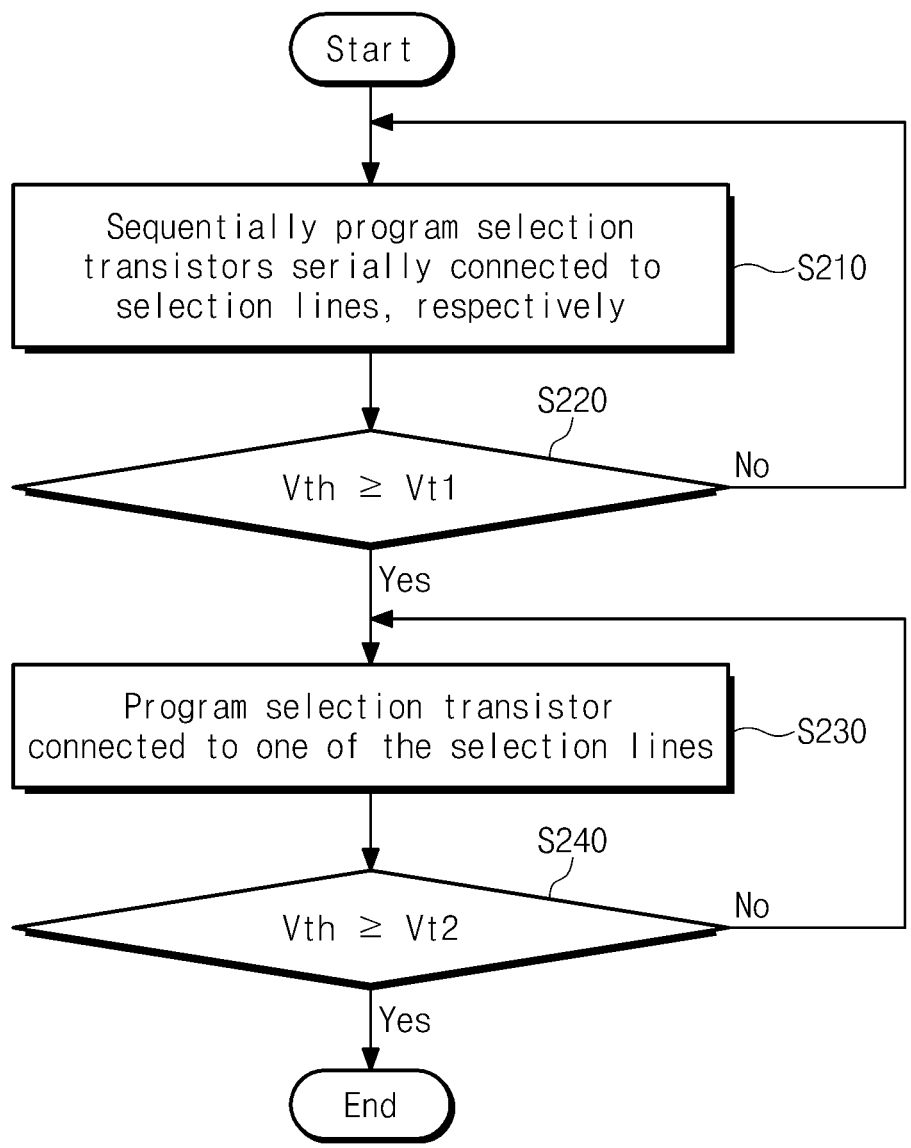
FIG. 31 is a flowchart illustrating a method of programming serially-connected selection transistors to have different threshold voltages.

FIG. 31 is a flowchart illustrating a method of programming serially-connected selection transistors to have different threshold voltages. For ease of description, a selection transistor programming method will be described with reference to a program operation illustrated in FIG. 27.

In operation S210, selection transistors SST1, SST2, and SST3 (refer to FIG. 26) connected to selection lines SSL1, SSL2, and SSL3 (refer to FIG. 26) may be programmed.

In operation S220, whether at least one of threshold voltages of programmed selection transistors SST1, SST2, and SST3 is equal to or larger than a first reference value Vt1 may be judged by providing a verification voltage Vverify having the first reference value Vt1 to the selection lines SSL1, SSL2, and SSL3. Herein, the first reference value Vt1 may be one of first to third threshold voltages Vth1 to Vth3.

If at least one of threshold voltages of programmed selection transistors SST1, SST2, and SST3 is judged not to be equal to or larger than a first reference value Vt1, the method proceeds to operation S210. If at least one of threshold voltages of programmed selection transistors SST1, SST2, and SST3 is judged to be equal to or larger than a first reference value Vt1, in operation S230, a selection transistor (e.g., SST2) connected to one of the selection lines SSL1, SSL2, and SSL3 may be programmed.

In operation S240, whether a threshold voltage of a programmed selection transistor SST2 is equal to or larger than a second reference value Vt2 may be judged. Herein, the second reference value Vt2 may be different from the first reference value Vt1, and may be one of the first to third threshold voltages Vth1 to Vth3.

If a threshold voltage of a programmed selection transistor SST2 is judged not to be equal to or larger than a second reference value Vt2, the method proceeds to operation S230. If a threshold voltage of a programmed selection transistor SST2 is judged to be equal to or larger than a second reference value Vt2, the method may be ended.

With the above-described program method, serially-connected selection transistors may be continuously selected and verified using different verification voltages.

A selection transistor programming method according to example embodiments of inventive concepts is applicable to a vertical NAND memory device.

Figure 32:
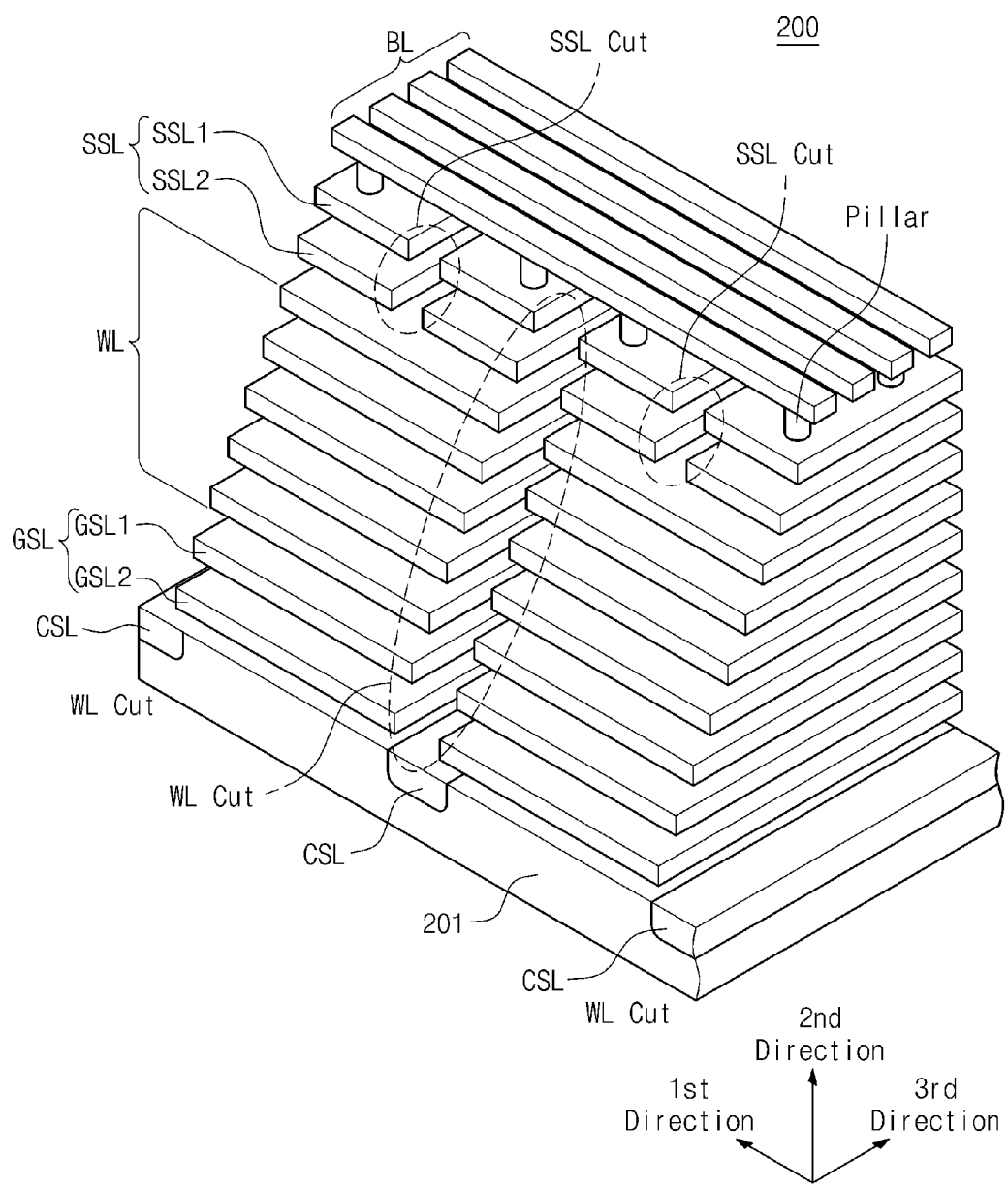
FIG. 32 is a diagram illustrating a memory block of a vertical NAND memory device according to example embodiments of inventive concepts.

FIG. 32 is a diagram illustrating a memory block of a vertical NAND memory device according to example embodiments of inventive concepts. Referring to FIG. 32, a memory block may be formed to have a merged word line structure. Two ground selection line GSL1 and GSL2, a plurality of word lines WL, and two string selection lines SSL1 and SSL2 may be stacked on a substrate 201 between word line cuts. The string selection lines SSL1 and SSL2 may be separated by a string selection line cut.

A plurality of pillars may penetrate the ground selection lines GSL1 and GSL2, the word lines, and the string selection lines SSL1 and SSL2. Herein, the ground selection lines GSL1 and GSL2, the word lines, and the string selection lines SSL1 and SSL2 may be formed to have a substrate shape. Further, bit lines may be connected with upper surfaces of the pillars.

In FIG. 32, string selection lines may be formed to have two substrate shapes. However, example embodiments of inventive concepts are not limited thereto. For example, string selection lines can be formed to have at least one substrate shape.

In FIG. 32, ground selection lines may be formed to have two substrate shapes. However, example embodiments of inventive concepts are not limited thereto. For example, ground selection lines can be formed to have at least one substrate shape.

A memory block 200 in FIG. 32 may have a merged word line structure. However, example embodiments of inventive concepts are not limited thereto. A detailed structure of a memory block of a vertical NAND (VNAND) memory device is disclosed in U.S. Patent Publication Nos. 2009/0310415, 2010/0078701, 2010/0117141, 2010/0140685, 2010/0213527, 2010/0224929, 2010/0315875, 2010/0322000, 2011/0013458, and 2011/0018036, the entire contents of which are hereby incorporated by references.

A selection transistor (a part of a pillar not shown) corresponding to at least one of selection lines SSL and GSL may be programmed to have a desired (and/or alternatively predetermined) threshold voltage.

Figure 33:
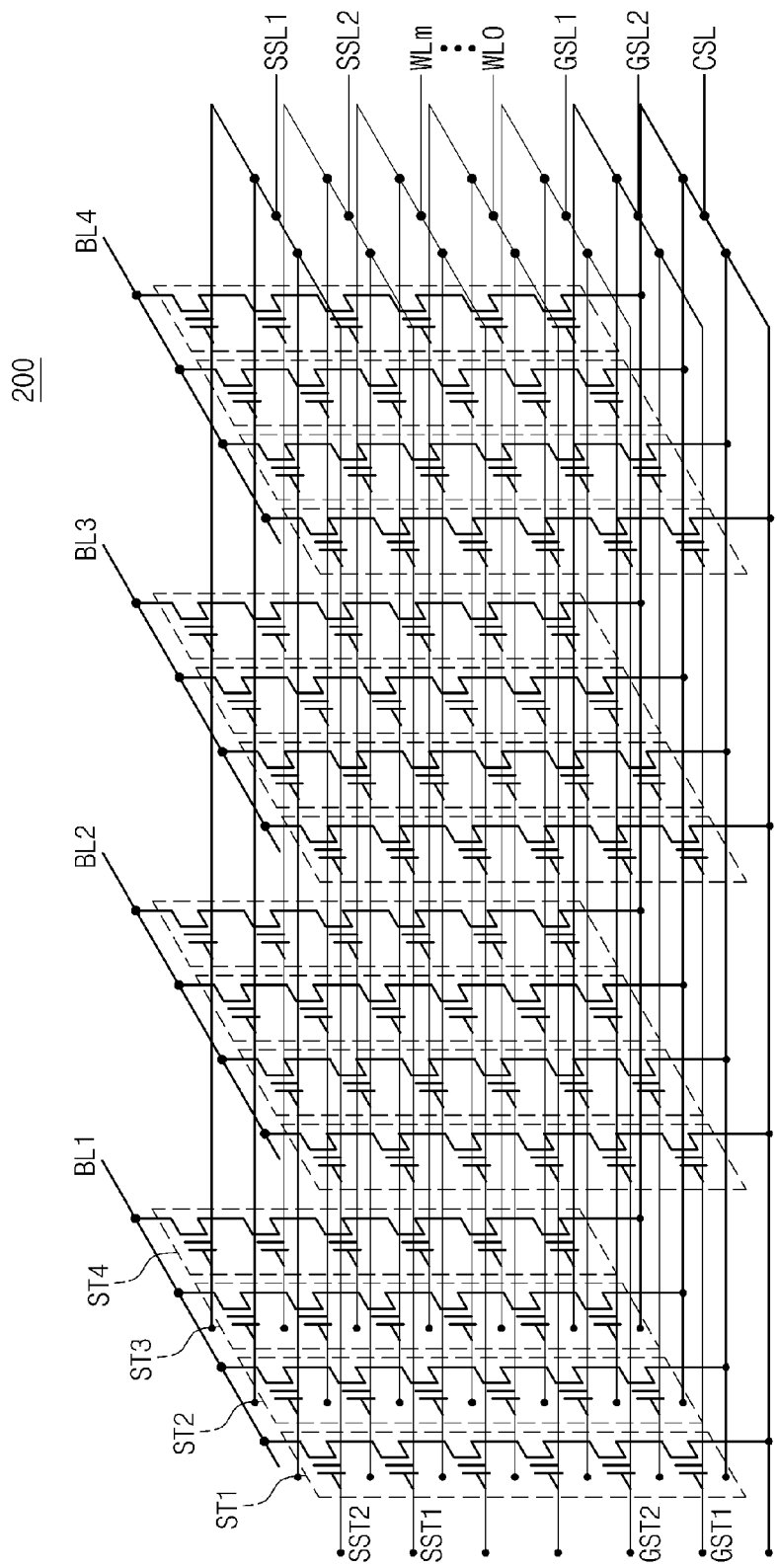
FIG. 33 is a circuit diagram schematically illustrating a memory block in FIG. 32.

FIG. 33 is a circuit diagram schematically illustrating a memory block in FIG. 32. Referring to FIGS. 32 and 33, a memory block 200 may have a shared bit line structure. For example, four strings ST1 to ST4 may be provided between a first bit line BL1 and a common source line CSL to be connected to the first bit line BL1. The first bit line BL1 may correspond to a conductive material extending along a first direction.

Each of the string ST1 and ST4 may include two string selection transistors SST1 and SST2 connected in series. Each of the serially connected string selection transistors SST1 and SST2 may be connected to string selection lines SSL1 and SSL2, respectively. In example embodiments, at least one of the string selection transistors SSL1 and SSL2 may be programmed to have a desired (and/or alternatively predetermined) threshold voltage.

Each of the string ST1 and ST4 may include two ground selection transistors GST1 and GST2 connected in series. Each of the serially connected ground selection transistors GST1 and GST2 may be connected to ground selection lines GSL1 and GSL2, respectively. In example embodiments, at least one of the ground selection transistors GSL1 and GSL2 may be programmed to have a desired (and/or alternatively predetermined) threshold voltage.

In example embodiments, at least one of the string and ground selection transistors SSL1, SSL2, GSL1, and GSL2 may be programmed to have a desired (and/or alternatively predetermined) threshold voltage.

Example embodiments of inventive concepts also provide a driving method of a nonvolatile memory device which comprises performing a program operation to set a threshold voltage of at least one selection transistor for selecting a string having serially-connected memory cells; verifying the programmed selection transistor using a verification voltage having the threshold voltage; and driving the memory cells by selecting the string using the selection transistor programmed to have the threshold voltage.

In example embodiments, the program operation is performed independently with respect to strings connected with even-numbered bit lines and strings connected with odd-numbered bit lines.

In example embodiments, the performing a program operation comprises includes judging whether a program operation of the selection transistors is performed normally.

In example embodiments, the program operation is performed with respect to a string selected from at least two strings connected with one bit line.

In example embodiments, the programmed selection transistor or at least one unprogrammed selection transistor is verified using a verification voltage being the threshold voltage.

In example embodiments, the driving the memory cells comprises providing the programmed selection transistor with 0V when one of the memory cells is programmed; providing a pass voltage to the at least one unprogrammed selection transistor and the remaining memory cells excepting the one memory cell; and providing a program voltage to the one memory cell.

In example embodiments, the driving the memory cells further comprises providing 0V with at least one selection transistor adjacent to the programmed selection transistor.

In example embodiments, the driving the memory cells comprises providing 0V with the programmed selection transistor when one of the memory cells is read; providing a read pass voltage to the at least unprogrammed selection transistor and the remaining memory cells excepting the one memory cell; and providing a read voltage to the one memory cell.

In example embodiments, the driving the memory cells comprises providing 0V with the programmed selection transistor when one of the memory cells is read; providing a first read pass voltage to the at least unprogrammed selection transistor; providing a second read pass voltage to the remaining memory cells excepting the one memory cell; and providing a read voltage to the one memory cell, the first read pass voltage being lower than the second read pass voltage.

In example embodiments, the driving the memory cells comprises providing a first read pass voltage to the programmed selection transistor when one of the memory cells is read; providing a second read pass voltage to the at least one unprogrammed selection transistor; providing a third read pass voltage to the remaining memory cells excepting the one memory cell; and providing a read voltage to the one memory cell, the first read pass voltage being lower than the second read pass voltage and the second read pass voltage being lower than the third read pass voltage.

Example embodiments of inventive concepts are applicable to various devices.

Figure 34:
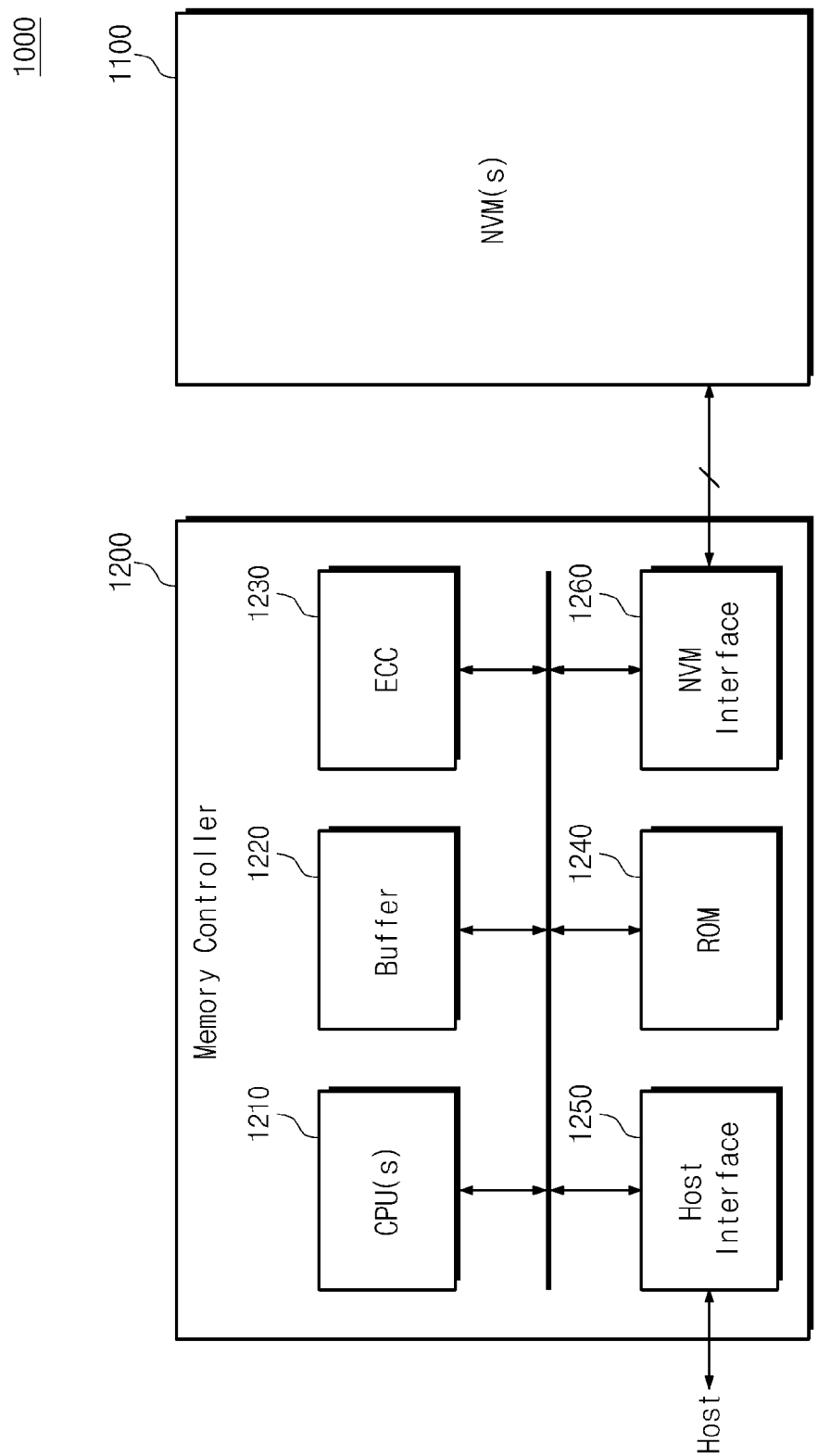
FIG. 34 is a block diagram schematically illustrating a memory system according to example embodiments of inventive concepts.

FIG. 34 is a block diagram schematically illustrating a memory system according to example embodiments of inventive concepts. Referring to FIG. 34, a memory system 1000 may include at least one nonvolatile memory device 1100 and a memory controller 1200.

The nonvolatile memory device 1100 may include a nonvolatile memory device 100 illustrated in FIG. 1.

The memory controller 1200 may be connected with the nonvolatile memory device 1100 via a plurality of channels. The memory controller 1200 may include at least one Central Processing Unit (CPU) 1210, a buffer memory 1220, an ECC circuit 1230, a ROM 1240, a host interface 1250, and a memory interface 1260. Although not shown in FIG. 34, the memory controller 1200 may further comprise a randomization circuit that randomizes and de-randomizes data. The memory system 1000 according to example embodiments of inventive concepts is applicable to a perfect page new (PPN) memory.

Detailed description of the memory system 1000 is disclosed in U.S. Patent Publication No. 2010/0082890, the entire contents of which are hereby incorporated by reference.

Figure 35:
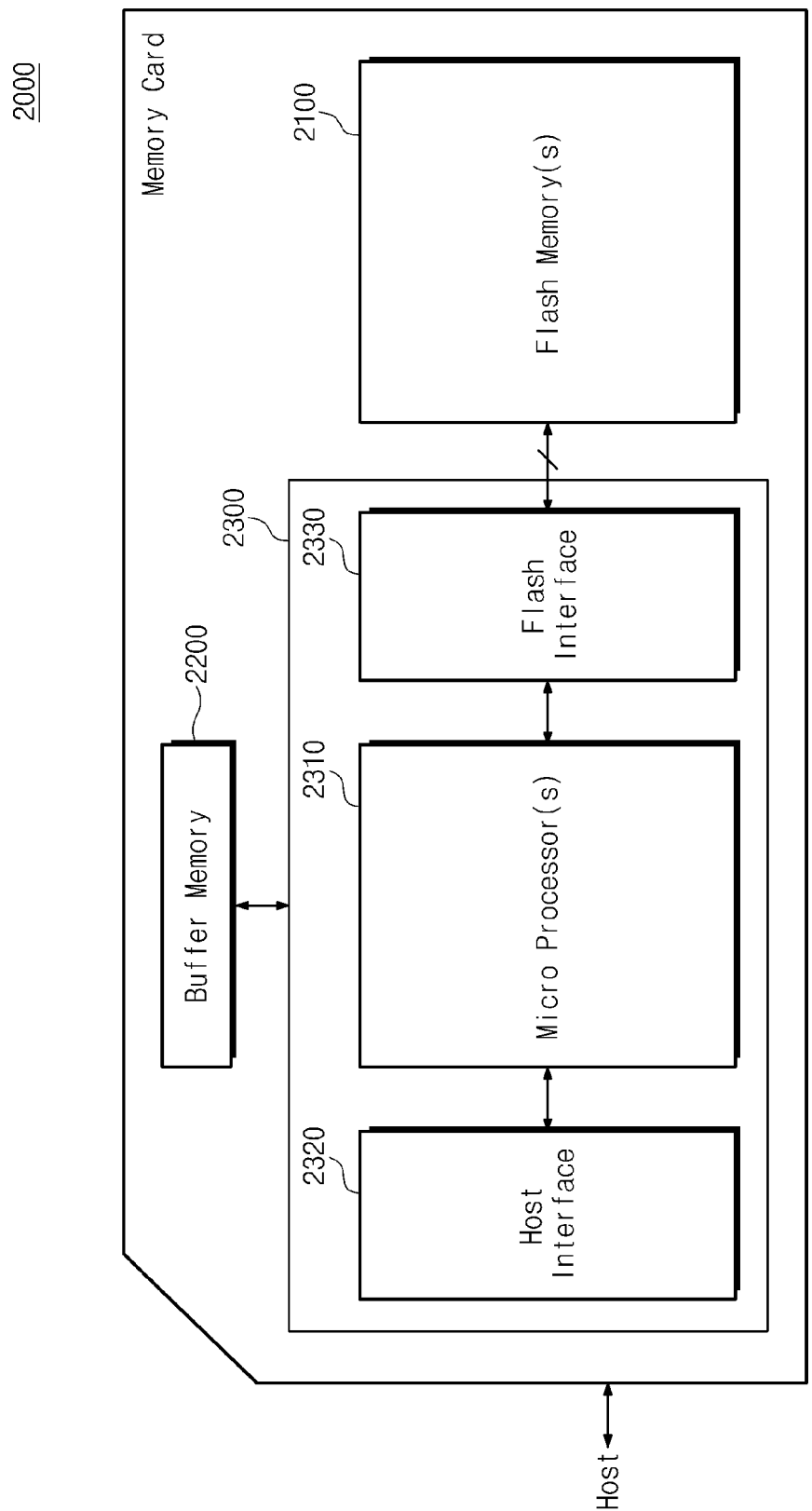
FIG. 35 is a block diagram schematically illustrating a memory card according to example embodiments of inventive concepts.

FIG. 35 is a block diagram schematically illustrating a memory card according to example embodiments of inventive concepts. Referring to FIG. 35, a memory card 2000 may include at least one flash memory 2100, a buffer memory device 2200, and a memory controller 2300 for controlling the flash memory 2100 and the buffer memory device 2200.

The flash memory device 2100 may include a nonvolatile memory device illustrated in FIG. 1. In example embodiments, the flash memory device 2100 may be optionally provided with an external high voltage Vpp.

The buffer memory device 2200 may be used to temporarily store data generated during the operation of the memory card 2000. The buffer memory device 2200 may be implemented using a DRAM or an SRAM. The memory controller 2300 may be connected with the flash memory 2100 via a plurality of channels. The memory controller 2300 may be connected between a host and the flash memory 2100. The memory controller 2300 may be configured to access the flash memory 2100 in response to a request from the host.

The memory controller 2300 may include at least one microprocessor 2310, a host interface 2320, and a flash interface 2330. The microprocessor 2310 may be configured to drive firmware. The host interface 2320 may interface with the host via a card protocol (e.g., SD/MMC) for data exchanges between the host and the memory card 2000.

The memory card 2000 is applicable to Multimedia Cards (MMCs), Security Digitals (SDs), miniSDs, memory sticks, smartmedia, and transflash cards.

Detailed description of the memory card 2000 is disclosed in U.S. Patent Publication No. 2010/0306583, the entire contents of which are herein incorporated by reference.

Figure 36:
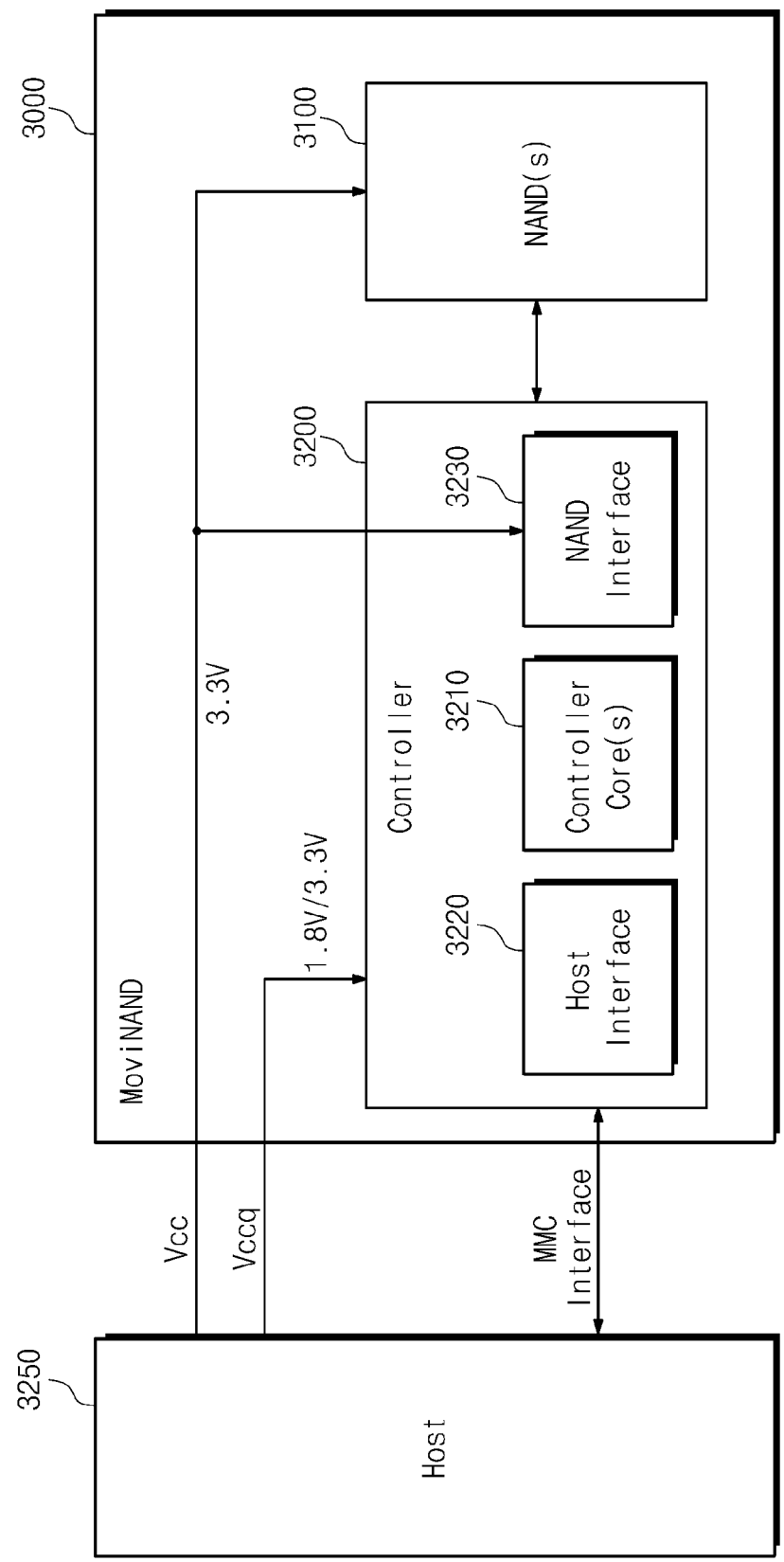
FIG. 36 is a block diagram schematically illustrating a moviNAND according to example embodiments of inventive concepts.

FIG. 36 is a block diagram schematically illustrating a moviNAND according to example embodiments of inventive concepts. Referring to FIG. 36, a moviNAND device 3000 may support the MMC 4.4 (or, referred to as "eMMC") standard. The moviNAND device 3000 may include a nonvolatile memory device 100 illustrated in FIG. 1. The NAND flash memory device 3100 may be a single data rate (SDR) NAND flash memory device or a double data rate (DDR) NAND flash memory device. In example embodiments, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.).

The controller 3200 may be connected with the flash memory device 3100 via a plurality of channels. The controller 3200 may include at least one controller core 3210, a host interface 3220, and a NAND interface 3230. The controller core 3210 may control an overall operation of the moviNAND device 3000.

The host interface 3220 may be configured to perform an MMC interface between the controller 3210 and a host. The NAND interface 3230 may be configured to interface between the NAND flash memory device 3100 and the controller 3200. In example embodiments, the host interface 3220 may be a parallel interface (e.g., an MMC interface).

Alternatively, according to example embodiments, the host interface 3220 of the moviNAND device 3000 may be a serial interface (e.g., UHS-II, UFS, etc.).

The moviNAND device 3000 may receive power supply voltages Vcc and Vccq from the host. Herein, the power supply voltage Vcc (about 3.3V) may be supplied to the NAND flash memory device 3100 and the NAND interface 3230, while the power supply voltage Vccq (about 1.8V/3.3V) may be supplied to the controller 3200.

In example embodiments, an external high voltage Vpp may be optionally supplied to the moviNAND device 3000.

The moviNAND device 3000 according to example embodiments of inventive concepts may be advantageous to store mass data as well as may have an improved read characteristic. The moviNAND device 3000 according to example embodiments of inventive concepts is applicable to small and low-power mobile products (e.g., a Galaxy S, iPhone, etc.).

The moviNAND device 3000 illustrated in FIG. 36 may be supplied with a plurality of power supply voltages Vcc and Vccq. However, example embodiments of inventive concepts are not limited thereto. The moviNAND device 3000 can be configured to generate a power supply voltage of 3.3V suitable for a NAND interface and a NAND flash memory by boosting or regulating the power supply voltage Vcc internally. Internal boosting or regulating is disclosed in U.S. Pat. No. 7,092,308, the entire contents of which are herein incorporated by reference.

Example embodiments of inventive concepts are applicable to a solid state drive (SSD).

Figure 37:
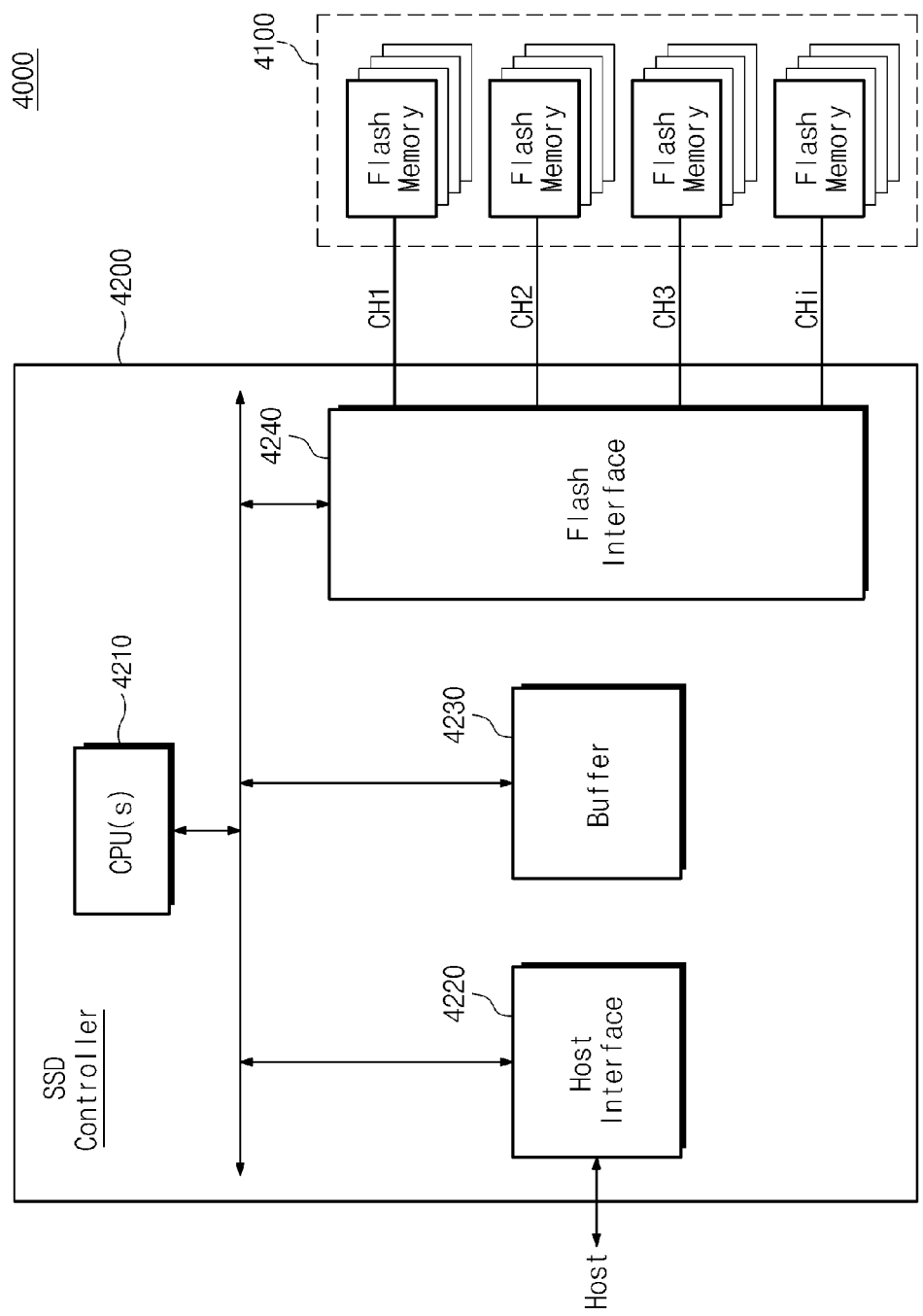
FIG. 37 is a block diagram schematically illustrating a solid state drive according to example embodiments of inventive concepts.

FIG. 37 is a block diagram schematically illustrating a solid state drive according to example embodiments of inventive concepts. Referring to FIG. 37, a solid state drive (SSD) 4000 may include a plurality of flash memory devices 4100 and an SSD controller 4200.

Each of the flash memory devices 4100 may include a nonvolatile memory device illustrated in FIG. 1. In example embodiments, each of the flash memory devices 4100 may be optionally provided with an external high voltage Vpp.

The SSD controller 4200 may be connected to the flash memory devices 4100 via a plurality of channels CH1 to CHi. The SSD controller 4200 may include at least one CPU 4210, a host interface 4220, a buffer memory 4230, and a flash interface 4240.

The buffer memory 4230 may be used to temporarily store data transferred between an external device and the flash memory devices 4100. The buffer memory 4230 can be used to store programs to be executed by the CPU 4210. The buffer memory 4230 may be implemented using an SRAM or a DRAM. The buffer memory 4230 in FIG. 36 may be included within the SSD controller 4200. However, example embodiments of inventive concepts are not limited thereto. The buffer memory 4230 according to example embodiments of inventive concepts can be provided at the outside of the SSD controller 4200.

Under the control of the CPU 4210, the host interface 4220 may exchange data with a host through the communication protocol. In example embodiments, the communication protocol may include the Advanced Technology Attachment (ATA) protocol. The ATA protocol may include a Serial Advanced Technology Attachment (SATA) interface, a Parallel Advanced Technology Attachment (PATA) interface, an External SATA (ESATA) interface, and the like. In other example embodiments, the communication protocol may include the Universal Serial Bus (UBS) protocol.

Data to be received or transmitted from or to the host through the host interface 4220 may be delivered through the buffer memory 4230 without passing through a CPU bus, under the control of the CPU 4210.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories.

The SSD 400 according to example embodiments of inventive concepts may improve the reliability of data by storing random data at a program operation. More detailed description of the SSD 4000 is disclosed in U.S. Patent Publication No. 2010/0082890, the entire contents of which are herein incorporated by reference.

Figure 38:
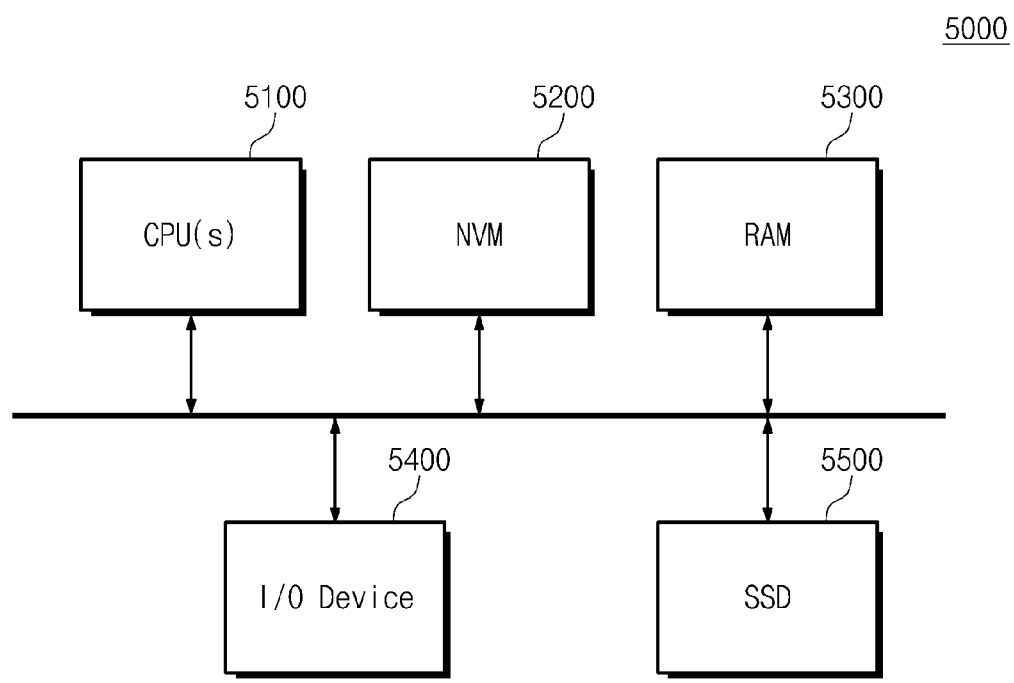
FIG. 38 is a block diagram schematically illustrating a computing system including an SSD in FIG. 37 according to example embodiments of inventive concepts.

FIG. 38 is a block diagram schematically illustrating a computing system including an SSD in FIG. 37 according to example embodiments of inventive concepts. Referring to FIG. 38, a computing system 5000 may include at least one CPU 5100, a nonvolatile memory device 5200, a RAM 5300, an input/output (I/O) device 5400, and an SSD 5500.

The CPU 5100 may be connected to a system bus. The nonvolatile memory device 5200 may store data used to drive the computing system 5000. Herein, the data may include a start command sequence or a basic I/O system (BIOS) sequence. The RAM 5300 may temporarily store data generated during the execution of the CPU 5100.

The I/O device 5400 may be connected to the system bus through an I/O device interface such as keyboards, pointing devices (e.g., mouse), monitors, modems, and the like.

The SSD 5500 may be a readable storage device and may be implemented the same as the SSD 4000 of FIG. 37.

Figure 39:
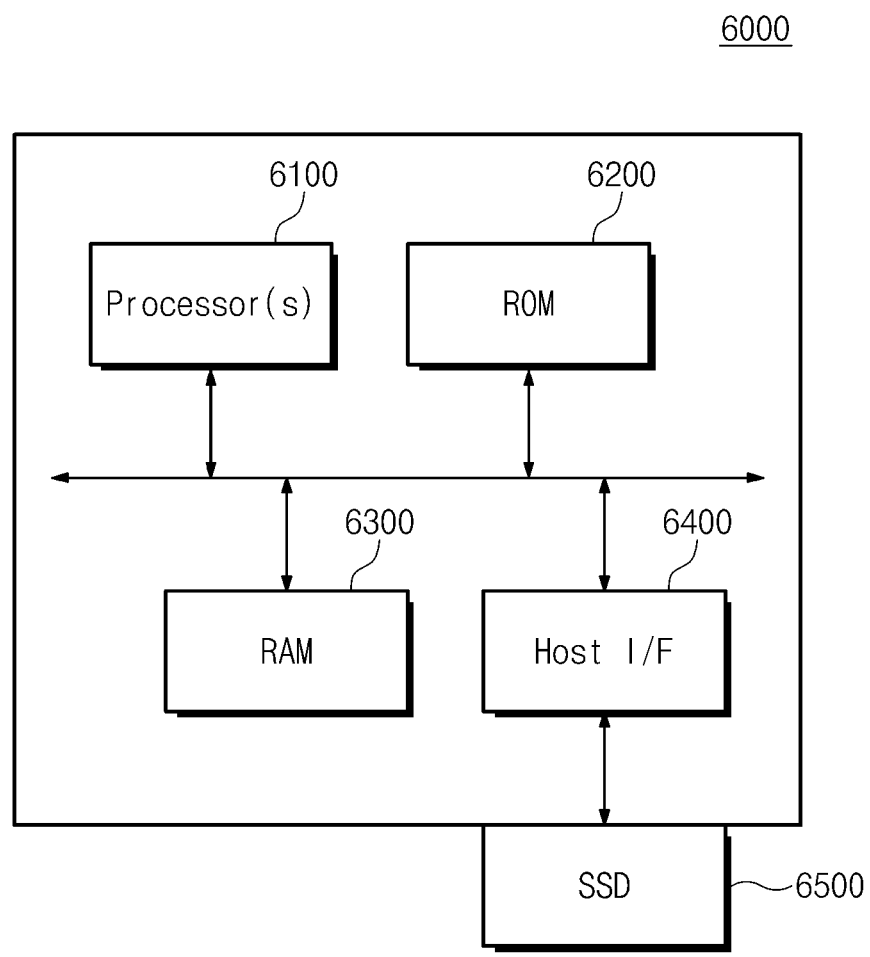
FIG. 39 is a block diagram schematically illustrating an electronic device including an SSD in FIG. 37 according to example embodiments of inventive concepts.

FIG. 39 is a block diagram schematically illustrating an electronic device including an SSD in FIG. 37 according to example embodiments of inventive concepts. Referring to FIG. 39, an electronic device 6000 may include a processor 6100, a ROM 6200, a RAM 6300, a flash interface 6400, and at least one SSD 6500.

The processor 6100 may access the RAM 6300 to execute firmware codes or other codes. Also, the processor 6100 may access the ROM 6200 to execute fixed command sequences such as a start command sequence and a basic I/O system (BIOS) sequence. The flash interface 6400 may be configured to interface between the electronic device 6000 and the SSD 6500.

The SSD 6500 may be detachable from the electronic device 6000. The SSD 6500 may be implemented the same as the SSD 4000 of FIG. 37.

The electronic device 6000 may include cellular phones, personal digital assistants (PDAs), digital cameras, camcorders, portable audio players (e.g., MP3), and portable media players (PMPs).

Figure 40:
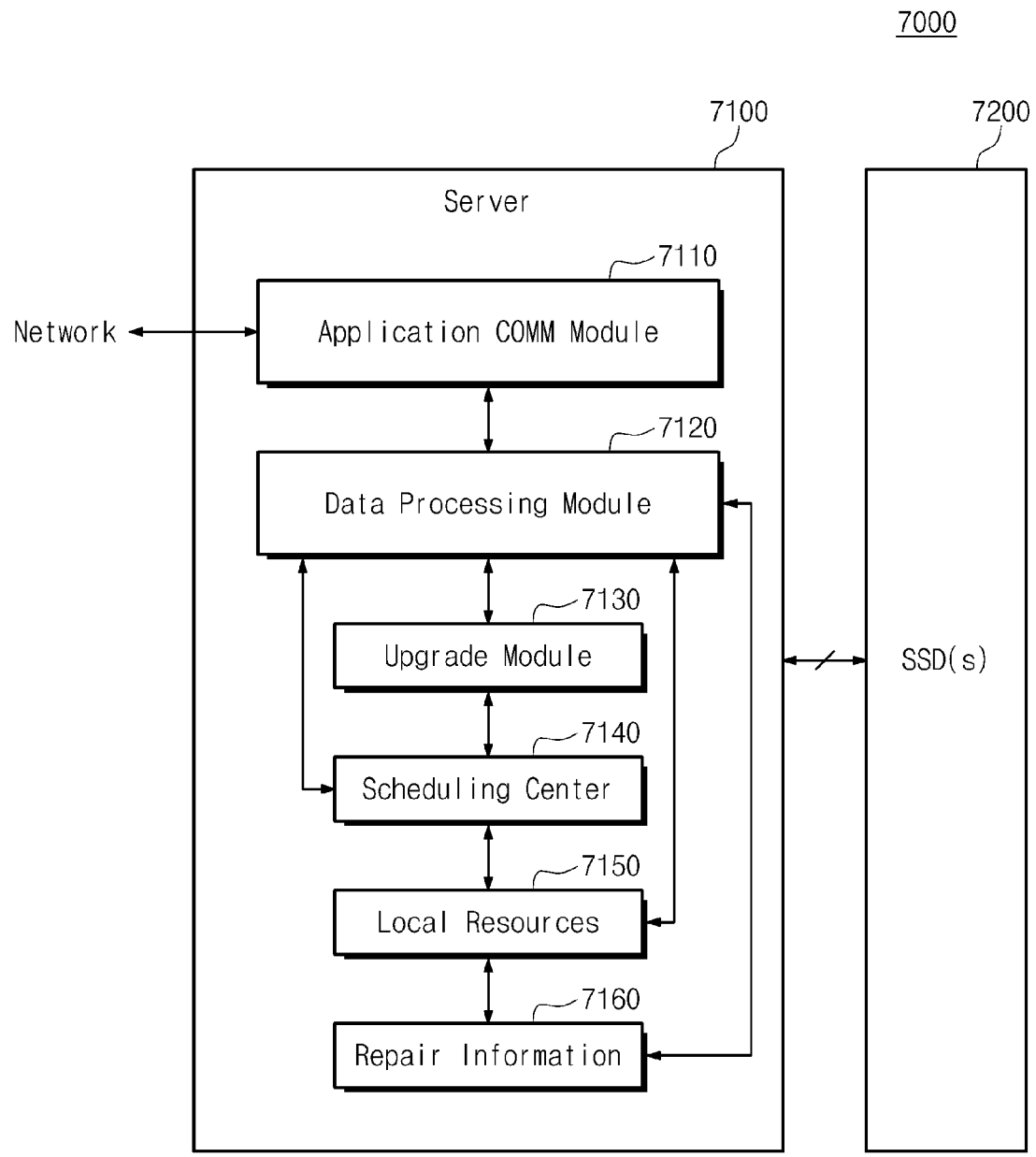
FIG. 40 is a block diagram schematically illustrating a server system including an SSD in FIG. 37 according to example embodiments of inventive concepts.

FIG. 40 is a block diagram schematically illustrating a server system including an SSD in FIG. 37 according to example embodiments of inventive concepts. Referring to FIG. 40, a server system 7000 may include a server 7100 and at least one SSD 7200 that stores data used to drive the server 7100. The SSD 7200 may be configured the same as an SSD 4000 of FIG. 37.

The server 7100 may include an application communication module 7110, a data processing module 7120, an upgrade module 7130, a scheduling center 7140, a local resource module 7150, and a repair information module 7160. The application communication module 7110 may be configured to communicate with a computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. Here, the local resource module 7150 may provide a list of repair shops/dealers/technical information to a user on the basis of information or data inputted to the server 7100. The upgrade module 7130 may interface with the data processing module 7120. Based on information or data received from the SSD 7200, the upgrade module 7130 may perform upgrades of a firmware, a reset code, a diagnosis system, or other information on electronic appliances.

The scheduling center 7140 may provide real-time options to the user based on the information or data inputted to the server 7100. The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

Example embodiments of inventive concepts are applicable to mobile products (e.g., GALAXY S®—a mobile product marketed by Samsung Electronics, IPHONE®—a mobile product marketed by Apple Incorporated, etc.).

Figure 41:
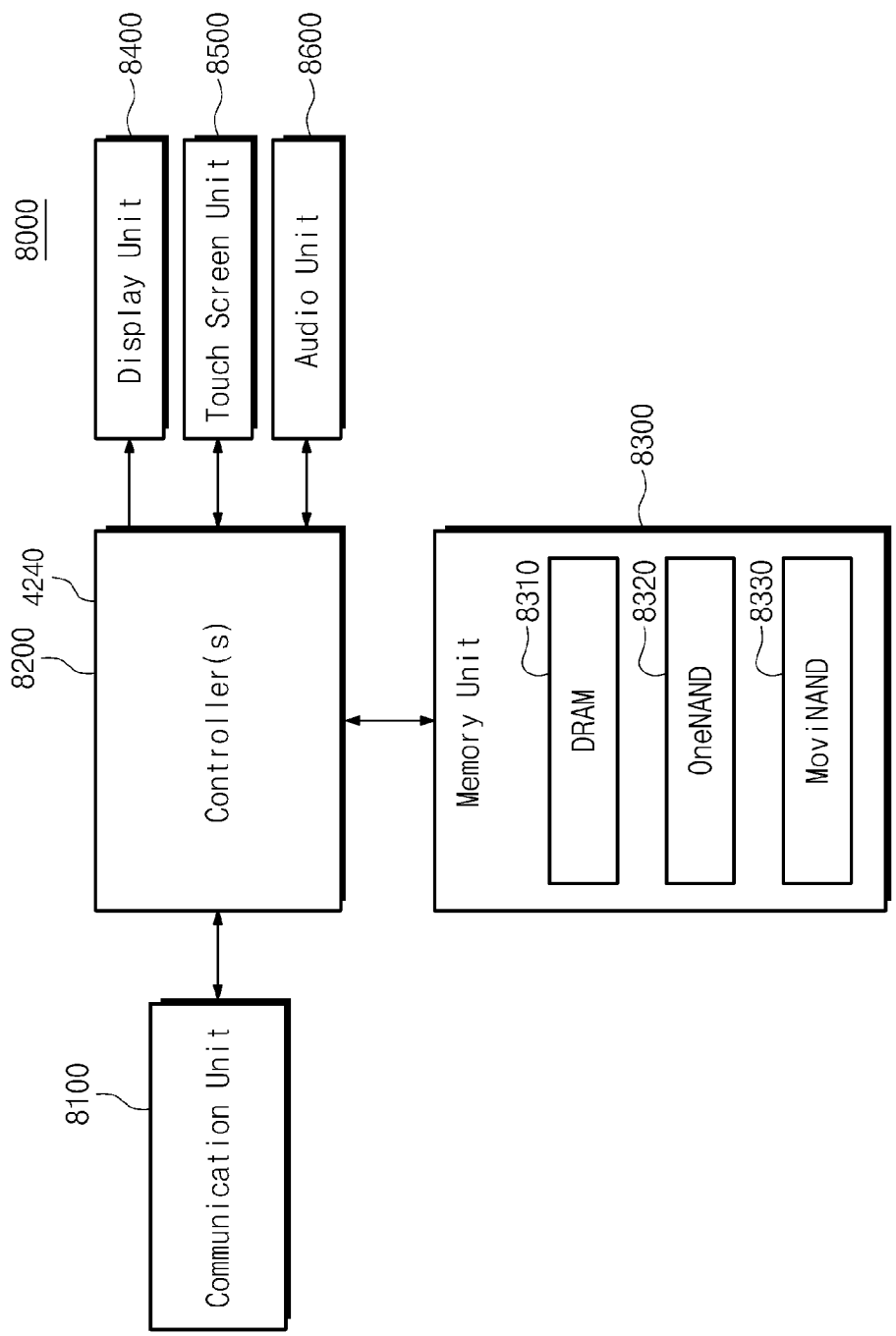
FIG. 41 is a block diagram schematically illustrating a mobile device according to example embodiments of inventive concepts.

FIG. 41 is a block diagram schematically illustrating a mobile device according to example embodiments of inventive concepts. Referring to FIG. 41, a mobile device 8000 may include a communication unit 8100, a controller 8200, a memory unit 8300, a display unit 8400, a touch screen unit 8500, and an audio unit 8600.

The memory unit 8300 may include at least one DRAM 8310, at least one OneNAND 8320, and at least one moviNAND 8330. At least one of the OneNAND 8320 and the moviNAND 8330 may include a nonvolatile memory device 100 illustrated in FIG. 1.

Detailed description of the mobile device is disclosed in U.S. Patent Publication Nos. 2010/0010040, 2010/0062715, 2010/0309237, and 2010/0315325, the entire contents of which are herein incorporated by reference.

Example embodiments of inventive concepts are applicable to tablet products (e.g., Galaxy Tab, iPad, etc.).

Figure 42:
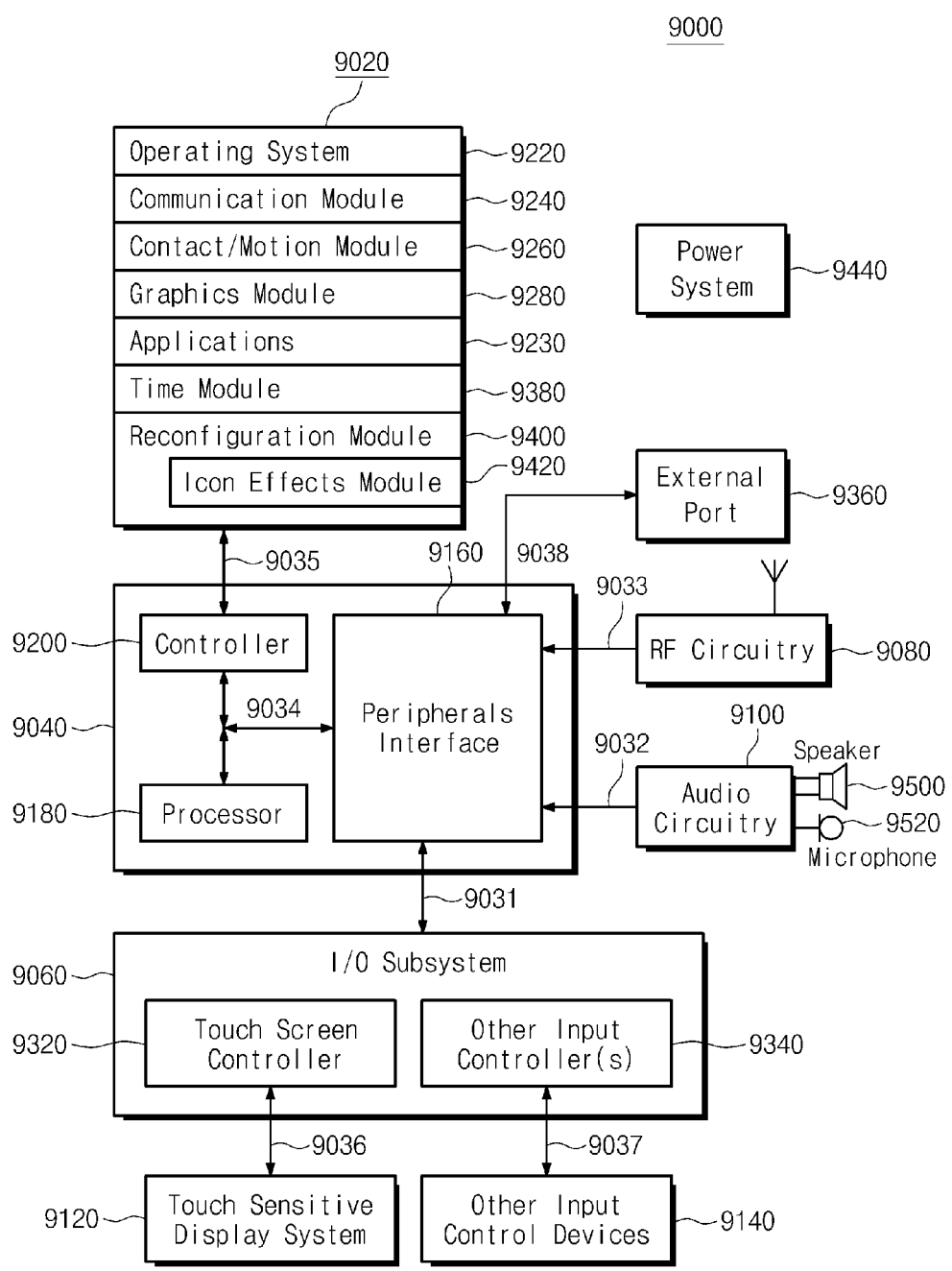
FIG. 42 is a block diagram schematically illustrating a handheld electronic device according to example embodiments of inventive concepts.

FIG. 42 is a block diagram schematically illustrating a handheld electronic device according to example embodiments of inventive concepts. Referring to FIG. 42, a handheld electronic device 9000 may include at least one computer-readable media 9020, a processing system 9040, an input/output sub-system 9060, a radio frequency circuit 9080, and an audio circuit 9100. Respective constituent elements can be interconnected by at least one communication bus or a signal line 9030.

The handheld electronic device 9000 may be a portable electronic device including a handheld computer, a tablet computer, a cellular phone, a media player, a PDA, or a combination of two or more thereof. Herein, the at least one computer-readable media 9020 may include a nonvolatile memory device illustrated in FIG. 1. Detailed description of the handheld electronic device 9000 is disclosed in U.S. Pat. No. 7,509,588, the entire contents of which are herein incorporated by reference.

A memory system or a storage device according to the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

While some example embodiments of inventive concepts have been particularly shown and described, it will be apparent to those skilled in the art that various changes and modifications may be made therein without departing from the spirit and scope of the claims.

What is claimed is:

1. A nonvolatile memory device, comprising:
a plurality of strings, each one of the plurality of strings including a plurality of serially-connected selection transistors and a plurality of memory cells connected in series to one end of the plurality of serially-connected selection transistors, the plurality of memory cells being stacked vertically on top of each other, the serially-connected selection transistors including,
a first string selection transistor connected to a bit line and programmed to have a first threshold voltage, and
a second string selection transistor connected between the first string selection transistor and the one end of the plurality of serially-connected selection transistors, the second string selection transistor being programmed to have a second threshold voltage; and
a control logic configured to perform a program operation for setting a threshold voltage of at least one of the plurality of serially-connected selection transistors.

2. The nonvolatile memory device of claim 1, wherein the control logic is configured to program the first string selection transistor at the program operation.

3. The nonvolatile memory device of claim 1, wherein at least two strings of the plurality of strings are connected to the bit line.

4. The nonvolatile memory device of claim 3, wherein
at least one of the serially-connected selection transistors includes a depletion type transistor or an enhancement type transistor connected to the bit line to select one of the at least two strings connected with the bit line,
wherein the depletion type transistor or the enhancement type transistor is formed by an ion implantation manner.

5. The nonvolatile memory device of claim 3, further comprising:
a substrate,
wherein each of the plurality of strings includes the plurality of selection transistors and the memory cells stacked on the substrate in a direction perpendicular to a substrate.

6. The nonvolatile memory device of claim 3, wherein
the first string selection transistor is formed by an ion implantation manner,
a structure of the second string selection transistor is the same as a structure of each of the plurality of memory cells, and
the second string selection transistor is configured to be programmed by the control logic.

7. The nonvolatile memory device of claim 3, wherein each of the at least two strings of the plurality of strings comprises:
a first string having a first enhancement type selection transistor connected to the bit line and a first depletion type selection transistor connected to the first enhancement type selection transistor; and
a second string having a second depletion type selection transistor connected to the bit line and a second enhancement type selection transistor connected to the second depletion type selection transistor,
wherein each of the first and second enhancement type selection transistors and the first and second depletion type selection transistors includes at least two selection transistors having a structure that is the same as a structure of each of the plurality of memory cells, at least one of the at least two selection transistors is configured to be programmed by the control logic.

8. The nonvolatile memory device of claim 7, wherein the control logic is configured to operate so when one of the memory cells is programmed, a first selection voltage provided to at least one unprogrammed selection transistor is different from a second selection voltage provided to a programmed selection transistor, the at least one unprogrammed selection transistor being adjacent to the programmed selection transistor.

9. The nonvolatile memory device of claim 7, wherein the control logic is configured to operate so when one of the memory cells is read, a first read pass voltage provided to at least one unprogrammed selection transistor is equal to a second read pass voltage provided to the remaining memory cells excepting the memory cell to be read, the at least one unprogrammed selection transistor being adjacent to the programmed selection transistor.

10. A nonvolatile memory device, comprising:
a plurality of memory cells connected in series;
a first selection transistor connected to one end of the memory cells and programmed to have a first threshold voltage;
a second selection transistor connected to the first selection transistor and programmed to have a second threshold voltage; and
a third selection transistor connected to the second selection transistor and programmed to have a third threshold voltage,
wherein the first threshold voltage is higher than the second and third threshold voltages.

11. The nonvolatile memory device of claim 10, wherein the first to third selection transistors are verified using a first verification voltage having the first threshold voltage after the first selection transistor is programmed, the first to third selection transistors are verified using a second verification voltage having the second threshold voltage after the second selection transistor is programmed, and the first to third selection transistors are verified using a third verification voltage having the third threshold voltage after the third selection transistor is programmed.

12. A nonvolatile memory device comprising:
a plurality of bit lines;
a common source line;
a plurality of strings between the common source line and the plurality of bit lines, each of the plurality of strings including,
a plurality of selection transistors,
the plurality of selection transistors including a ground selection transistor connected to the common source line and at least one string selection transistor connected to one of the plurality of bit lines, and
a plurality of memory cells serially-connected between the ground selection transistor and the at least one string selection transistor, the plurality of memory cells being vertically stacked on top of each other between the ground selection transistor and the at least one string selection transistor; and
a control logic connected to the plurality of strings,
the control logic being configured to perform a program operation for setting a threshold voltage of at least one of the plurality of selection transistors, wherein
two strings of the plurality of strings are connected to a common bit line among the plurality of bit lines,
the two strings each include 1 to i string selection transistors that are serially-connected between the plurality of memory cells and the common bit line,
i is an integer greater than or equal to 4,
the $1^{st}$ string selection transistor in one of the two strings is an enhancement type,
the $2^{nd}$ to $i^{th}$ string selection transistors in the one of the two strings are a depletion type,
the $1^{st}$ string selection transistor in an other of the two strings is the depletion type,
the $2^{nd}$ to $i^{th}$ string selection transistors in the other of the two strings are the enhancement type, and
the control logic is configured to set a threshold voltage of one of the $2^{nd}$ to $i^{th}$ string selection transistors in a selected one of the two strings during the program operation.

13. The nonvolatile memory device of claim 12, wherein the at least one string selection transistor of the plurality of selection transistors in each of the plurality of strings includes,
a first string selection transistor connected to one of the plurality of bit lines, and
a second string selection transistor connected between the first string selection transistor and the plurality of memory cells, and
the control logic is configured to set a threshold voltage of the first string selection transistor or the second string selection transistor of a selected string among the plurality of strings during the program voltage.

14. The nonvolatile memory device of claim 12, wherein at least two strings of the plurality of string are connected to a common bit line among the plurality of bit lines.

* * * * *